US010644118B2

(12) United States Patent
Xue et al.

(10) Patent No.: US 10,644,118 B2
(45) Date of Patent: May 5, 2020

(54) SELF-ALIGNED CONTACT FOR TRENCH POWER MOSFET

(71) Applicant: Alpha and Omega Semiconductor Incorporated, Sunnyvale, CA (US)

(72) Inventors: Hongyong Xue, Portland, OR (US); Sik Lui, Sunnyvale, CA (US); Terence Huang, Portland, OR (US); Ching-Kai Lin, Hillsboro, OR (US); Wenjun Li, Portland, OR (US); Yi Chang Yang, Portland, OR (US); Jowei Dun, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 15/623,303

(22) Filed: Jun. 14, 2017

(65) Prior Publication Data
US 2017/0288028 A1 Oct. 5, 2017

Related U.S. Application Data

(62) Division of application No. 14/681,887, filed on Apr. 8, 2015, now Pat. No. 9,691,863.

(51) Int. Cl.
*H01L 29/40* (2006.01)
*H01L 29/417* (2006.01)
(Continued)

(52) U.S. Cl.
CPC ...... *H01L 29/407* (2013.01); *H01L 29/41766* (2013.01); *H01L 29/66727* (2013.01);
(Continued)

(58) Field of Classification Search
CPC ............. H01L 29/407; H01L 29/41766; H01L 29/66727; H01L 29/66734; H01L 29/7813; H01L 29/42368
(Continued)

(56) References Cited

U.S. PATENT DOCUMENTS

| 4,477,310 A * | 10/1984 | Park | H01L 21/266 257/374 |
| 4,688,069 A * | 8/1987 | Joy | H01L 21/763 257/397 |

(Continued)

FOREIGN PATENT DOCUMENTS

| CN | 103247681 A | 8/2013 |
| CN | 103633068 A | 3/2014 |

OTHER PUBLICATIONS

Non-Final Office Action for U.S. Appl. No. 14/681,887, dated Sep. 9, 2016.
(Continued)

*Primary Examiner* — Timor Karimy
(74) *Attorney, Agent, or Firm* — JDI Patent; Joshua D. Isenebrg; Robert Pullman

(57) ABSTRACT

Embodiments of the present disclosure provide a self-aligned contact for a trench power MOSFET device. The device has a layer of nitride provided over the conductive material in the gate trenches and over portions of mesas between every two adjacent contact structures. Alternatively, the device has an oxide layer over the conductive material in the gate trenches and over portions of mesas between every two adjacent contact structures. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

11 Claims, 56 Drawing Sheets

(51) Int. Cl.
 *H01L 29/66* (2006.01)
 *H01L 29/78* (2006.01)
 *H01L 29/423* (2006.01)

(52) U.S. Cl.
 CPC .... *H01L 29/66734* (2013.01); *H01L 29/7813* (2013.01); *H01L 29/42368* (2013.01)

(58) Field of Classification Search
 USPC .......................................................... 438/257
 See application file for complete search history.

(56) References Cited

U.S. PATENT DOCUMENTS

| | | | |
|---|---|---|---|
| 5,795,792 A | 8/1998 | Nishihara | |
| 7,867,852 B2 | 1/2011 | Herbet | |
| 8,330,200 B2 | 12/2012 | Herbet | |
| 8,519,476 B2 | 8/2013 | Chen et al. | |
| 8,580,667 B2 | 11/2013 | Lui et al. | |
| 8,692,322 B2 | 4/2014 | Pan et al. | |
| 8,785,278 B2 | 7/2014 | Yilmaz et al. | |
| 8,785,280 B2 | 7/2014 | Herbet | |
| 8,951,867 B2 | 2/2015 | Lee et al. | |
| 8,969,953 B2 | 3/2015 | Chen et al. | |
| 8,980,716 B2 | 3/2015 | Lui et al. | |
| 9,190,512 B2 | 11/2015 | Lee et al. | |
| 9,691,863 B2 | 6/2017 | Xue et al. | |
| 2009/0020810 A1* | 1/2009 | Marchant | H01L 29/407 257/331 |
| 2009/0065855 A1* | 3/2009 | Bhalla | H01L 29/1095 257/328 |
| 2012/0193807 A1* | 8/2012 | Chumakov | B82Y 10/00 257/774 |
| 2013/0200451 A1 | 8/2013 | Yilmaz et al. | |
| 2014/0027813 A1* | 1/2014 | Kuruc | H01L 29/66348 257/139 |
| 2016/0064551 A1 | 3/2016 | Lee et al. | |

OTHER PUBLICATIONS

Notice of Allowance for U.S. Appl. No. 14/681,887, dated Feb. 28, 2017.
Office Action dated Jul. 4, 2018 for Chinese Patent Application No. 201610215555.7.

\* cited by examiner

US 10,644,118 B2

SELF-ALIGNED CONTACT FOR TRENCH POWER MOSFET

CLAIM OF PRIORITY

This application is a divisional of U.S. patent application Ser. No. 14/681,887, filed Apr. 8, 2015 the entire contents of which are incorporated herein by reference.

FIELD OF THE DISCLOSURE

This present disclosure relates generally to semiconductor power devices, and more particularly to a self-aligned trench MOSFET and methods of manufacturing such devices.

BACKGROUND

Power metal oxide semiconductor field effect transistors (MOSFETs) are commonly used power devices due to their low gate drive power, fast switching speed and superior paralleling capability. A trench gate of a MOSFET device typically includes a trench extending into a semiconductor substrate from the source to the drain and having sidewalls and a floor that are each lined with a layer of an insulator such as thermally grown silicon dioxide. The lined trench is filled with doped polysilicon that acts as the gate. The structure of the trench gate allows less constricted current flow and, consequently, provides lower values of specific on-resistance. Furthermore, the trench gate makes possible a decreased cell pitch in a MOSFET channel extending along the sidewalls of the trench from the bottom of the source across the body of the transistor to the drain below. Channel density is thereby increased, which reduces the channel's contribution to on-resistance.

A high density trench MOSFET device also includes a contact trench in a mesa region between adjacent gate trenches to provide contact to source and body regions. Conventional processes for manufacturing trench MOSFET devices have used separate mask processes to define the gate and contact trenches. However, a mask overlay issue occurs when forming a vertical MOSFET structure because a well-controlled spacing between the gate trench and nearby contact trench is required for high density MOSFET devices, which have increasingly smaller dimensions. Schemes based on self-alignment processes have been proposed to solve this mask overlay issue. However, these proposed schemes use spacers formed below the surface of the semiconductor substrate to create a self-aligned contact trench. As a result, a lot of original silicon is lost in the mesa regions between the contract trenches. In addition, the proposed schemes use many process steps and are complicated to implement.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the present disclosure present a self-aligned contact for trench power MOSFETs and methods of fabricating the same.

First Embodiment

Figure 1A:
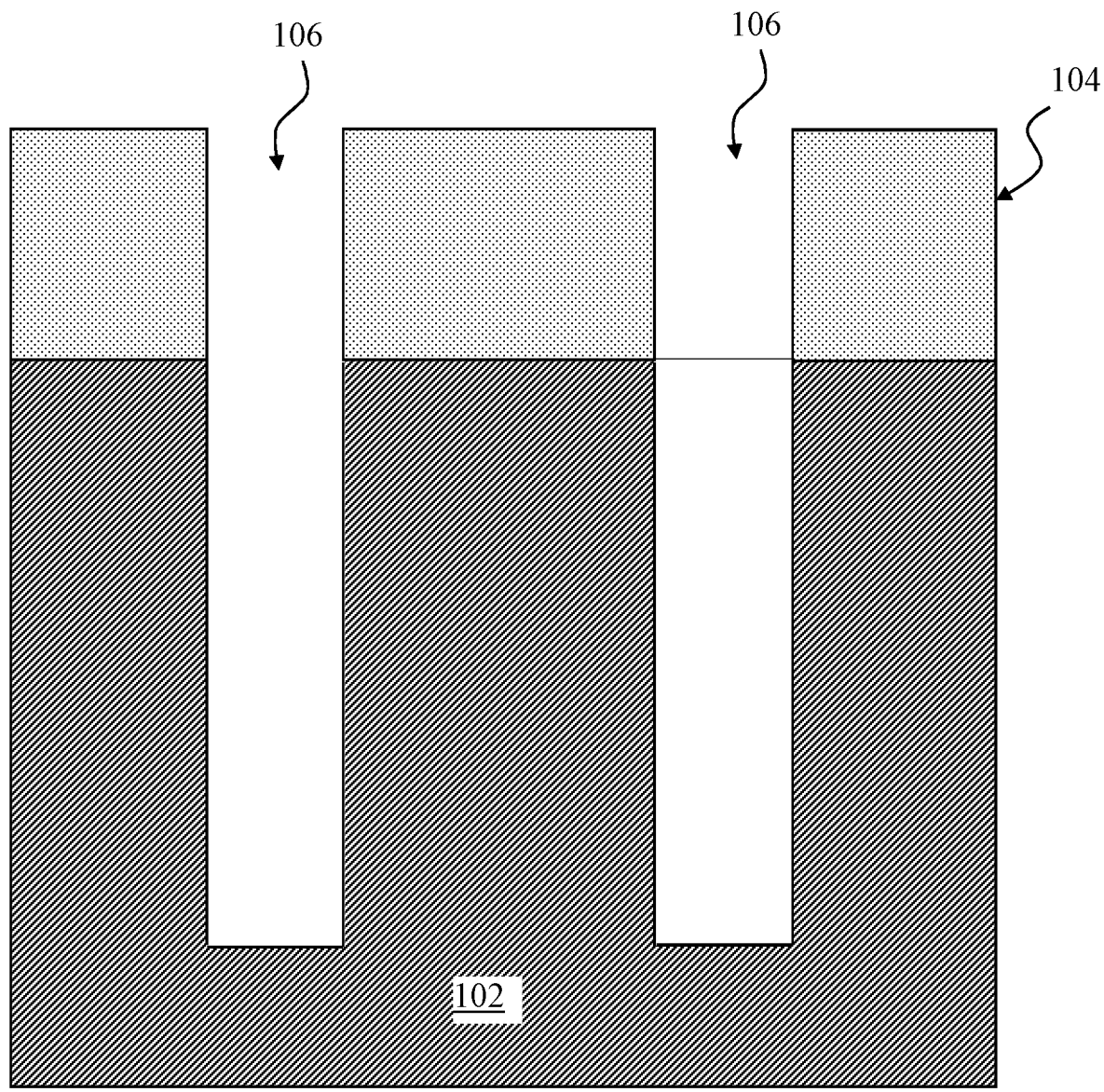
FIGS. 1A-1Q are a sequence of cross-sectional schematic diagrams illustrating a method of fabrication of a trench power MOSFET according to one embodiment of the present disclosure.
Figure 1B:
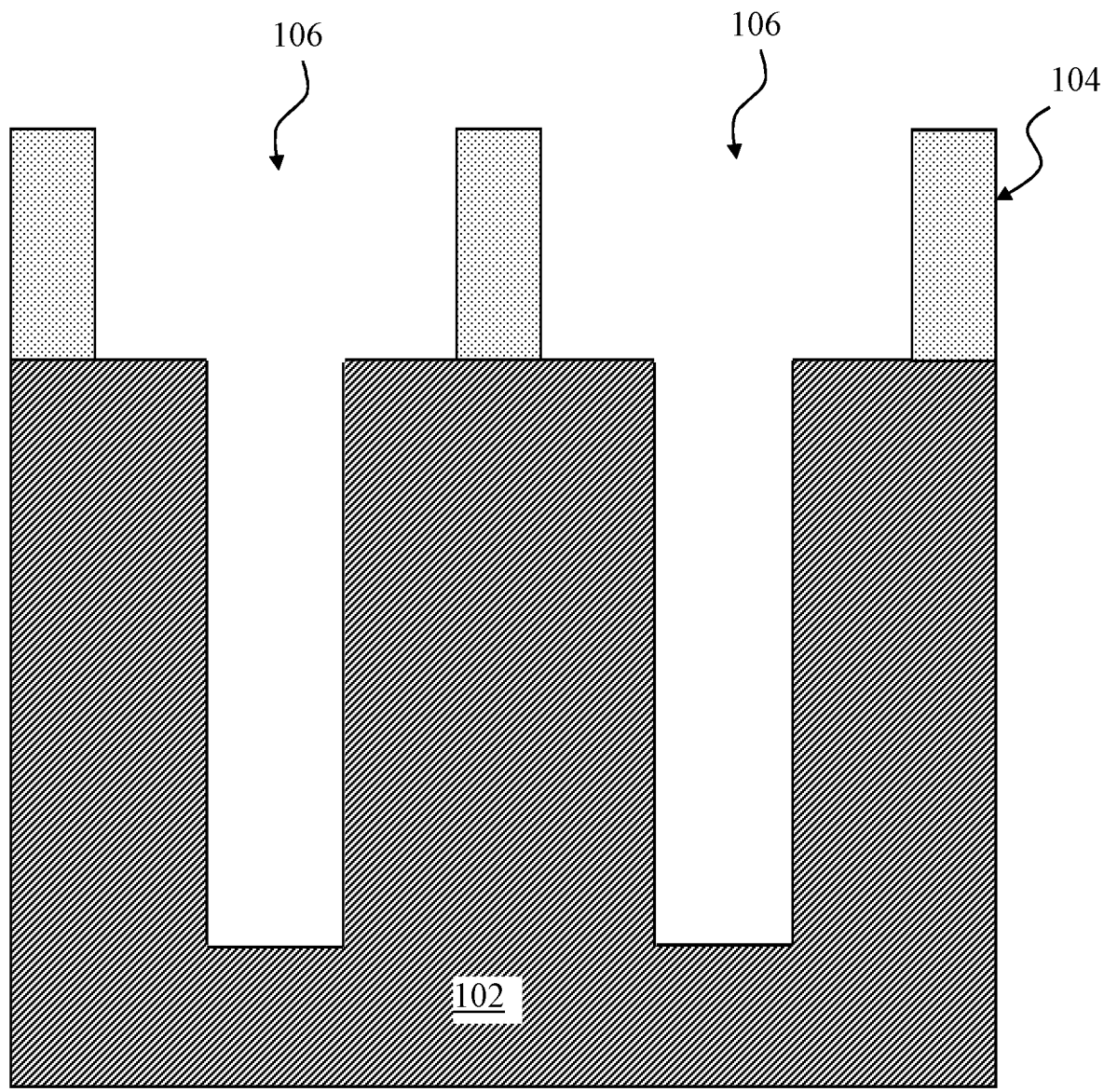
Figure 1C:
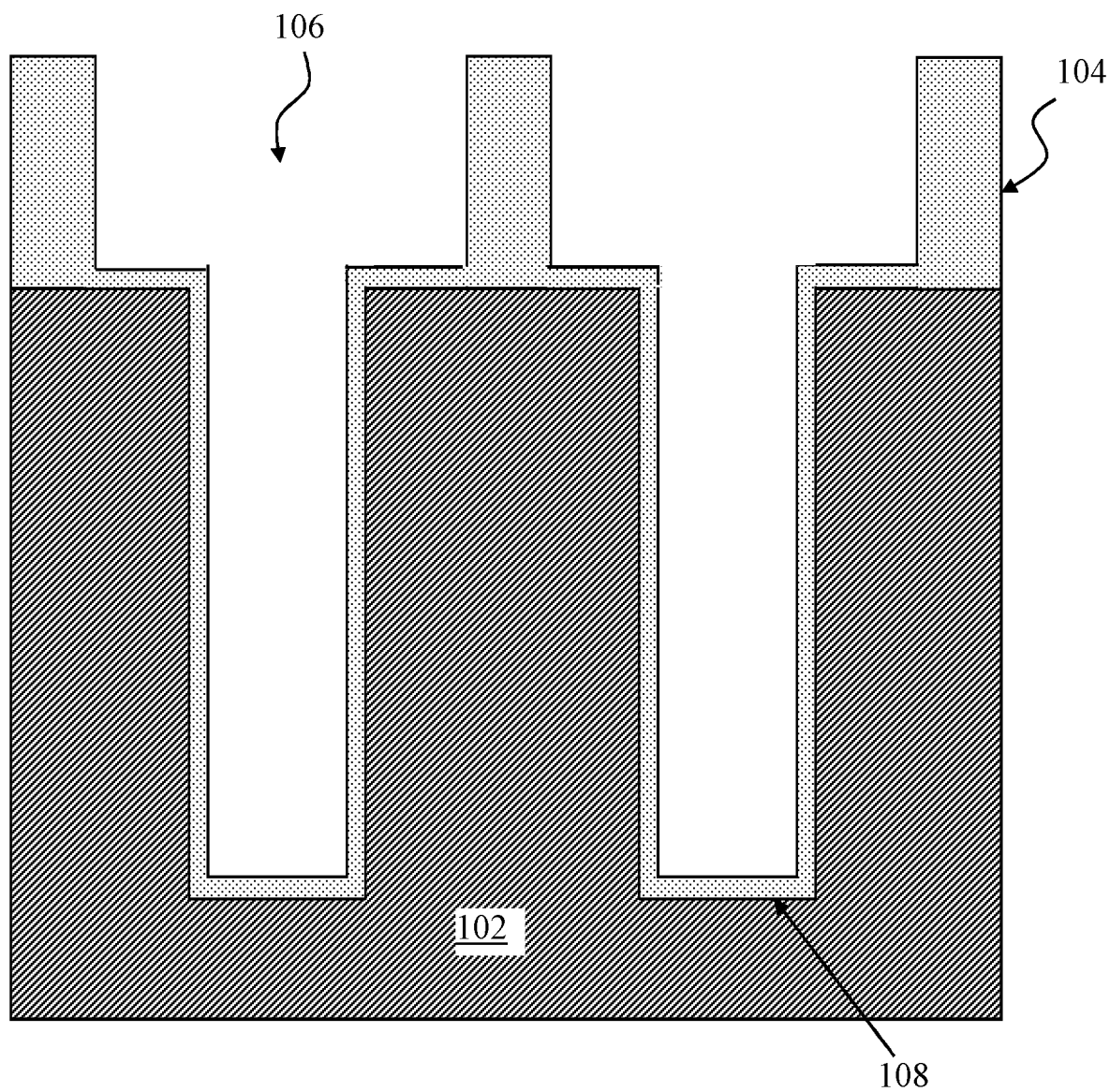
Figure 1D:
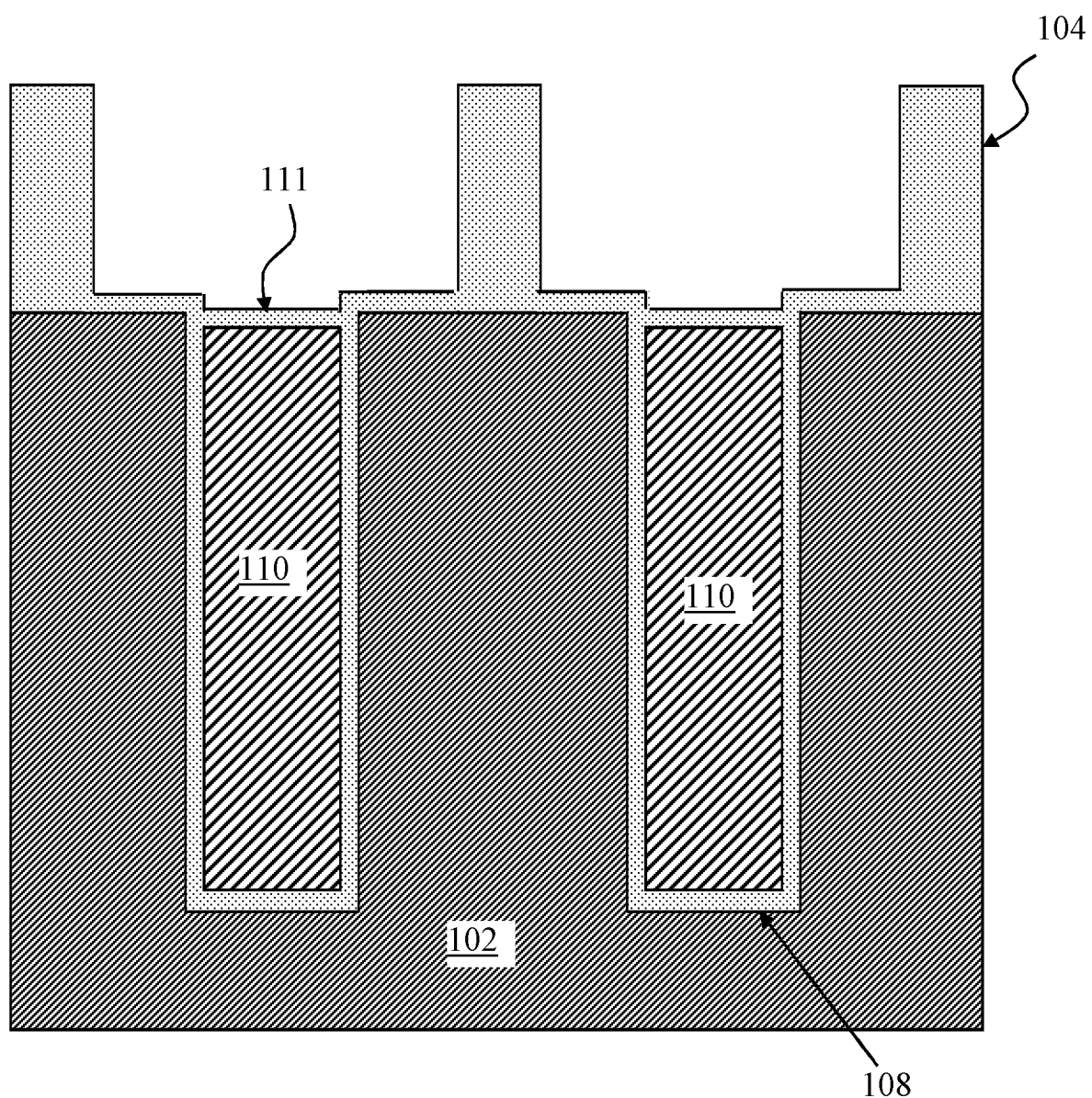
Figure 1E:
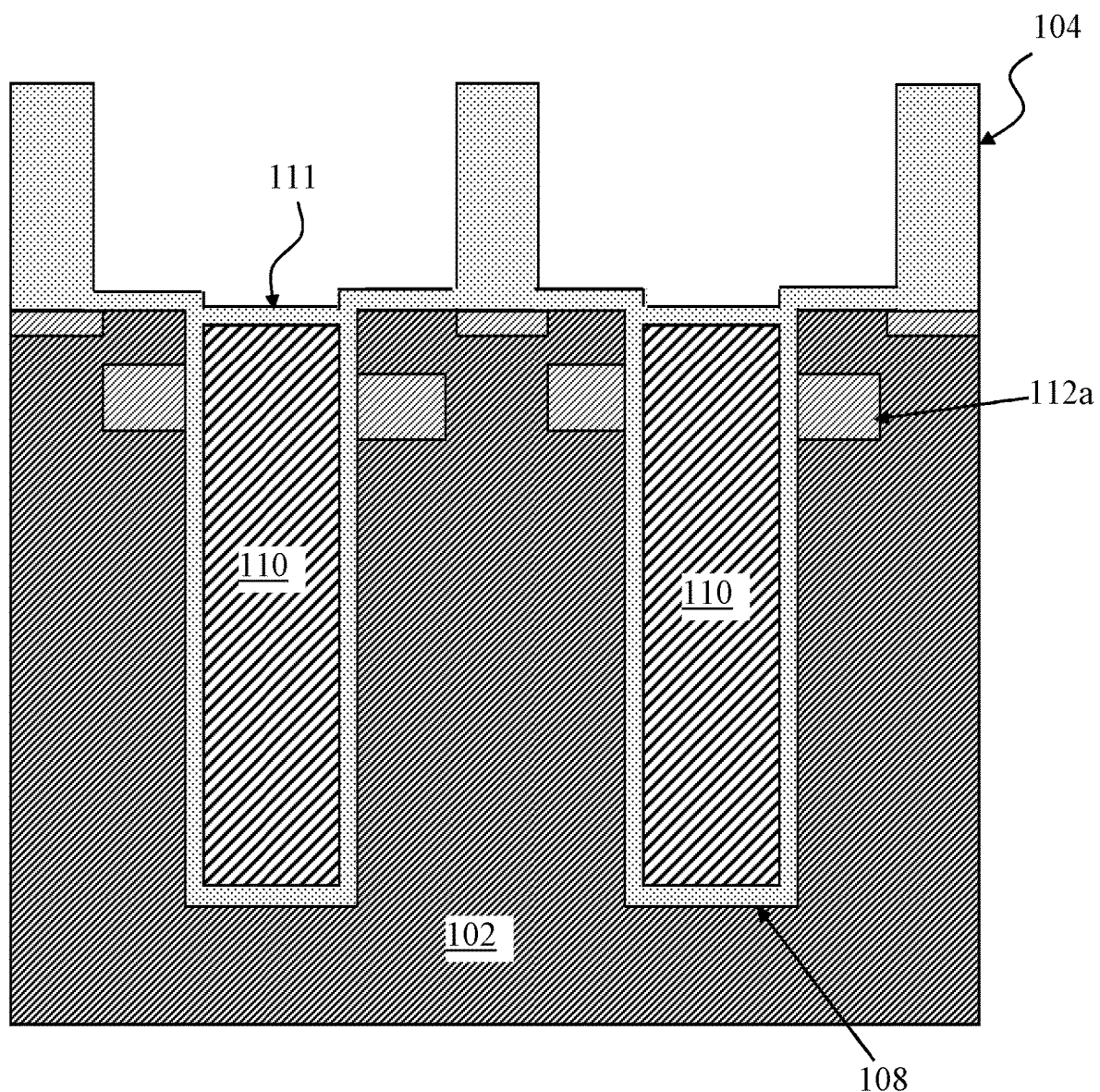
Figure 1F:
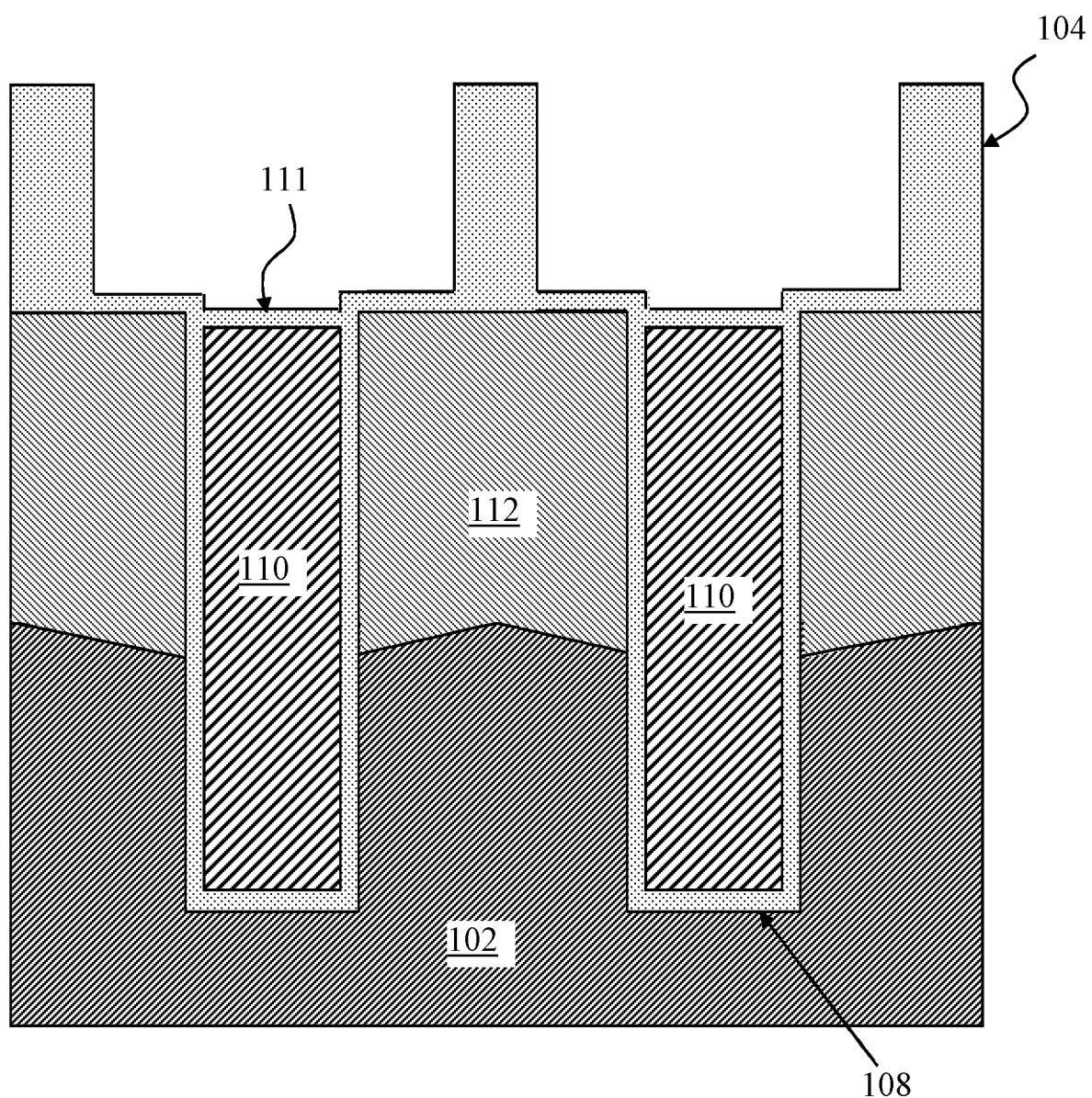
Figure 1G:
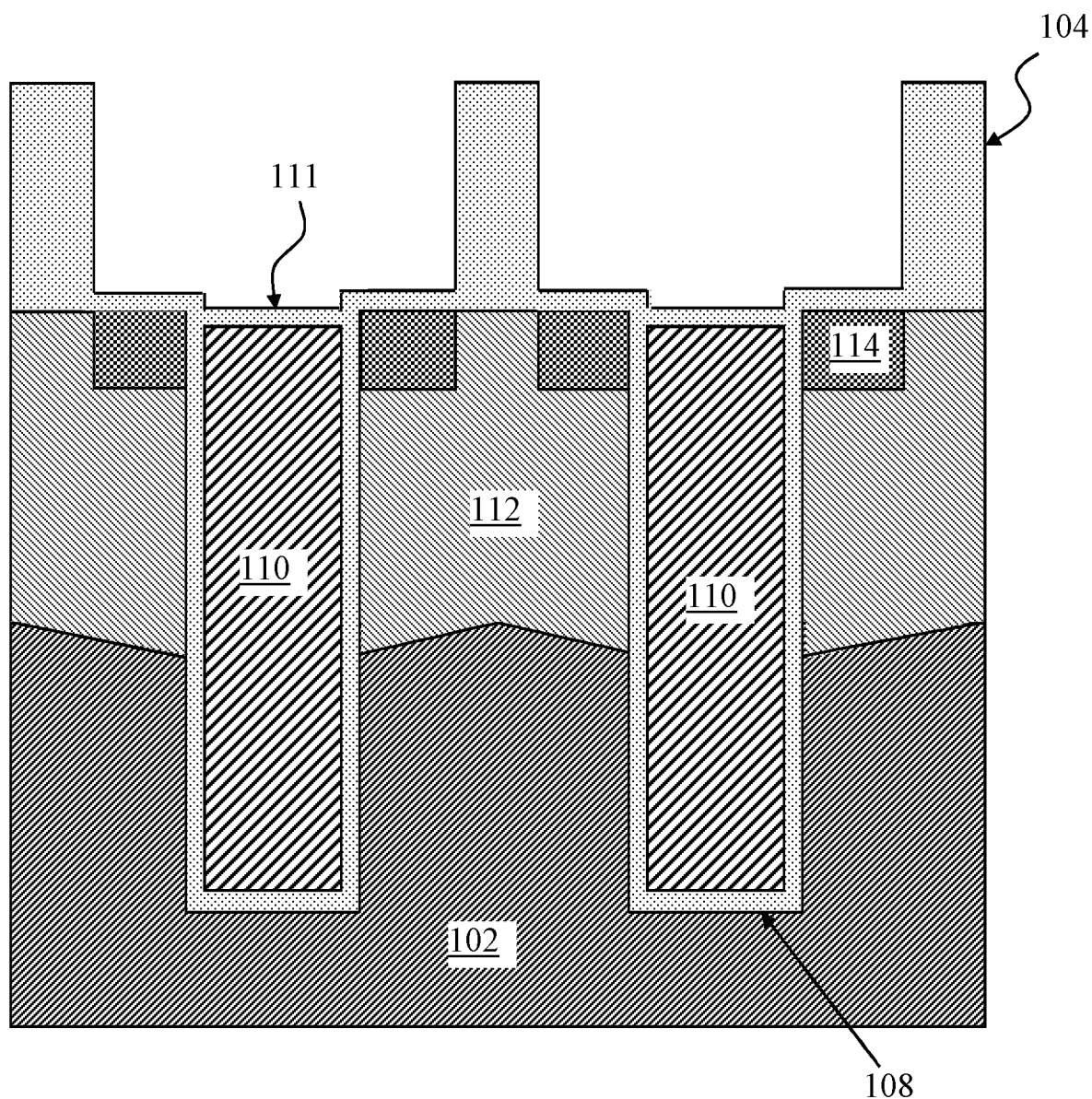
Figure 1H:
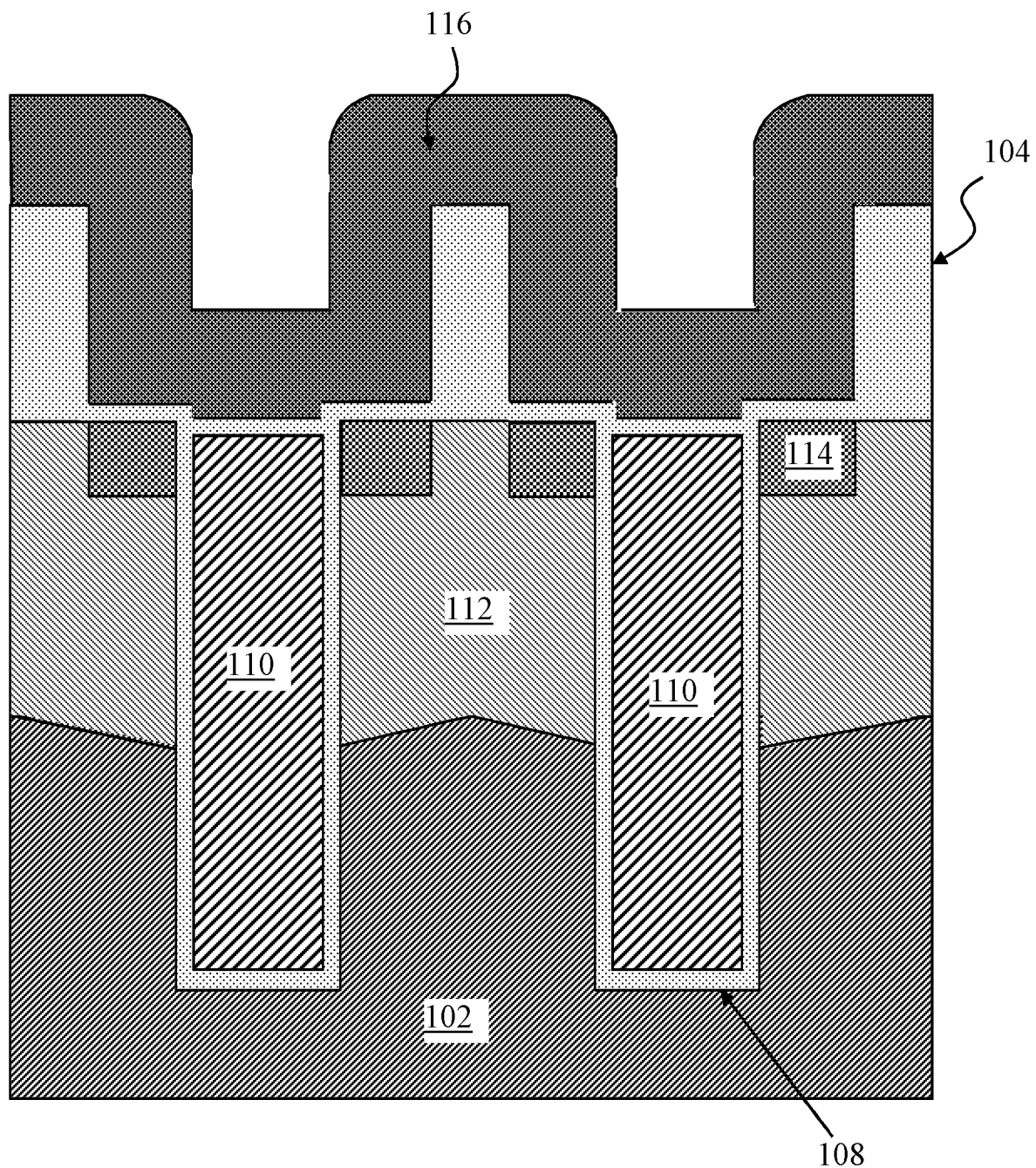
Figure 1I:
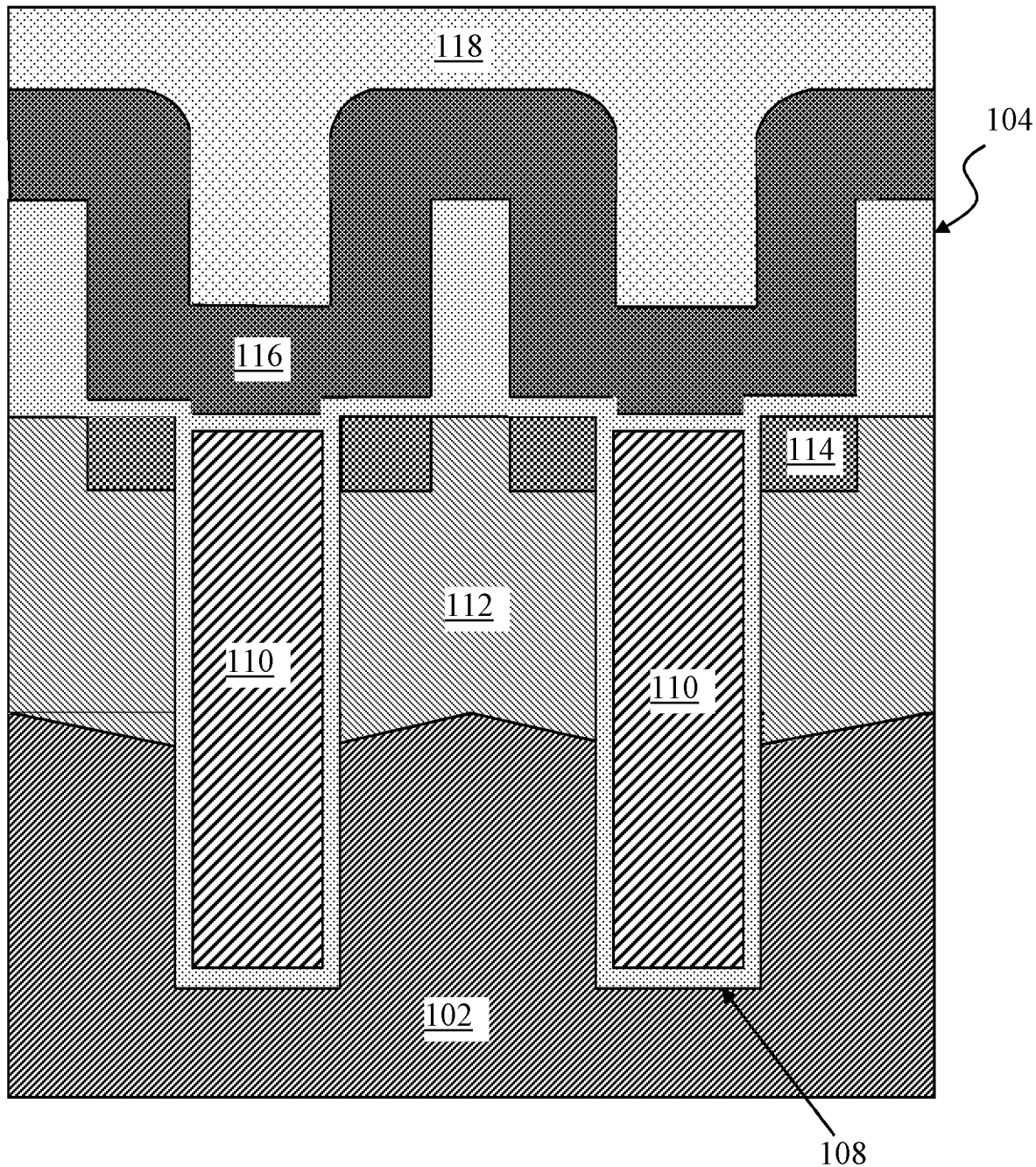
Figure 1J:
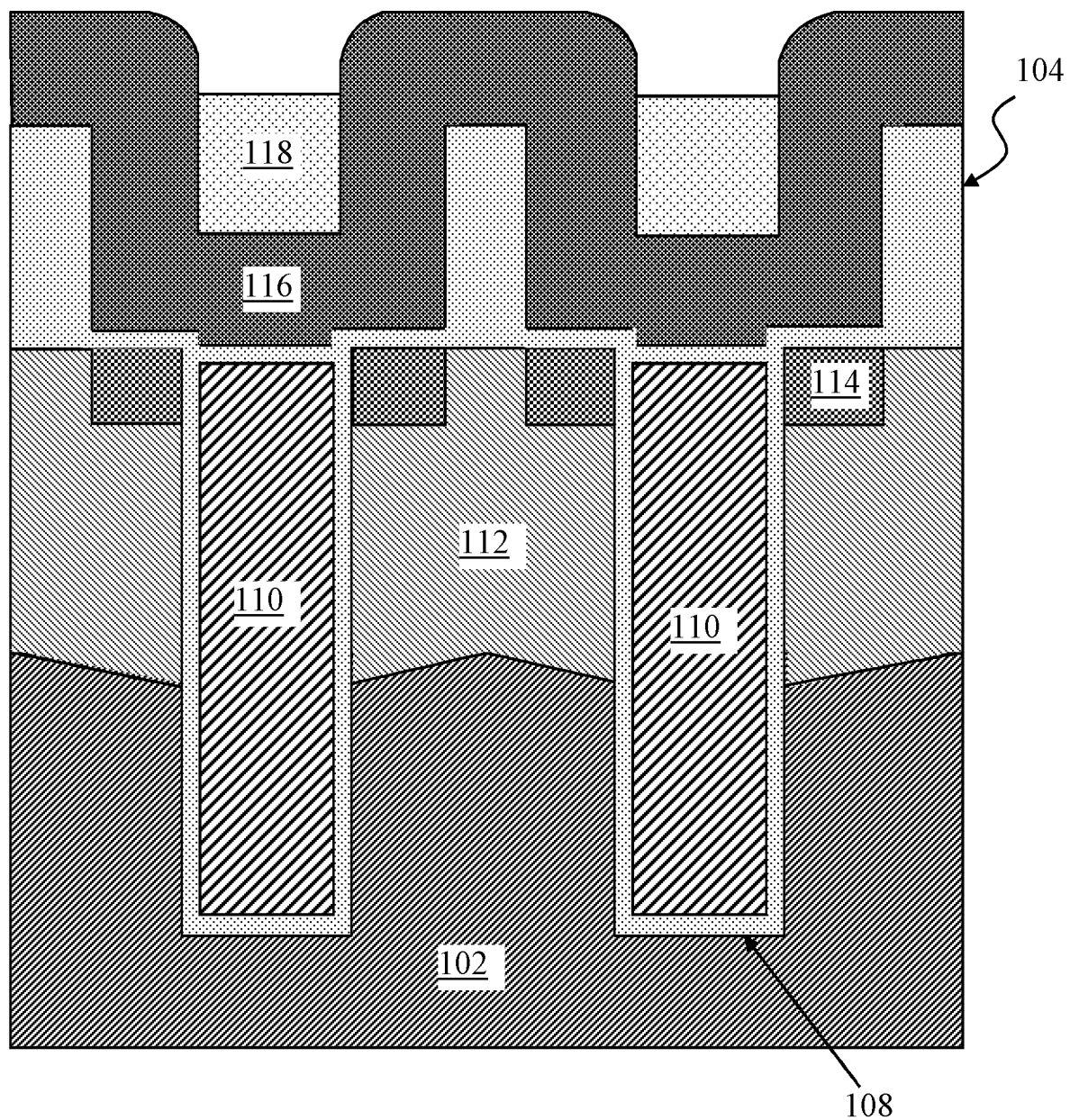
Figure 1K:
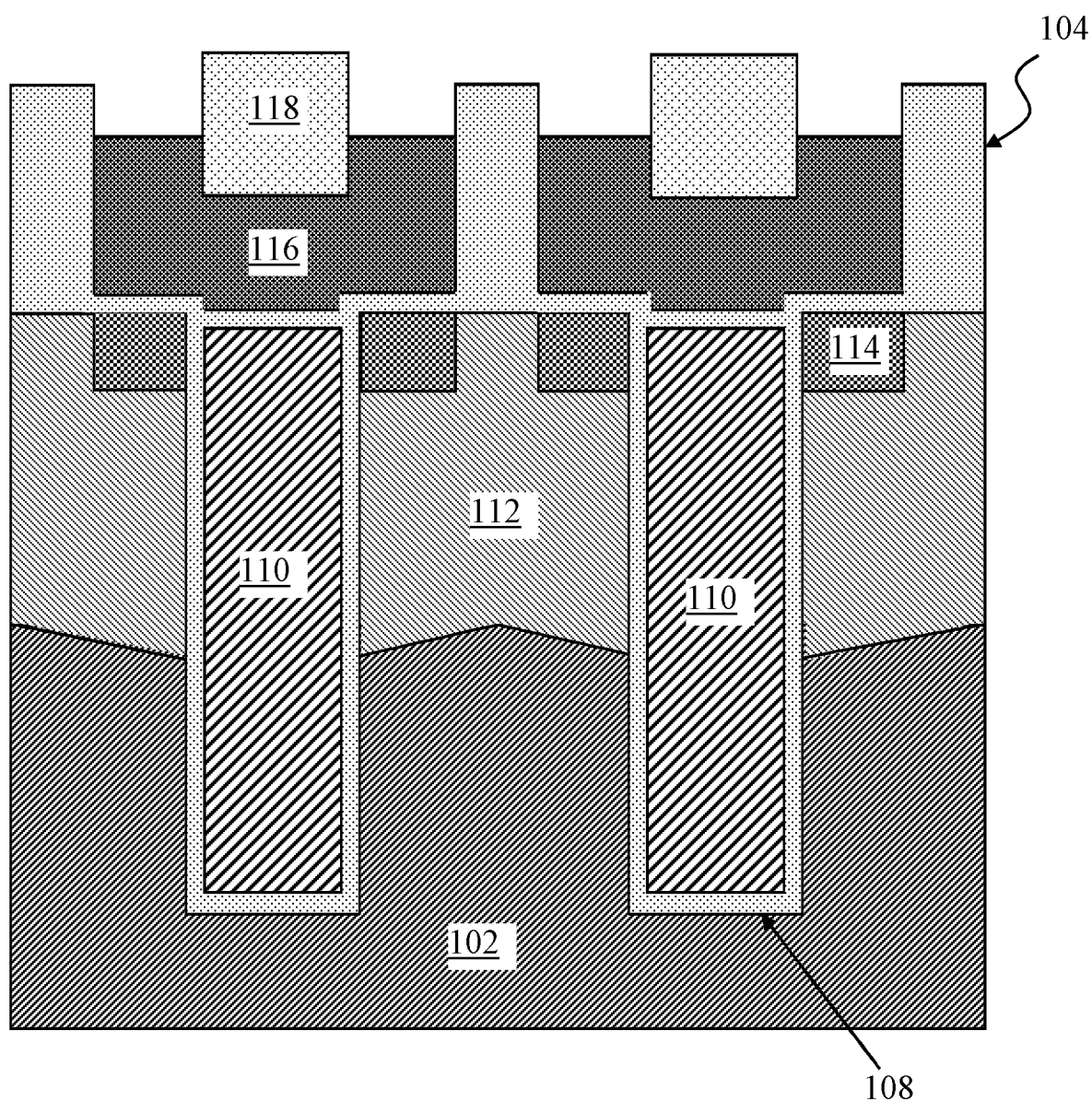
Figure 1L:
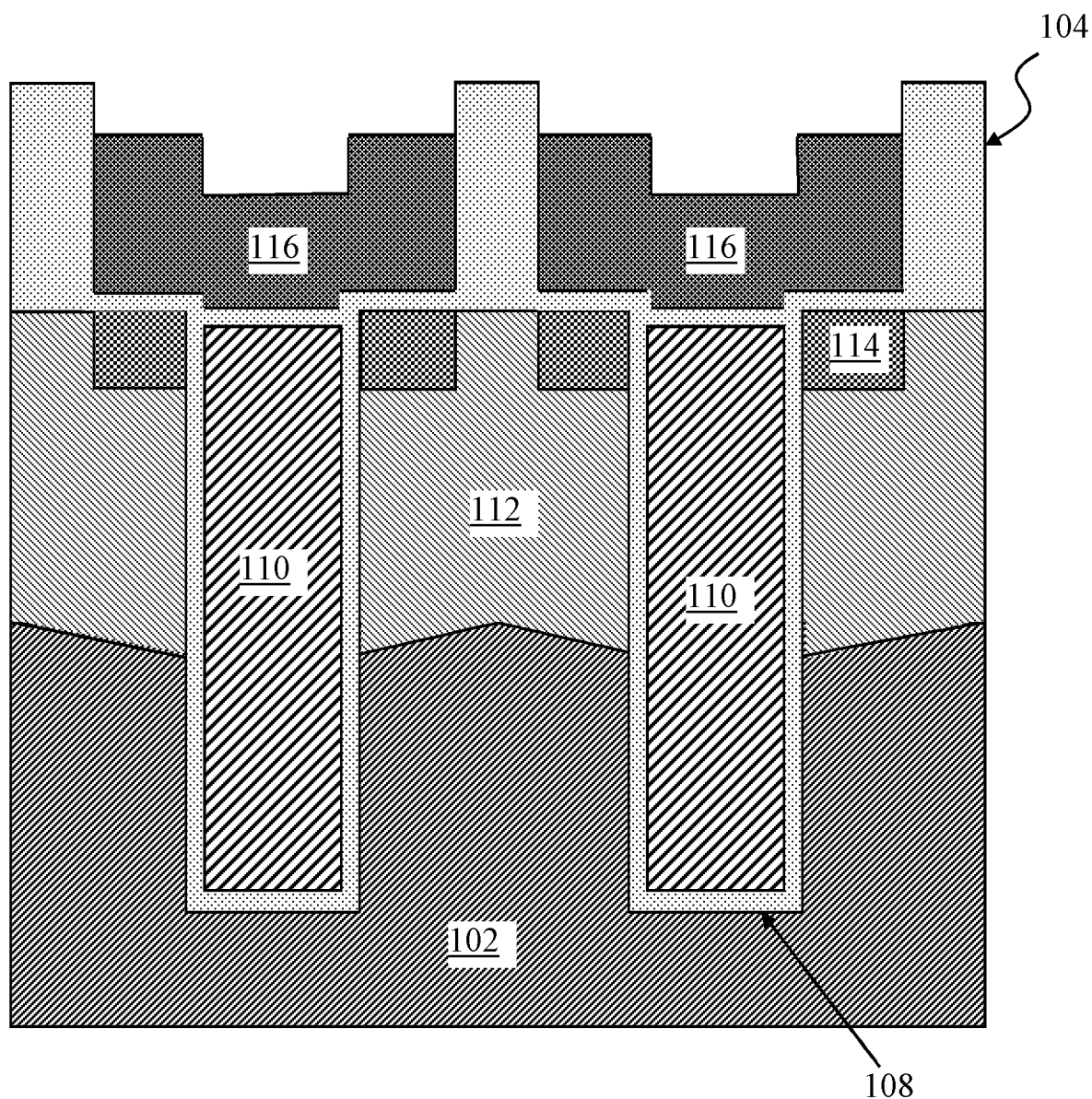
Figures 1, 1L:
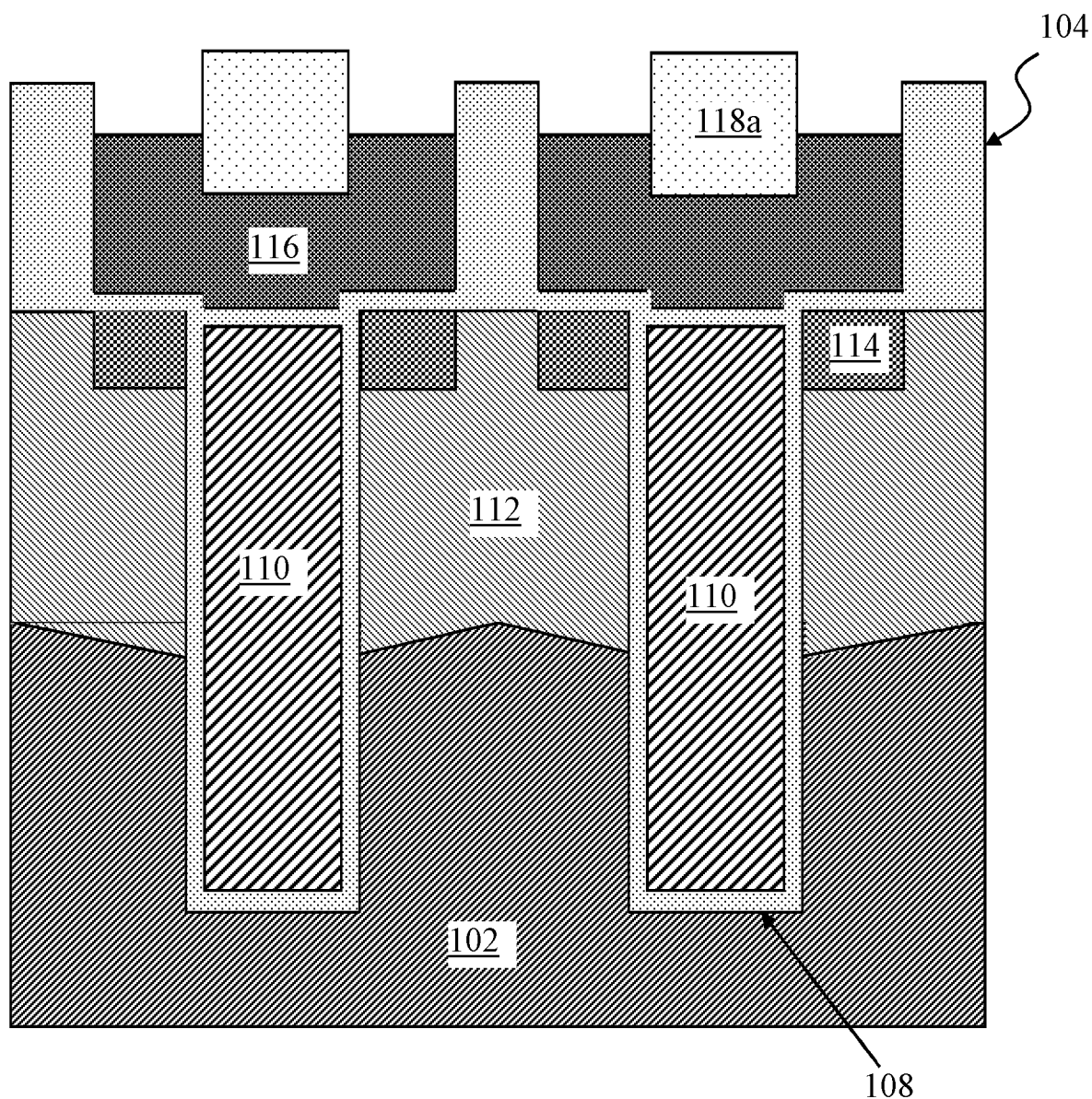
Figure 1M:
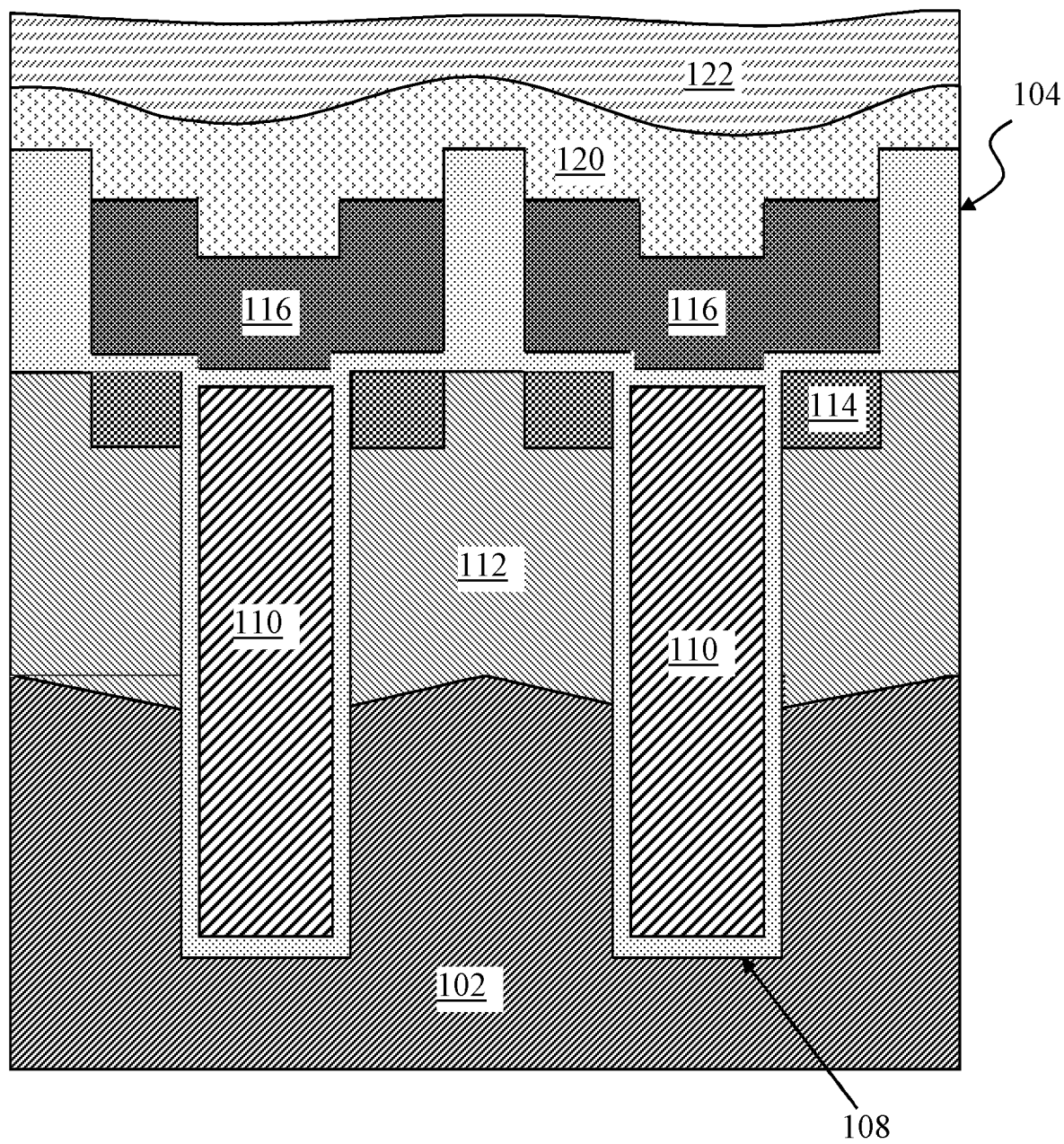
Figure 1N:
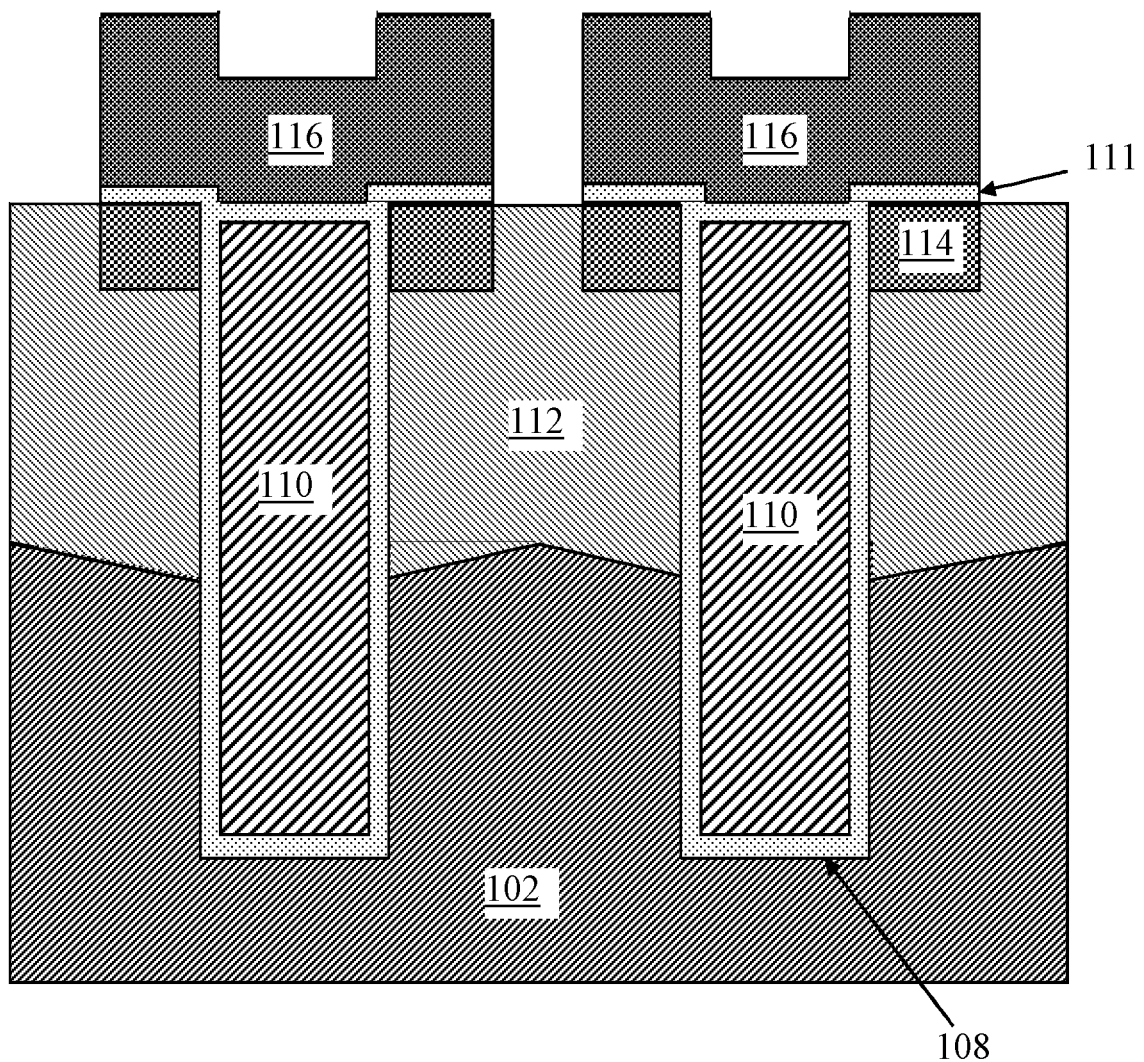
Figure 1O:
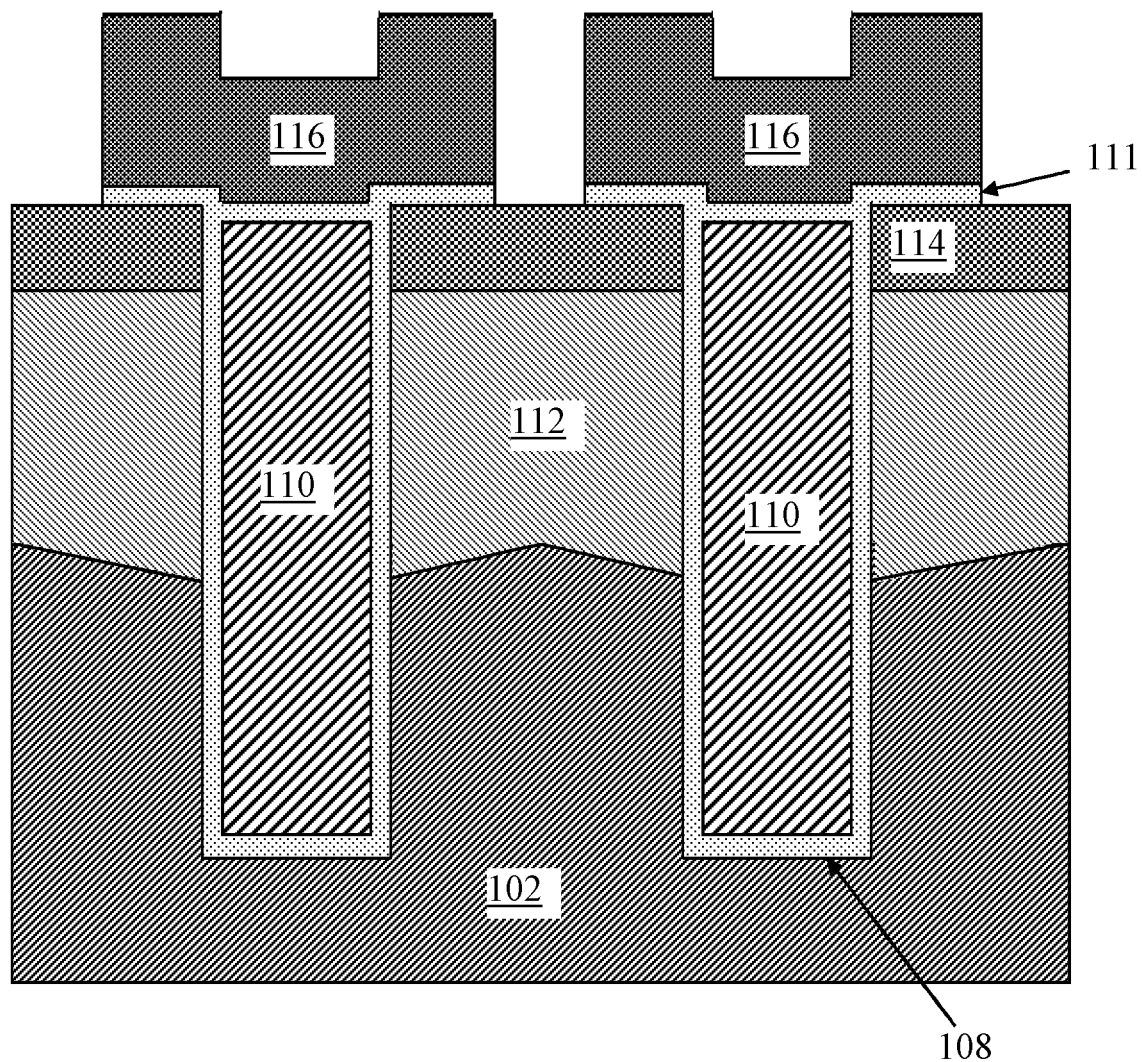
Figure 1P:
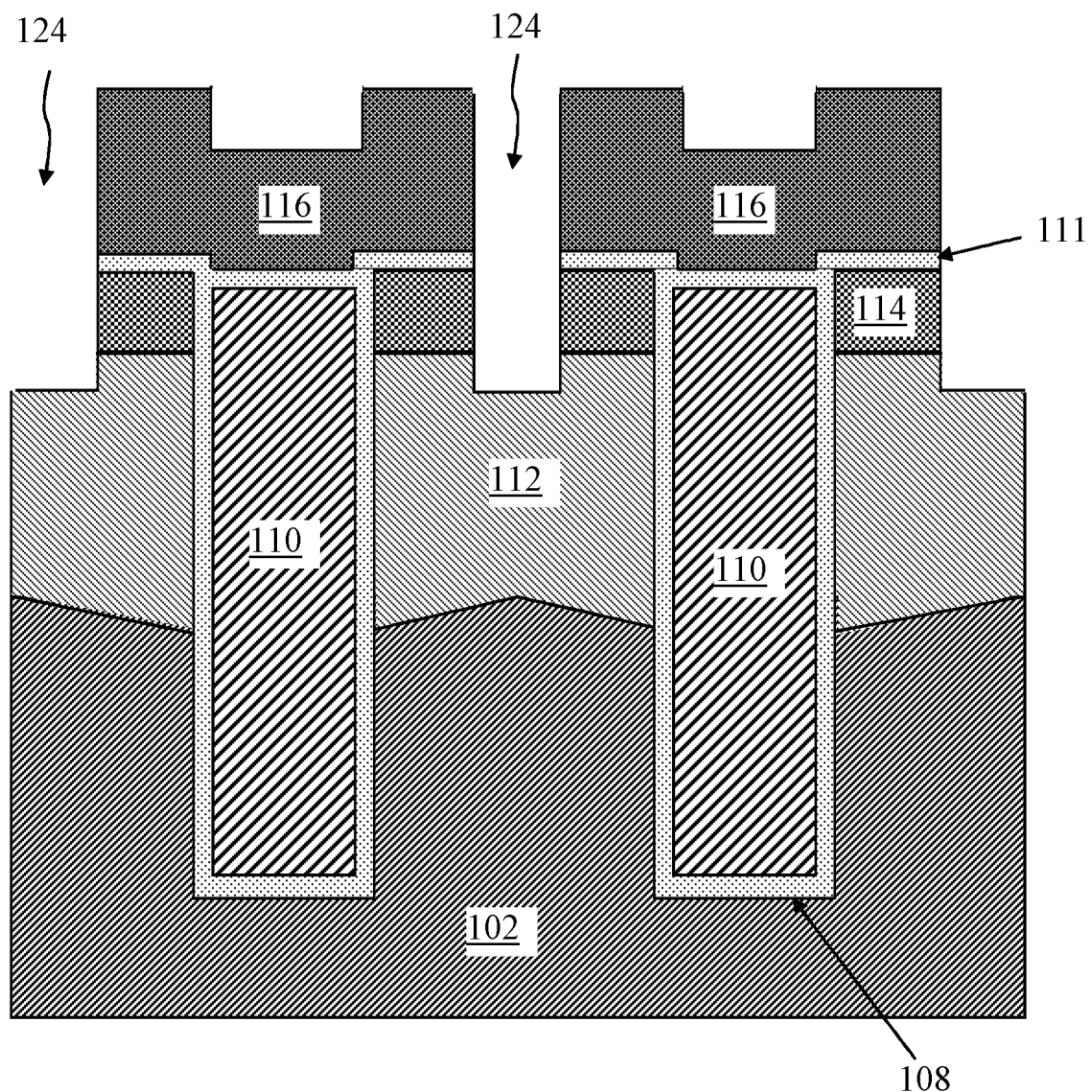
Figure 1Q:
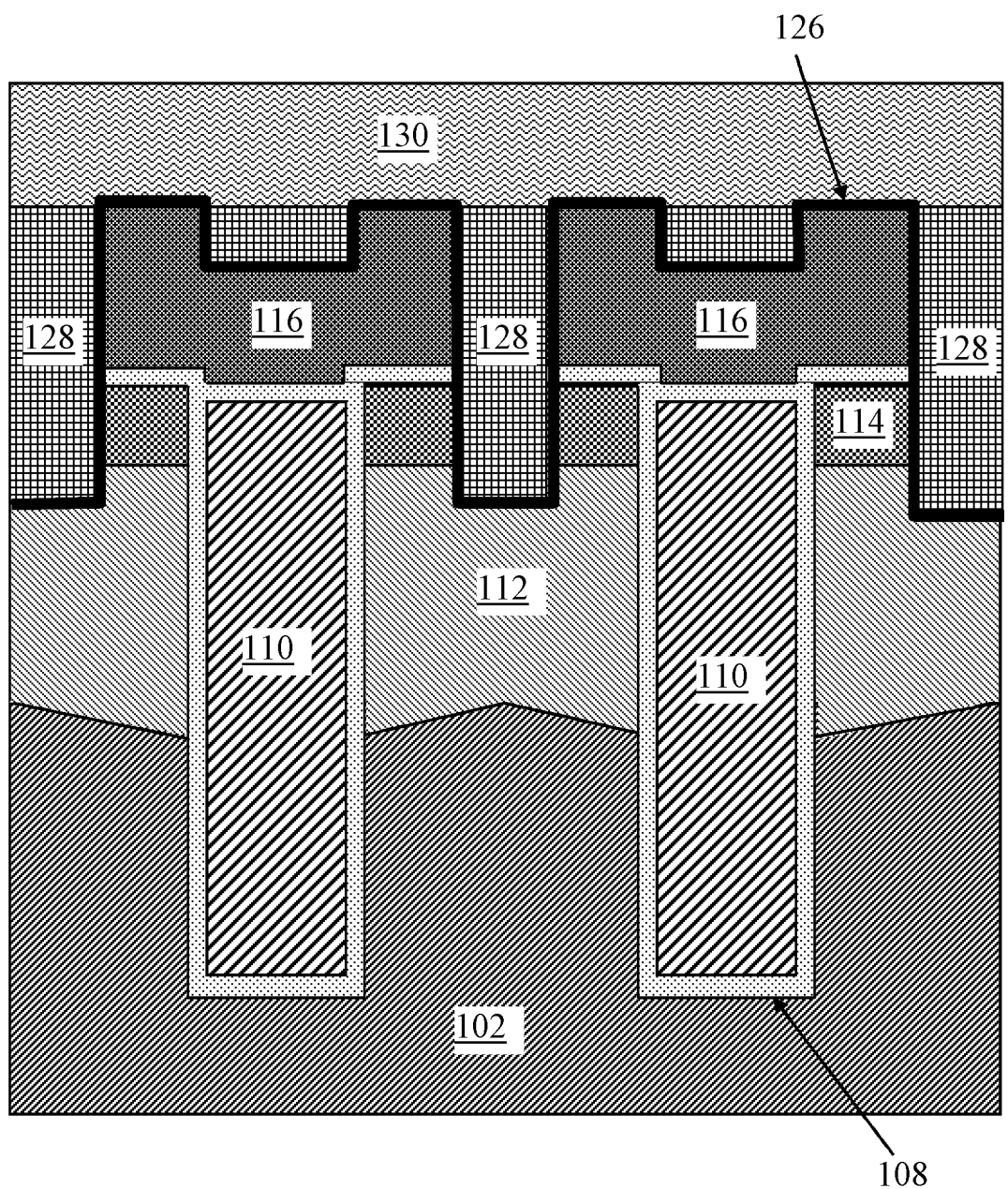

FIGS. 1A-1Q is a sequence of cross-sectional schematic diagrams illustrating a method of fabrication of the device according to one embodiment of the present disclosure. The process uses a semiconductor substrate 102 as a starting material. The substrate 102 may be divided into multiple die. Each die may include an active cell area and a gate pickup/contact area at the periphery of a die. Generally, the active cell area contains multiple cells (e.g., MOSFET cells) having the same or similar structure. For the sake of example, figures show two cells in the active area. This is done to illustrate the general fabrication process and is not meant as a limitation on any embodiment of the invention.

A hard mask layer 104 of a suitable material, such as oxide or nitride, can be formed on top of the semiconductor substrate 102. The thickness of the hard mask 104 may be about 0.15 µm to about 1.00 µm. A photoresist (not shown) is formed on the hard mask 104 and patterned to define patterns for the gate trenches. Portions of the hard mask 104 exposed to an etchant through openings in the photoresist are etched away and the etching stops at the silicon surface leaving an opening that will be used to mask the etching of trenches. Thereafter, gate trenches 106 are formed on the active cell area by etching away the substrate underneath the trench openings as shown in FIG. 1A.

A thin sacrificial oxide (not shown) grows on all of the silicon surfaces to oxidize silicon portions that were damaged during the etching. A wet etch with hydrofluoric acid (HF) is performed to remove the sacrificial oxide and etch back the width of the hardmask 104 on top of the silicon to leave remaining portions that are of the desired size and shape for the future contact as shown in FIG. 1B. In FIG. 1C, an oxidation is performed to grow gate oxide 108 by oxidizing the silicon. In some embodiments, the thickness of the gate oxide 108 is about 150-1000 Å and preferably 150-600 Å.

Next, conductive material 110, such as polysilicon, is deposited into the trenches and over the semiconductor substrate followed by a chemical mechanical polishing (CMP) to remove polysilicon back to top of the hardmask 104. The conductive material 110 is then etched to the desired recess below the mesa between the trenches 106. A poly re-oxidation is performed to form a desired thickness of oxide 111 over the conductive material 110 as shown in FIG. 1D.

As shown in FIG. 1E, a body implant to form a plurality of body regions 112a is carried out with or without a body mask by implanting dopants into the top portions of the semiconductor substrate 102. In FIG. 1F, heat is applied to activate dopant atoms and drive dopant diffusion to form a body region 112 (e.g., a p-type or n-type body region depending on the type of dopants implanted) in the substrate 102. In FIG. 1G, a plurality of source regions 114 are formed by applying a source mask to carry out a source dopant implant. The processes for the body implant and the source implant may be identical to corresponding stages of the current standard trench MOSFET process.

FIG. 1H shows a layer of nitride 116 is deposited over the top of the structure of FIG. 1G (including the hard mask structure 104) by low pressure chemical vapor deposition (LPCVD). The thickness of the nitride 116 is equal or larger than the width of the exposed mesa. In one example, the nitride 116 may be in a thickness of about 0.08 μm to about 0.50 μm.

In FIG. 1I, a thin photoresist layer 118 may be coated on top of the structure of FIG. 1H without exposing it and/or without using it as a mask. The photoresist layer 118 here is used as a space holder. A blanket etch of the photoresist layer 118 is performed leaving exposed elevated portions of the nitride 116 and leaving photoresist 118 in the recesses between the elevated portions of the nitride 116 as shown in FIG. 1J. A nitride etch of the top portion of the nitride 116 as shown in FIG. 1K is performed with a process that preferentially etches the nitride exposing the oxide hardmask 104 and leaving the photoresist behind. In FIG. 1L, the photoresist layer 118 is removed by wet chemical solvent or dry plasma.

Alternatively for the processes of FIGS. 1I-1L, an oxide layer 118a (e.g., high density plasma (HDP) oxide) may be used instead of a photoresist layer. An oxide may be deposited over the structure of FIG. 1H by HDP deposition. An oxide-selective CMP may then be performed to remove the HDP oxide down to the surface of the elevated portions of the nitride 116. A nitride etch back is performed to etch portions of nitride 116 exposing the oxide hardmask 104 and leaving the HDP oxide behind. FIG. 1L-1 shows the structure at the stage corresponding to FIG. 1L when replacing the photoresist layer with HDP oxide.

Next, a low temperature oxide (LTO) layer 120 and a borophosphosilicate glass (BPSG) layer 122 are deposited over the structure of FIG. 1L (as shown in FIG. 1M) or FIG. 1L-1.

A contact mask (not shown) is applied to protect other portions of the device (e.g., gate pickup area) and expose only portions of the active cell area. It is noted that another contact mask may be needed for gate pickup area. In FIG. 1N, an oxide etch is performed though openings in the contact mask. The oxide etch may be stopped at the mesa surface by using an anisotropic (e.g., plasma) oxide etch of high selectivity to nitride and silicon. This etch removes the remaining oxide hardmask 104 (and the HDP oxide if using HDP oxide instead of photoresist 118) and leaves nitride 116 behind. It is noted that the process can be done as long as layer 116 material is resistant to the process that etches the hard mask material 104. Thus, the oxide and nitride can be reversed. In other words, the hardmask 104 can be made of nitride and the layer 116 can be made of oxide.

As shown in FIG. 1O, a second source implant may be optionally performed. The source implant may be done with an angled implant and drive-in process. Then a contact etch process etches the upper portions of the substrate 102 through the openings in the remaining nitride 116 as shown in FIG. 1P to create contact openings 124. In FIG. 1Q, a barrier metal layer 126 is lined on the sidewalls and bottom of the contact openings followed by the deposition of a conductive material, e.g., Tungsten, in the contact openings 124 forming the conductive plugs 128. Following that, a layer of metal 130 (e.g., aluminum) is deposited on the top of the structure. Standard processing may then complete the formation of trench MOSFET devices.

The device of FIG. 1Q according to this embodiment of the present disclosure has nitride 116 on top of the gate poly 110 and over portions of the mesa between the contacts 128. The nitride 116 acts as a good barrier to diffusion of moisture, mobile ions, etc.

Second Embodiment

Figure 2A:
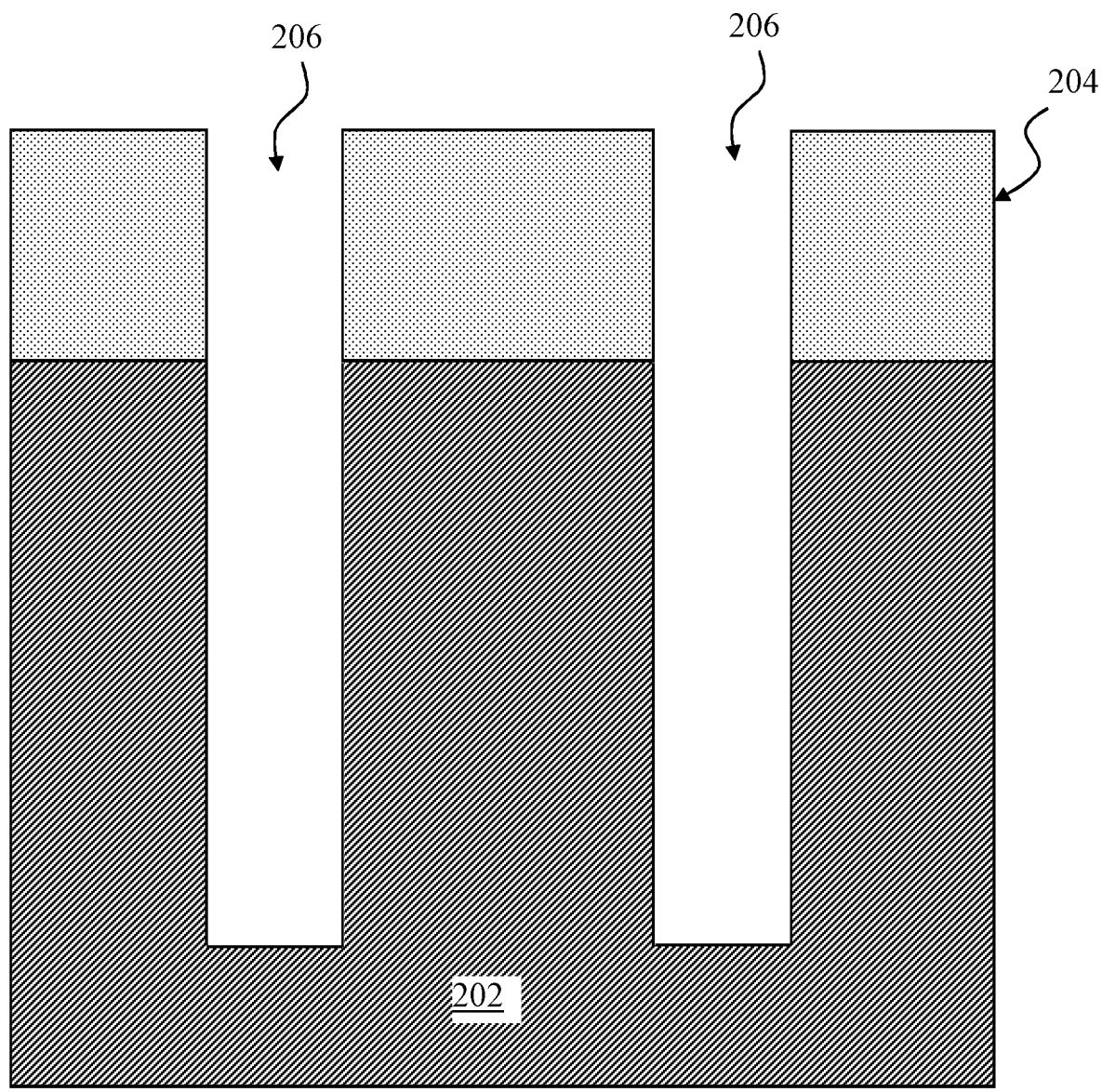
FIGS. 2A-2I are a sequence of cross-sectional schematic diagrams illustrating a method of fabrication of a trench power MOSFET according to one embodiment of the present disclosure.

FIGS. 2A-2I is a sequence of cross-sectional schematic diagrams illustrating a method of fabrication of a device with non-uniform thickness of oxide in trenches according to one embodiment of the present disclosure. Similar to the first embodiment, the process starts with a semiconductor substrate 202 as a starting material. A hard mask layer 204 of a suitable material, such as oxide or nitride, can be formed on top of the semiconductor substrate 202. A photoresist (not shown) is formed on the hard mask 204 and patterned to define patterns for the gate trenches. Portions of the hard mask 204 exposed to an etchant through openings in the photoresist are etched away and the etching stops at the silicon surface leaving an opening that will be used to mask the etching of trenches. Thereafter, gate trenches 206 are formed on the active cell area by etching away the substrate underneath the trench openings as shown in FIG. 2A.

Figure 2B:
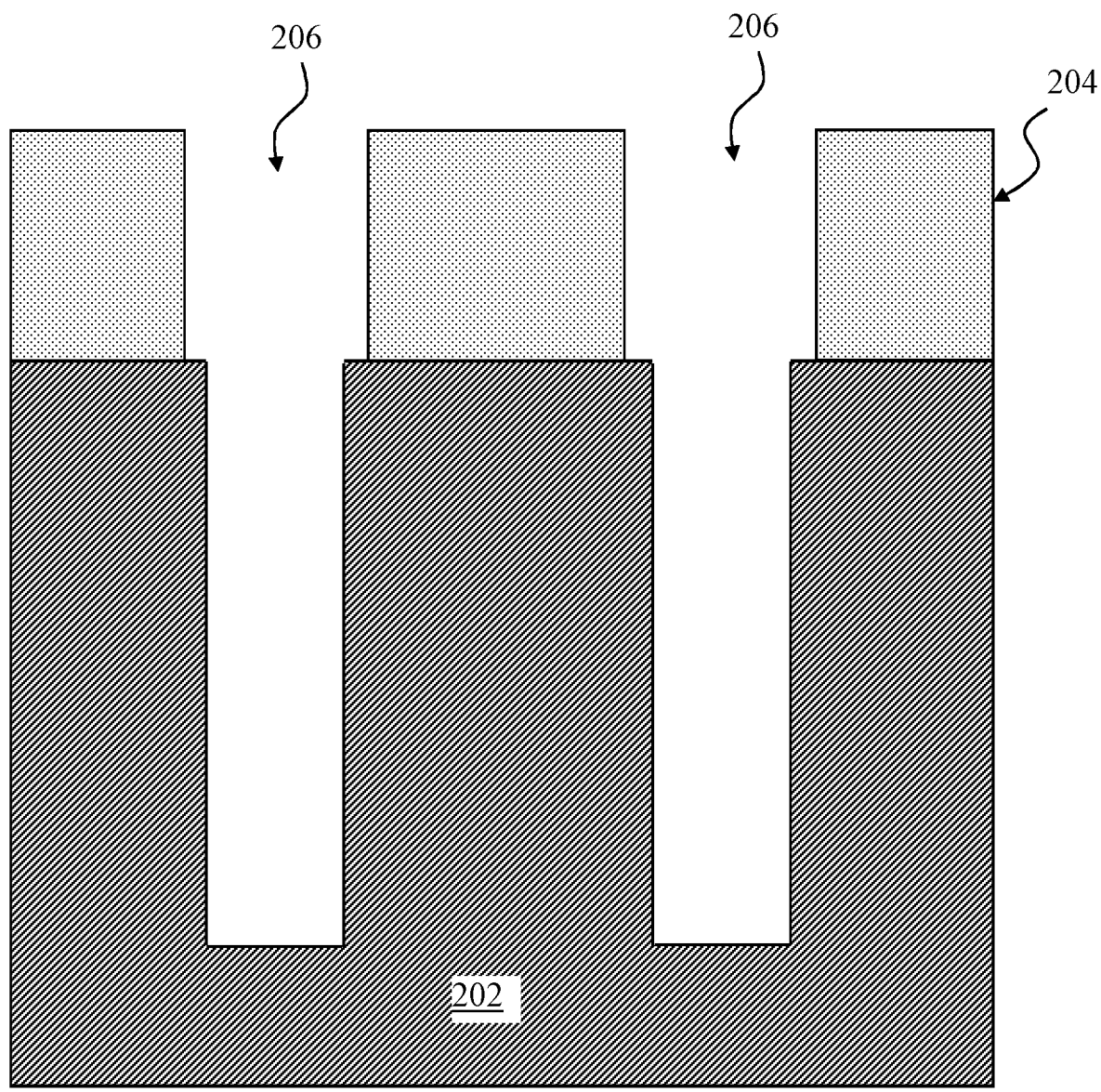
Figure 2C:
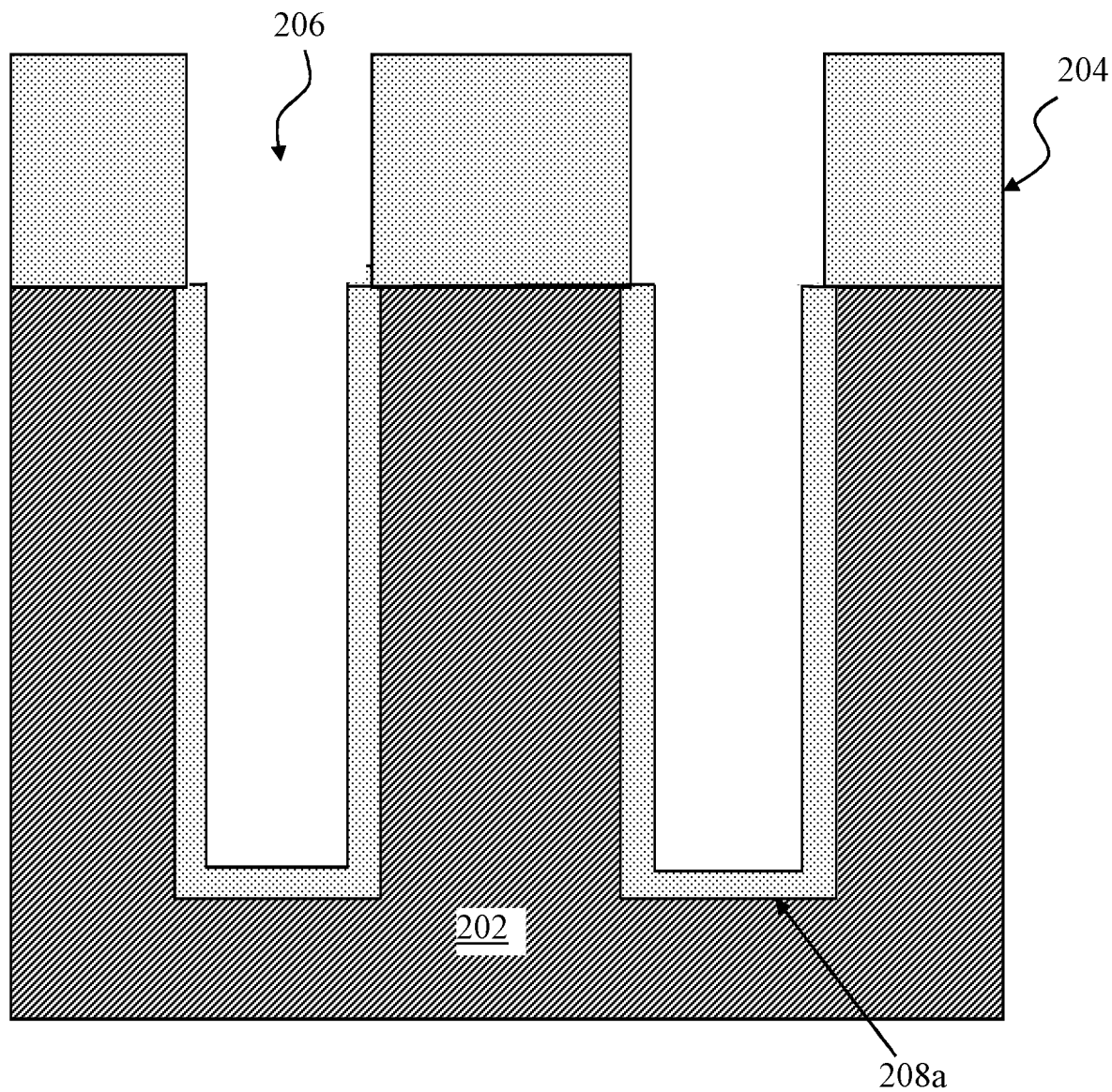

In FIG. 2B, a thin sacrificial oxide (not shown) is removed after it grows on all of the silicon surfaces to oxidize silicon portions that were damaged during the etching. Unlike the first embodiment, the width of the hardmask 204 is not etched back to the width of the contact into silicon during this step. In FIG. 2C, a liner oxide 208a grows on the sidewalls of the gate trenches 206 by, e.g., CVD. The thickness of the liner oxide 208a is about 2 to 5 times of the thickness of the gate oxide 108 in the first embodiment. By way of the example and not by way of limitation, the thickness of the liner oxide 208a is in a range of 0.06 μm to about 0.30 μm.

Figure 2D:
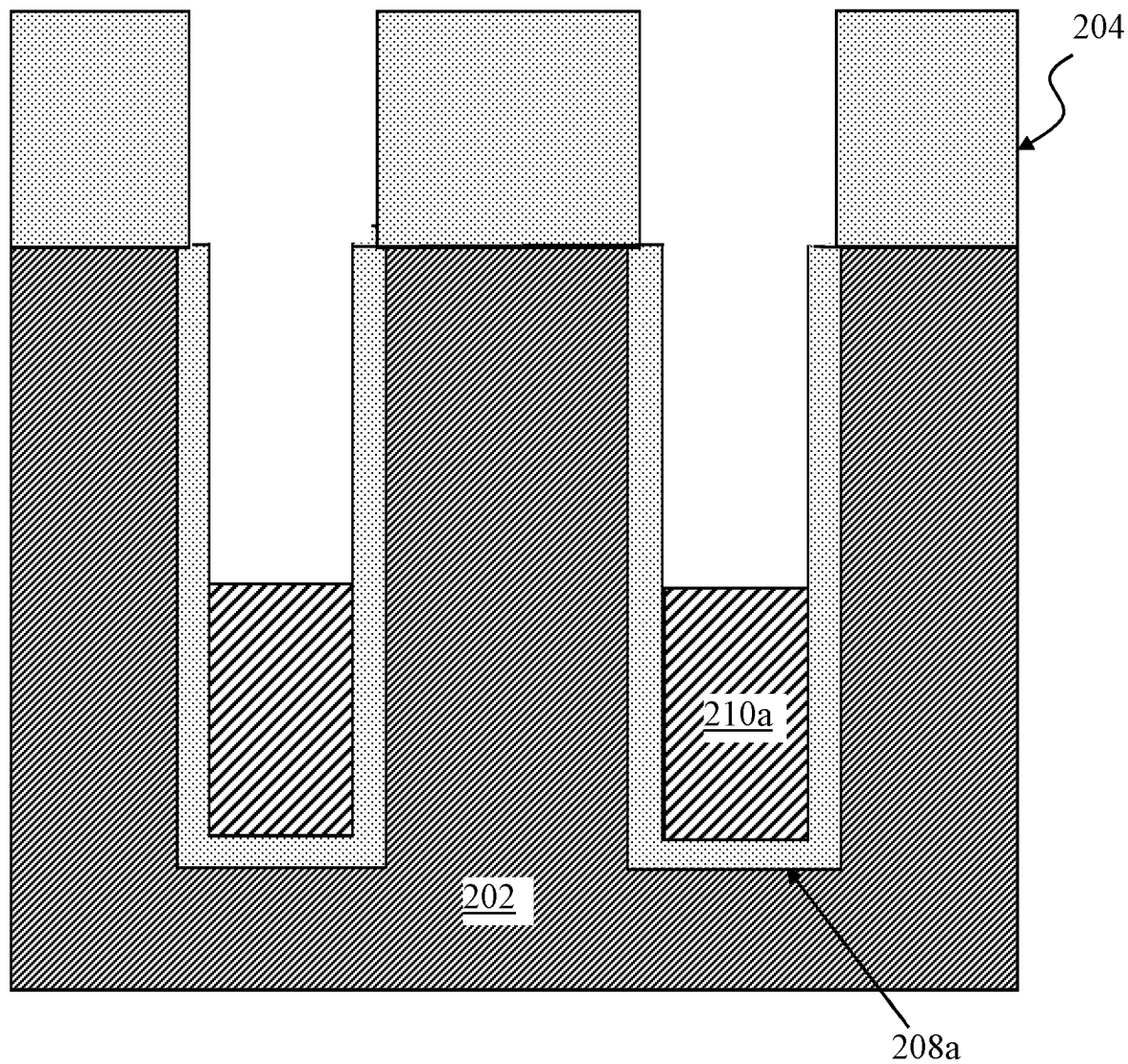

Next, conductive material 210a, such as polysilicon, is deposited into the trenches and over the semiconductor substrate followed by a chemical mechanical polishing (CMP) to remove polysilicon back to top of the hardmask 204. The conductive material 210a is then etched to a desired depth in the trenches 206 as shown in FIG. 2D.

Figure 2E:
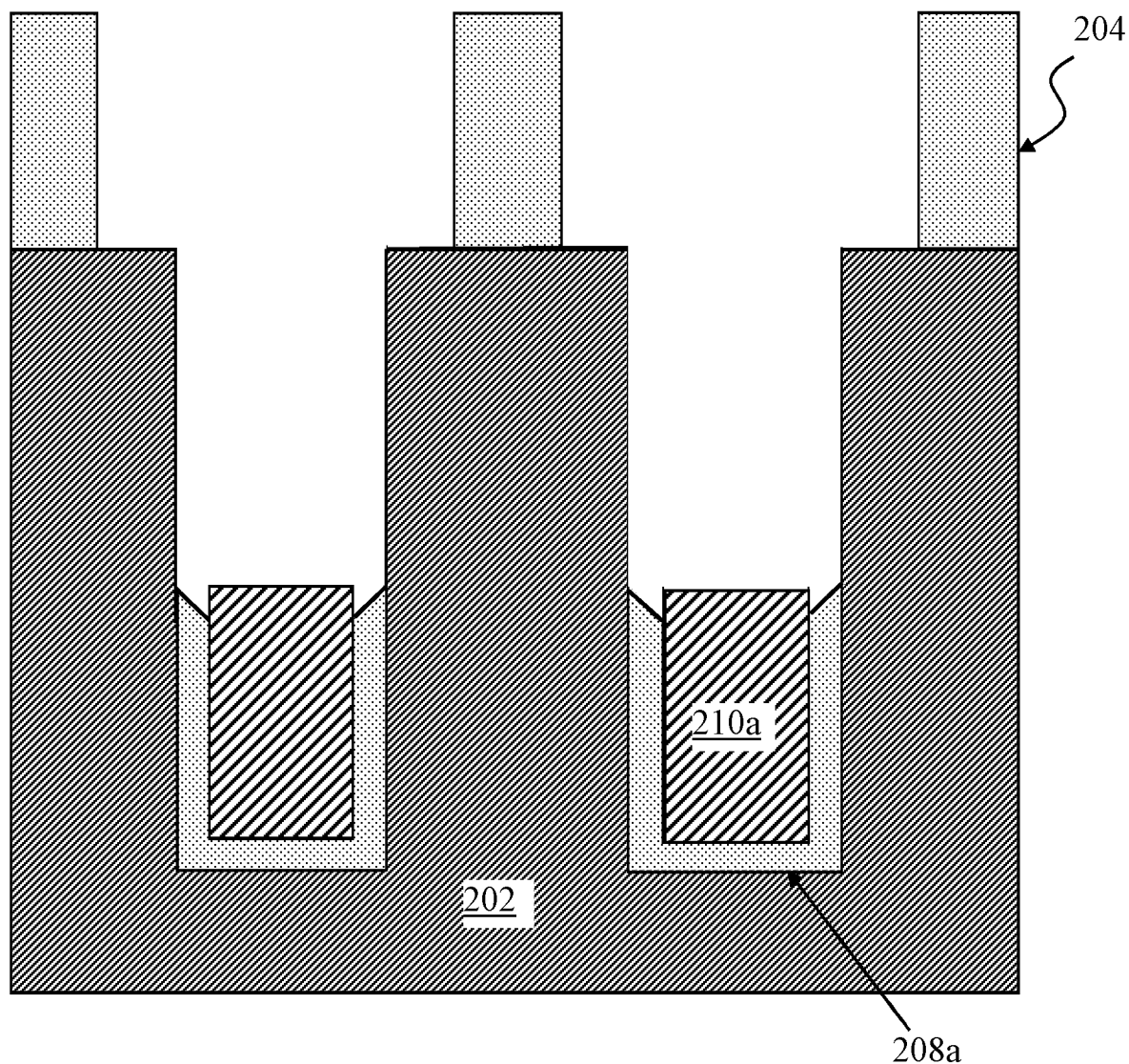
Figure 2F:
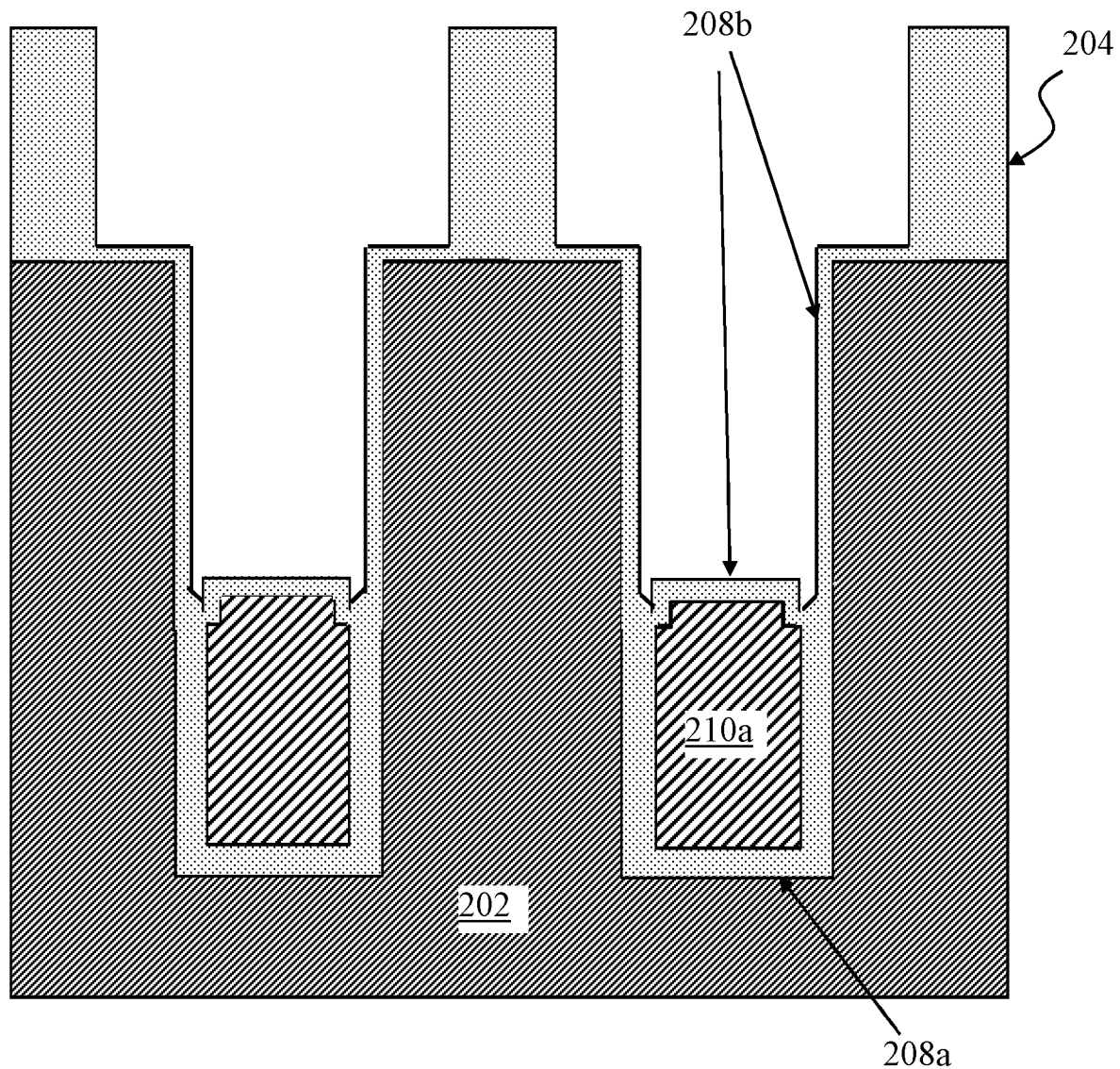

In FIG. 2E, a wet etch with hydrofluoric acid (HF) is performed to remove the liner oxide 208a and the hard mask 204 to a desired width for contacts. A gate oxide 208b is grown on the conductive material 210a and along trench sidewalls above the conductive material 210a as shown in FIG. 2F. The thickness of the gate oxide 208b is thinner than the liner oxide 208a. In some embodiments, the thickness of the gate oxide 208b is in a range of 0.015 μm to about 0.060 μm.

Next, conductive material 210b, such as polysilicon, is deposited into the upper portion of the trenches and etched to a desired recess below the mesa between the trenches 206. A poly re-oxidation is performed to form a desired thickness of oxide 211 over the conductive material 210b as shown in FIG. 2G.

Figure 2G:
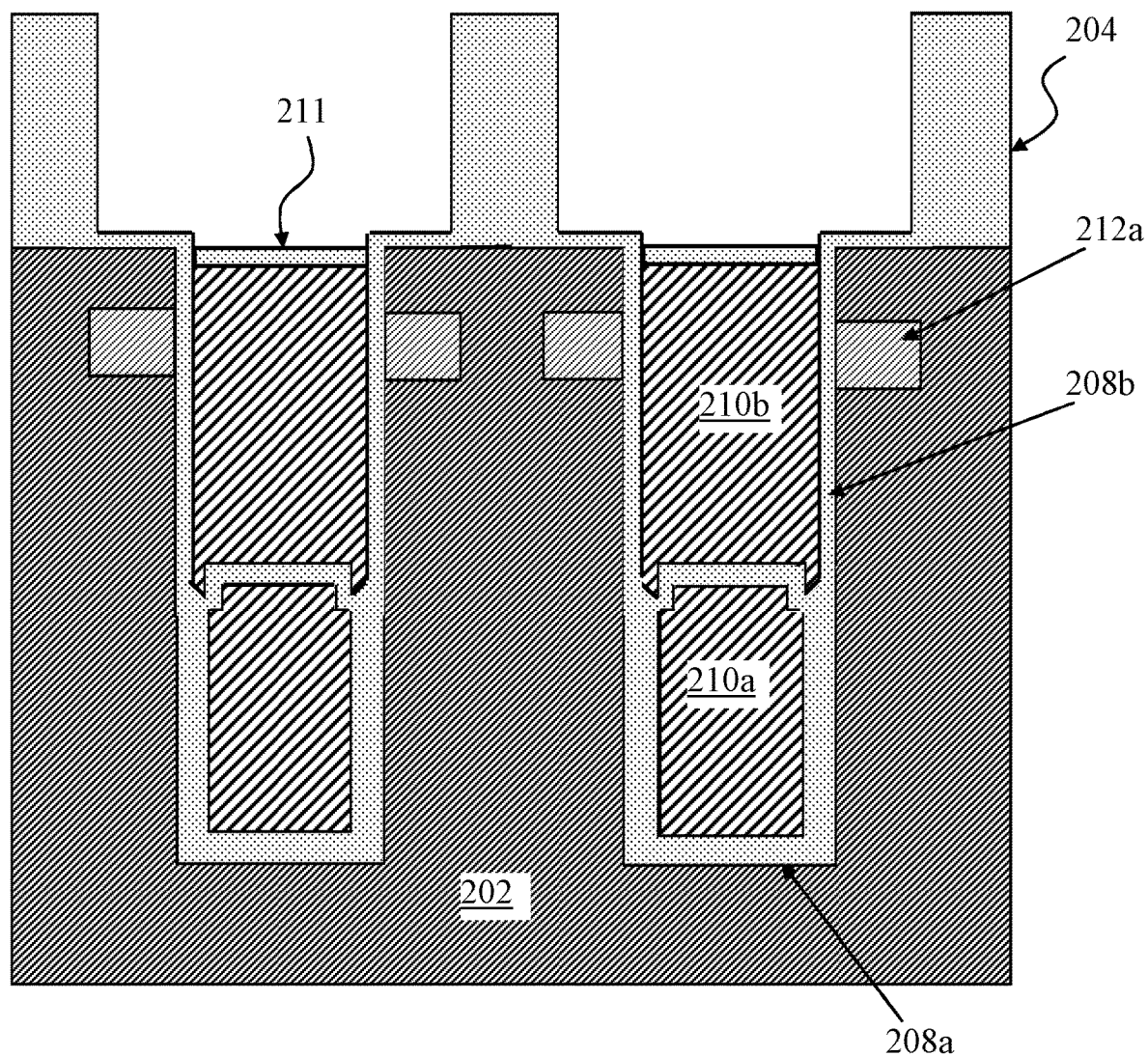
Figure 2H:
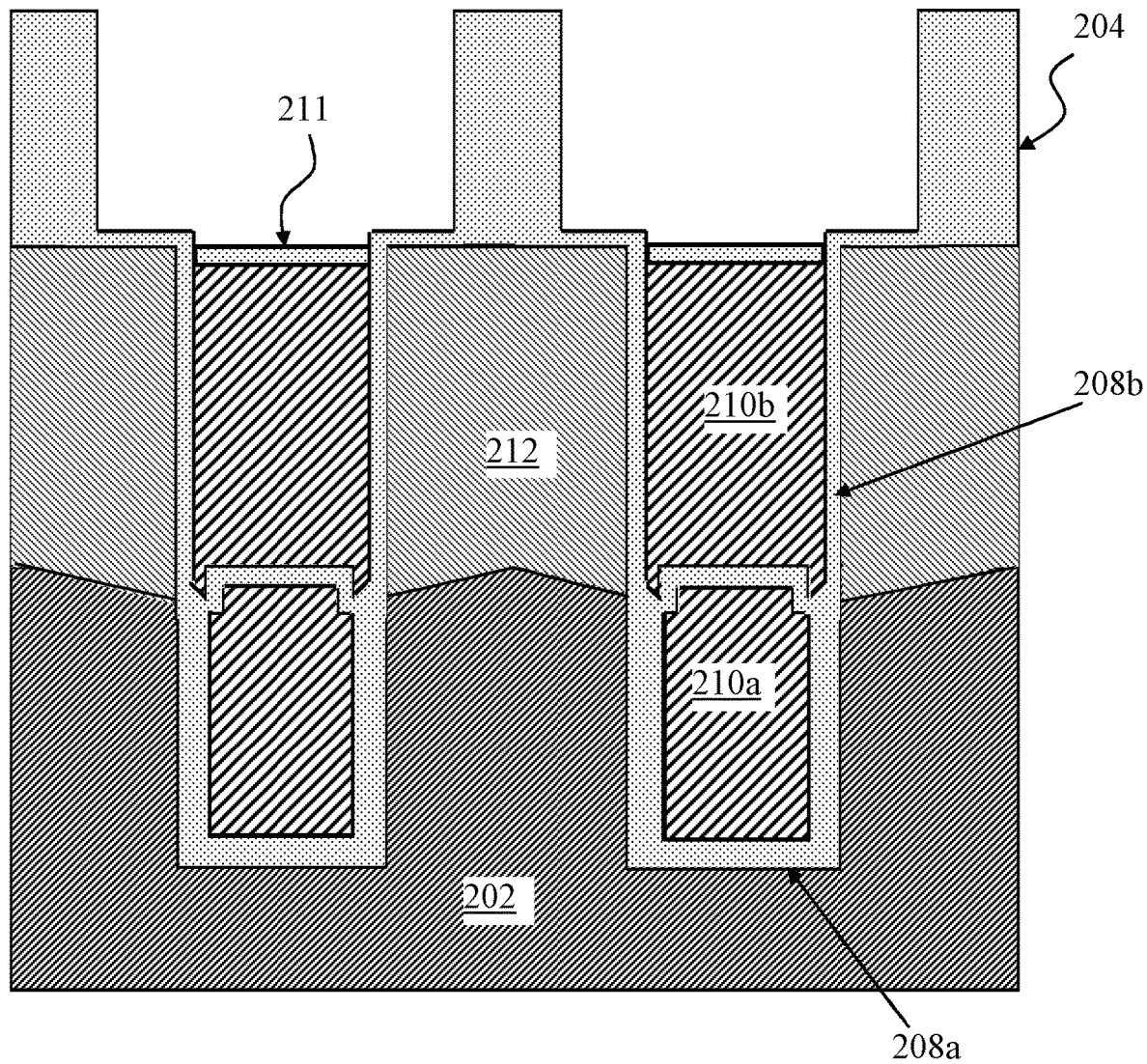
Figure 2I:
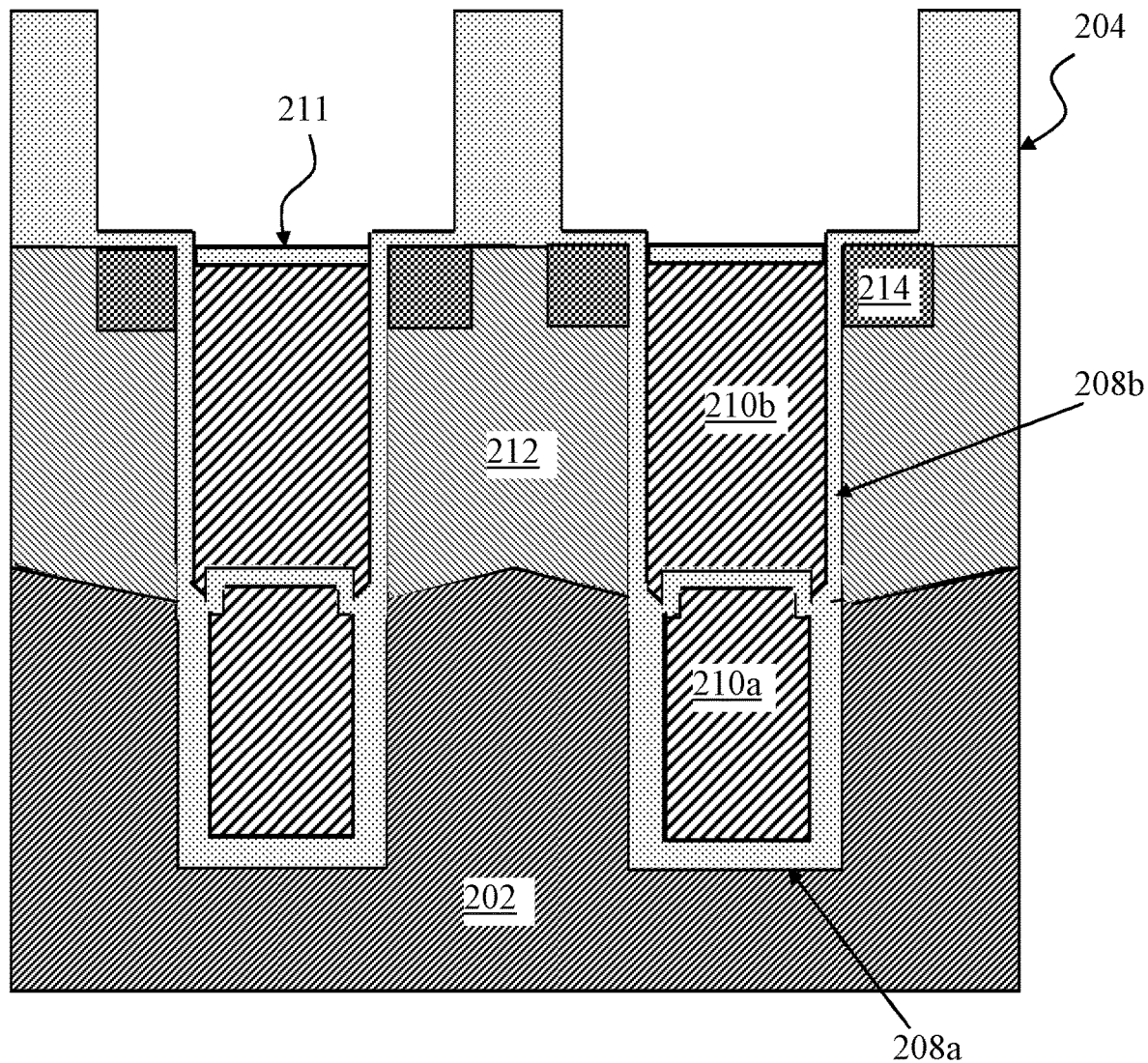

As shown in FIG. 2G and FIG. 2H, a body implant into area 212a is carried out to form a plurality of body regions 212a followed by a body drive to form a body region 212 (e.g., a p-type or n-type body region depending on the type of dopants implanted) in the substrate 202. In FIG. 2I, a plurality of source regions 214 are formed by applying a source mask to carry out a source dopant implant. Thereafter, the processes identical to the processes of FIGS. 1H-1Q are applied to form contacts by using the hardmask 204 as space holders.

Figure 3A:
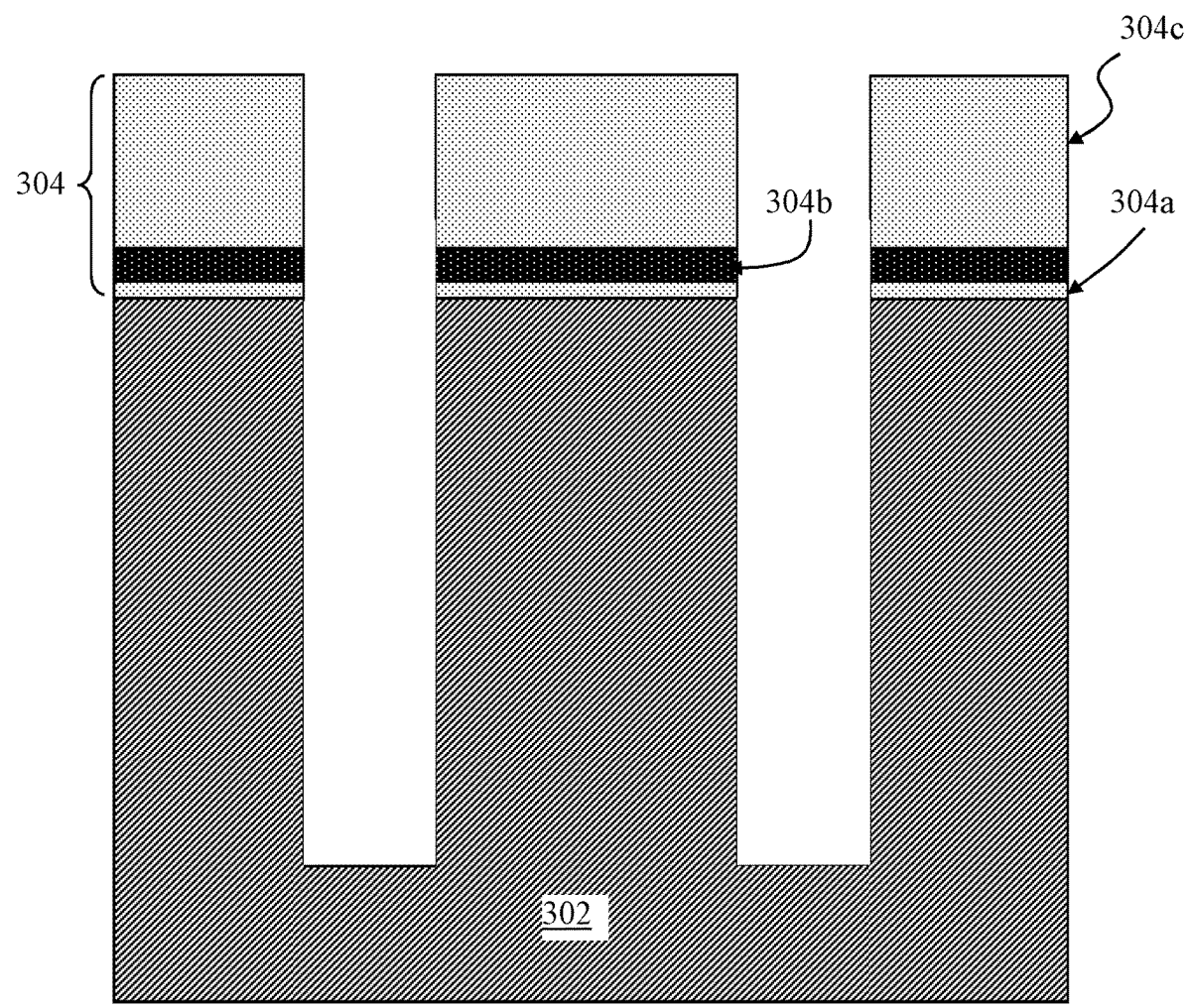
FIGS. 3A-3U are a sequence of cross-sectional schematic diagrams illustrating a method of fabrication of a trench power MOSFET according to one embodiment of the present disclosure.
Figure 3B:
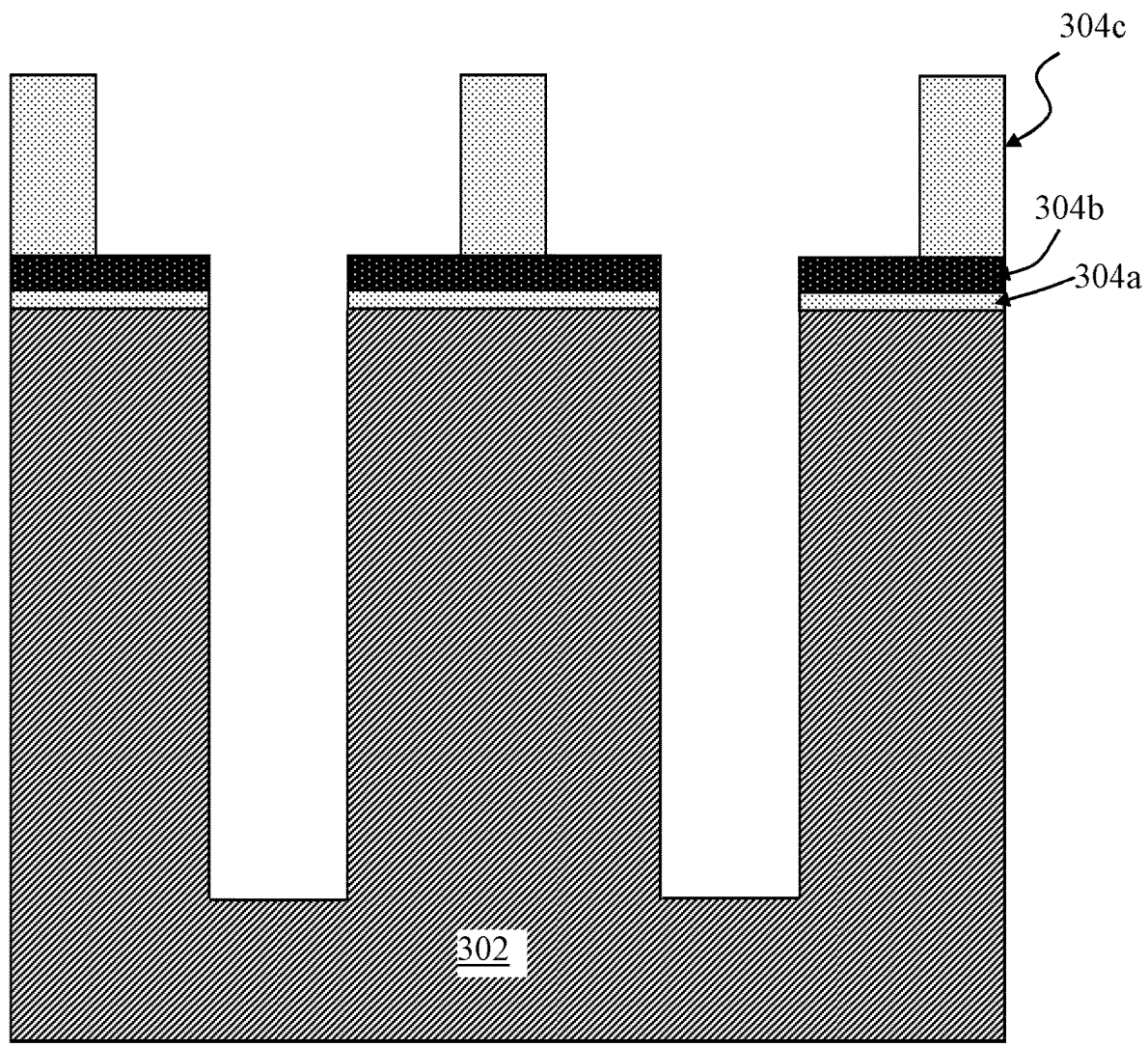
Figure 3C:
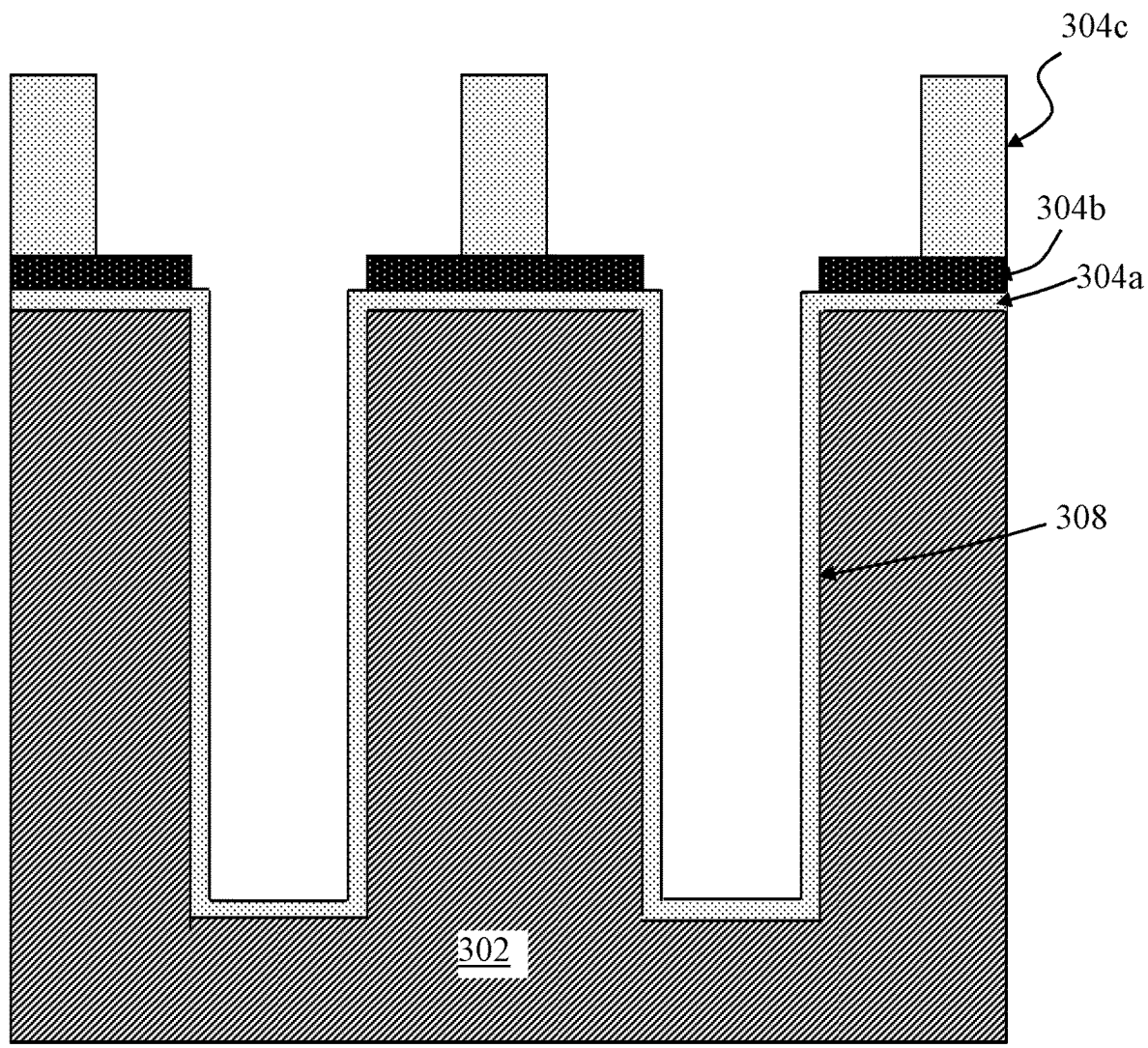
Figure 3D:
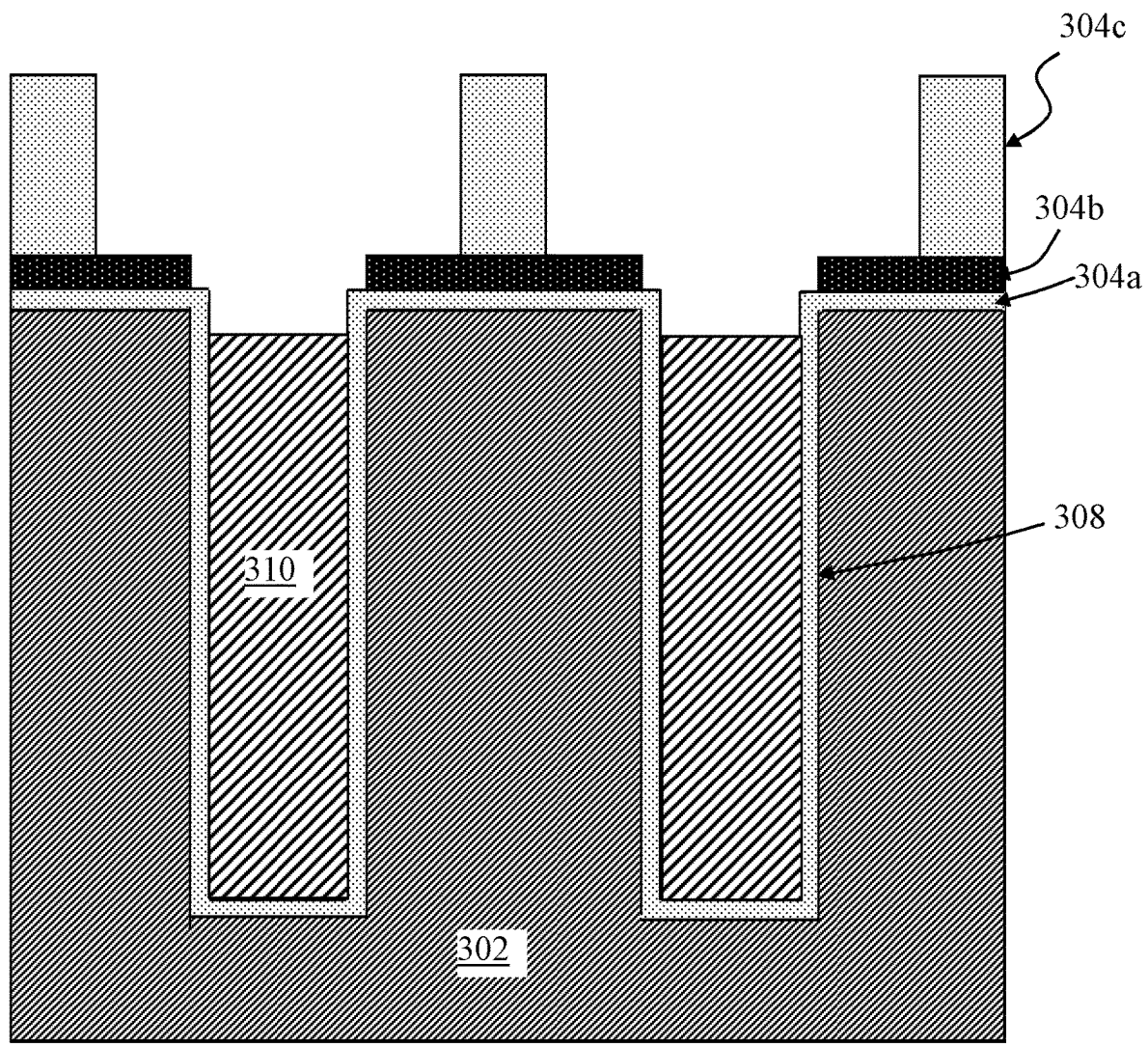
Figure 3E:
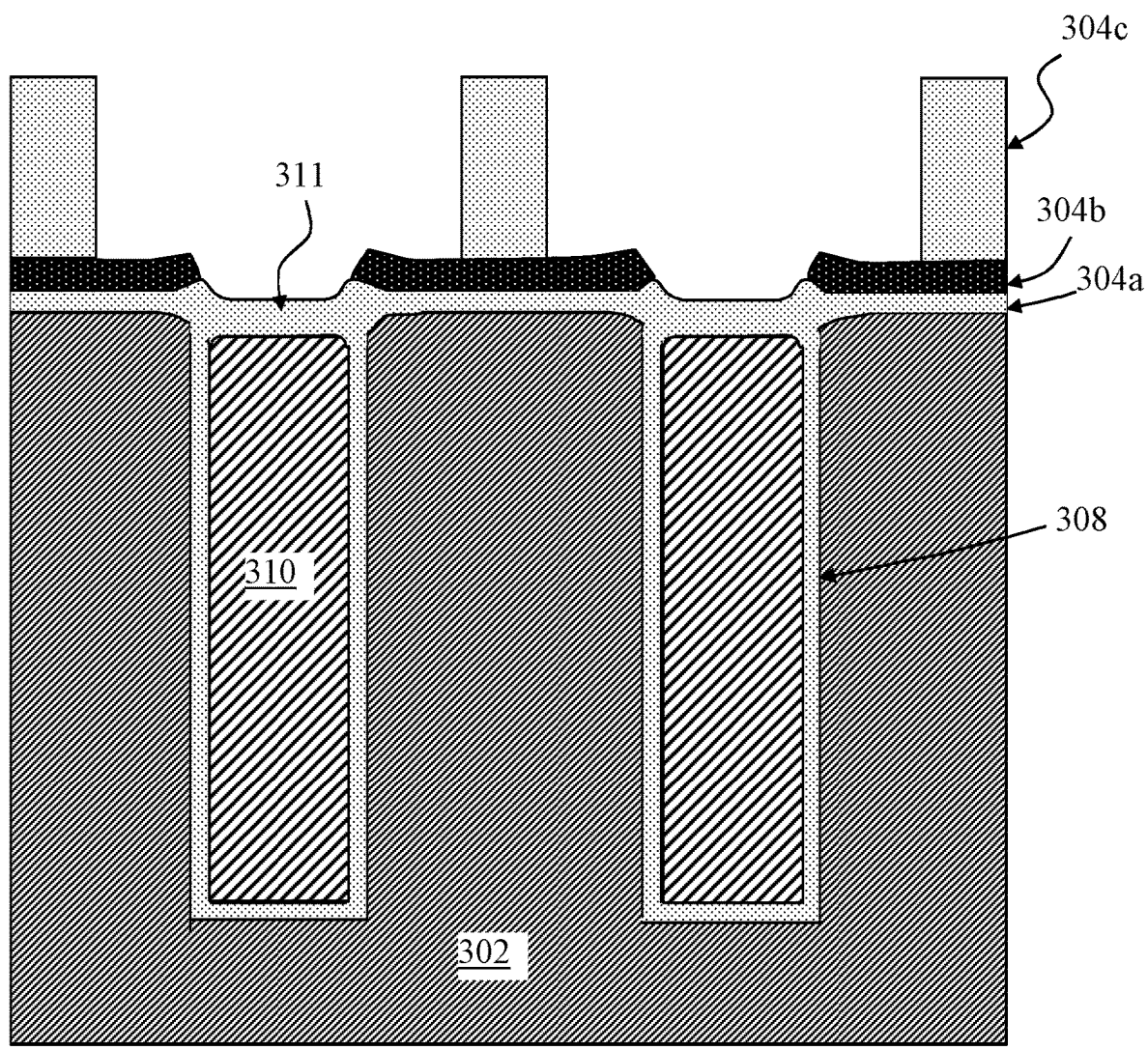

The device according to this embodiment of the present disclosure also has nitride on top of the gate poly 210b and over portions of the mesa between the contacts as in the first embodiment to form self-aligned contact devices. The device according to this embodiment has two conductive materials 210a and 210b in each gate trench and has non-uniform thickness of oxide in the trench. It is noted that while there is insulating material between the conductive material 210a and 210b, the conductive material 210a and 210b may be electrically connected together or respectively to source and gate electrodes for device performance that is different from that of the structure in the first embodiment Third Embodiment FIGS. 3A-3U is a sequence of cross-sectional schematic diagrams illustrating a method of fabrication of the device according to one embodiment of the present disclosure. The process uses a semiconductor substrate 302 as a starting material. A hard mask layer 304 can be formed on top of the substrate 302 by forming a thin oxide layer 304a on the substrate 302 by deposition or thermal oxidation, followed by a nitride layer 304b on top of the thin oxide layer 304a. In some embodiments, the thickness of the silicon oxide layer ranges from about 100 Å to 500 Å and is preferably about 200 Å. In some embodiments, the thickness of the nitride layer ranges from 1500 Å to 4000 Å. Another oxide layer 304c may be disposed on top of the nitride layer 304b to form the hard mask with an oxide/nitride/oxide stack. In some embodiments, the thickness of the oxide layer 304c ranges from 1000 Å to 7000 Å. A photoresist (not shown) is formed on the hard mask 304 and patterned to define patterns for the gate trenches. Portions of the hard mask 304 exposed to an etchant through openings in the photoresist are etched away and the etching stops at the silicon surface leaving an opening that will be used to mask the etching of trenches. Thereafter, gate trenches 306 are formed on the active cell area by etching away the substrate underneath the trench openings as shown in FIG. 3A.

A sacrificial oxide (not shown) grows on all of the silicon surfaces to oxidize silicon portions that were damaged during the etching. A wet etch with hydrofluoric acid (HF) is performed to remove the sacrificial oxide and etch back the width of the oxide layer 304c on top of the nitride layer 304b to leave opening of the desired size for the future contact as shown in FIG. 3B. In FIG. 3C, an oxidation is performed to grow gate oxide 308 by oxidizing the silicon. In some embodiments, the thickness of the gate oxide 308 is about 150-1000 Å and preferably 150-600 Å.

Next, conductive material 310, such as polysilicon, is deposited into the trenches and over the semiconductor substrate followed by a chemical mechanical polishing (CMP) to remove polysilicon back to top of the oxide layer 304c. The conductive material 310 is then etched to the desired recess below the mesa between the trenches 306 as shown in FIG. 3D.

An oxidation on the conductive material 310 is carried out to form a thick layer 311 of oxidation. It is noted that the thick oxide layer 311 is thicker than the oxide layer 111 or 211 in the first and second embodiments. In some embodiments, the thick layer 311 is about 3 to 6 times of the thickness of the gate oxide 308. By way of the example and not by way of limitation, the thickness of the thick oxide layer 311 is in a range of 0.05 µm to about 0.30 µm. It is noted that when the conductive material 310 is recessed below mesa to a certain amount, mesa will get oxidation from the side and also under the nitride 304b rounding the mesa corner and bending up the nitride 304b as shown in FIG. 3E. This configuration is sometimes referred to as a "bird's beak".

Figure 3F:
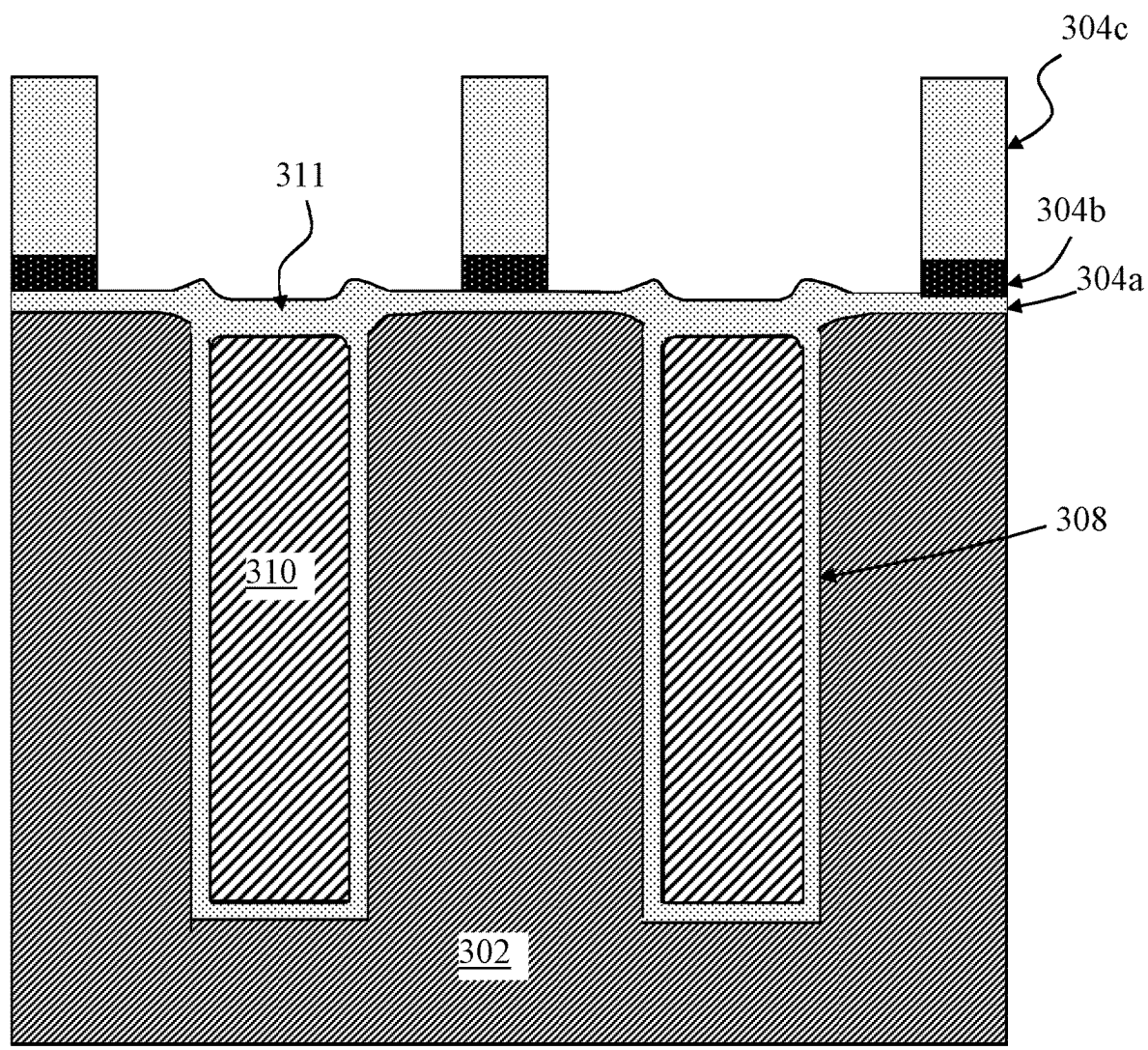
Figure 3G:
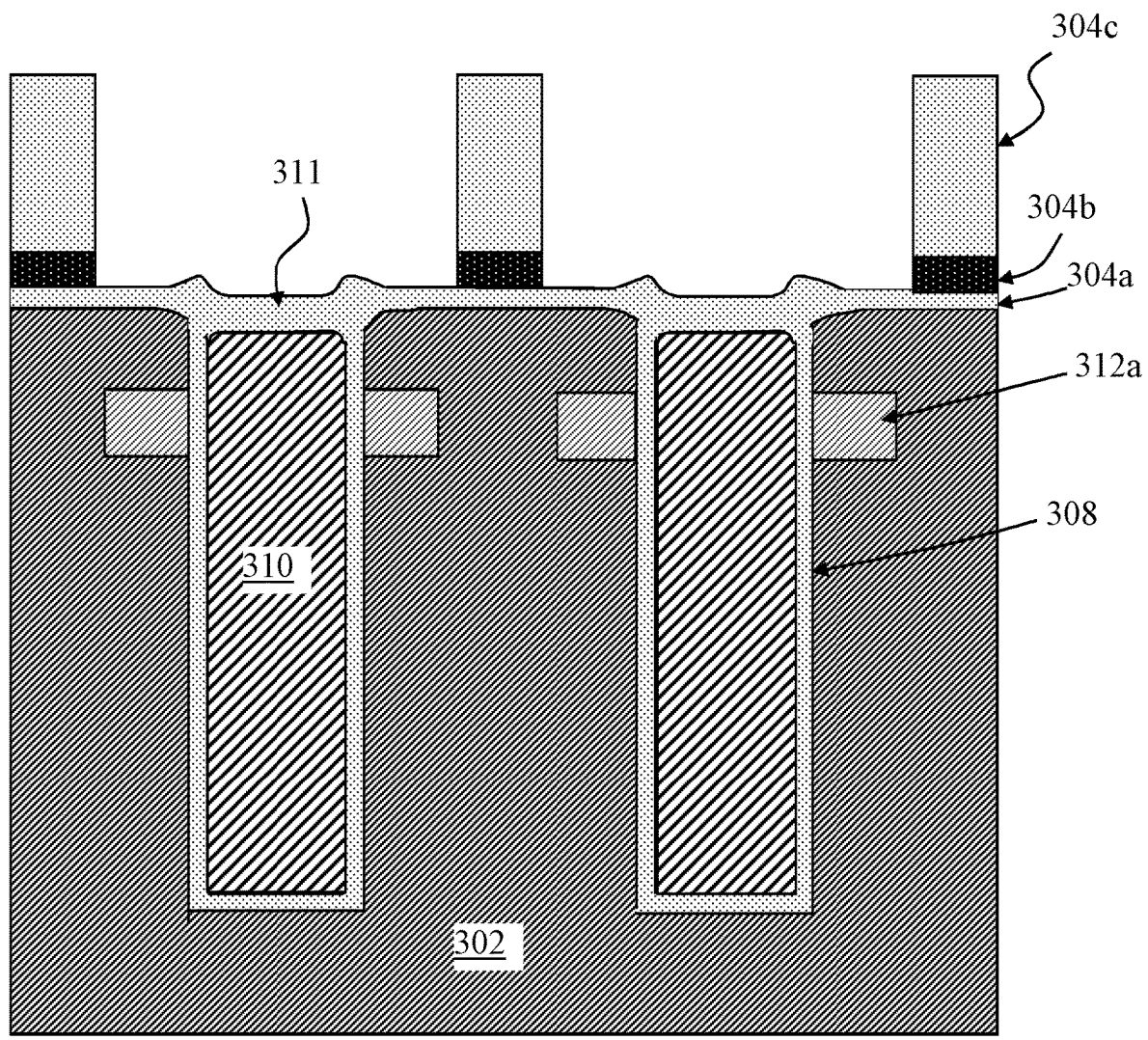
Figure 3H:
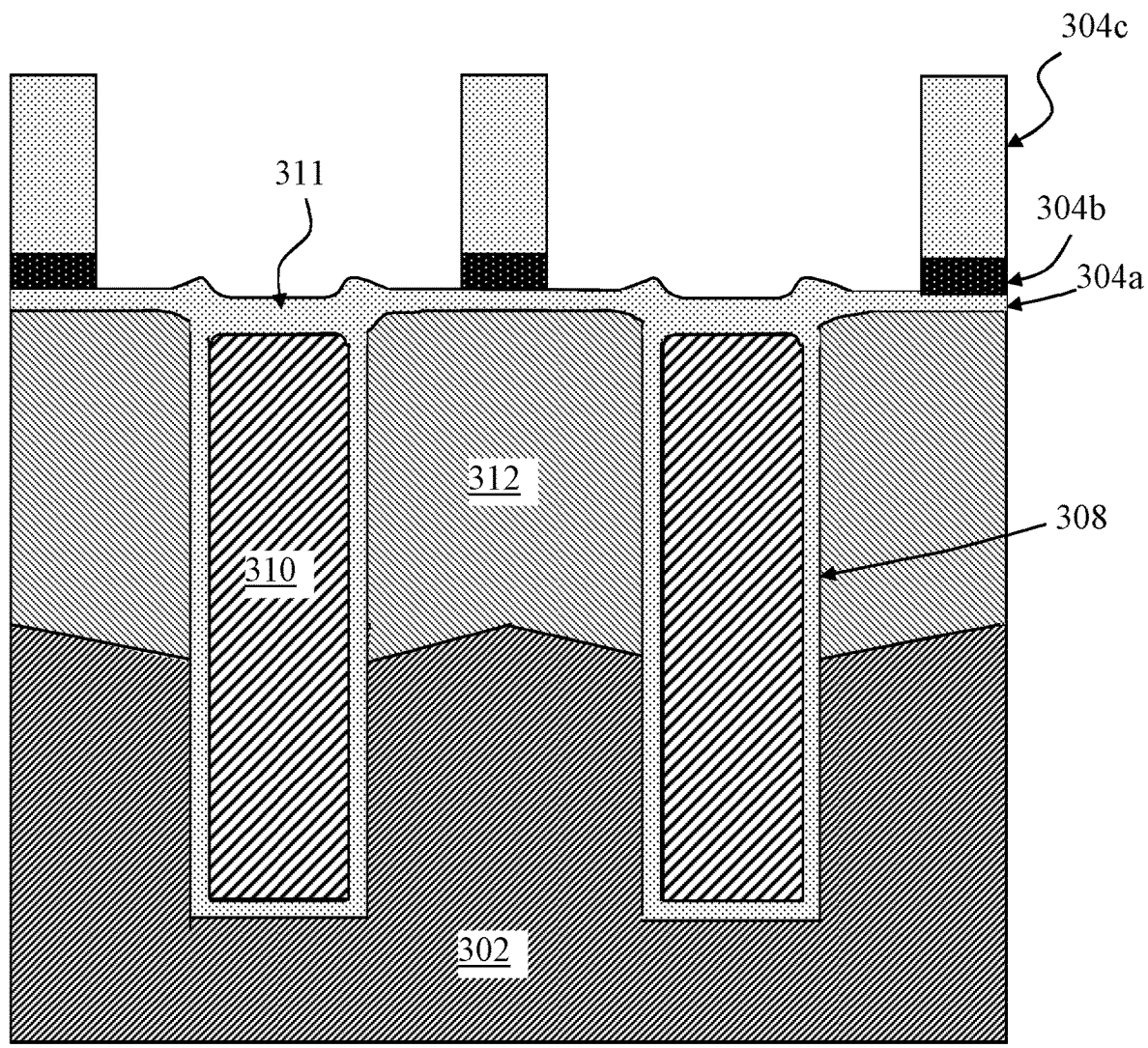
Figure 3I:
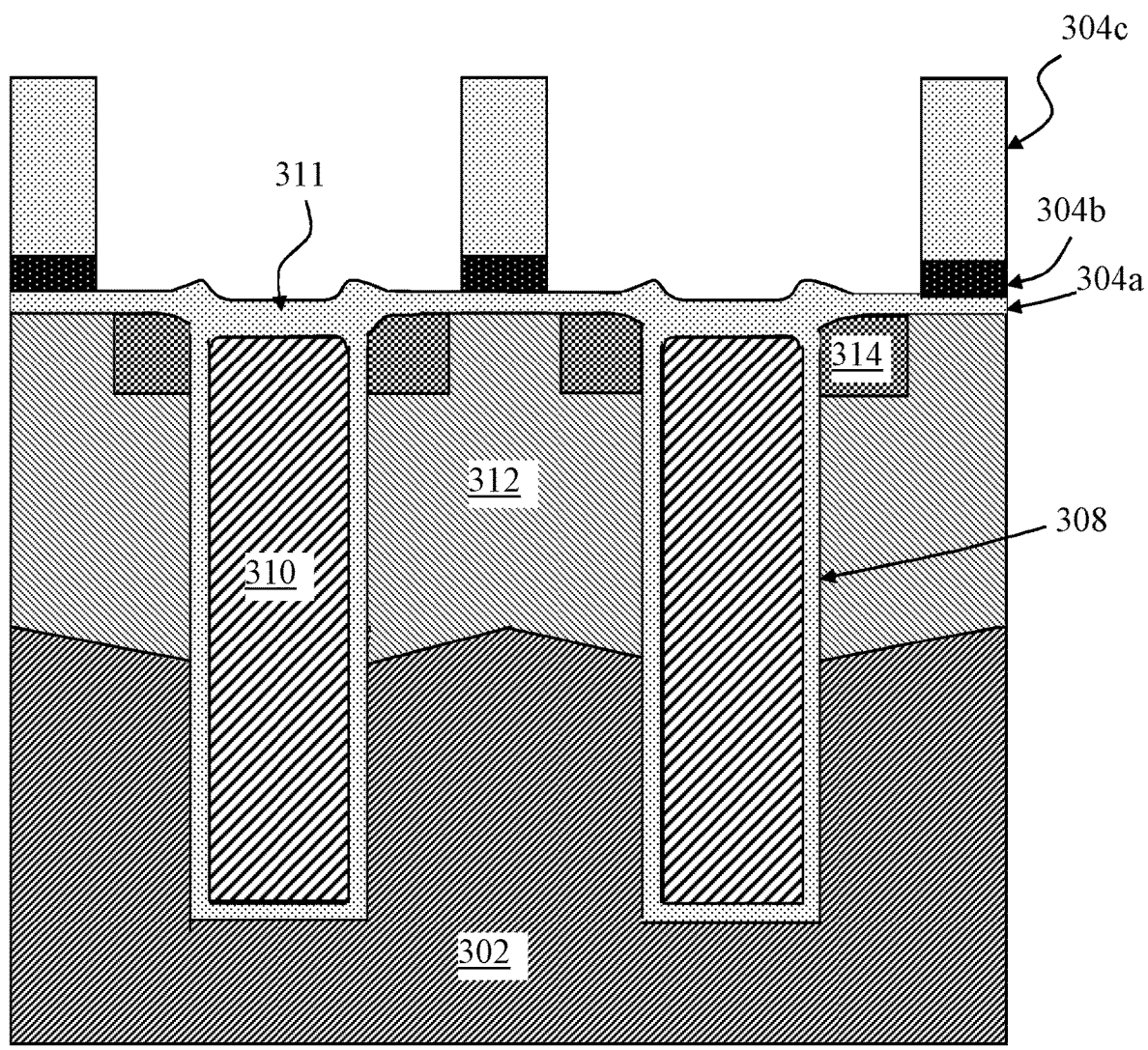

In FIG. 3F, an etch, either dry etch or wet etch, is performed to remove the exposed nitride 304b. As shown in FIG. 3G, a body implant to form a plurality of body regions 312a is carried out with a body mask by implanting dopants into the top portions of the semiconductor substrate 302. In FIG. 3H, heat is applied to activate dopant atoms and drive dopant diffusion to form a body region 312 (e.g., a p-type or n-type body region depending on the type of dopants implanted) in the substrate 302. It is noted that the body drive with oxygen may grow more oxidation on the exposed mesa. This oxidation could be also carried out at source drive. In FIG. 3I, a plurality of source regions 314 are formed by applying a source mask to carry out a source dopant implant.

Figure 3J:
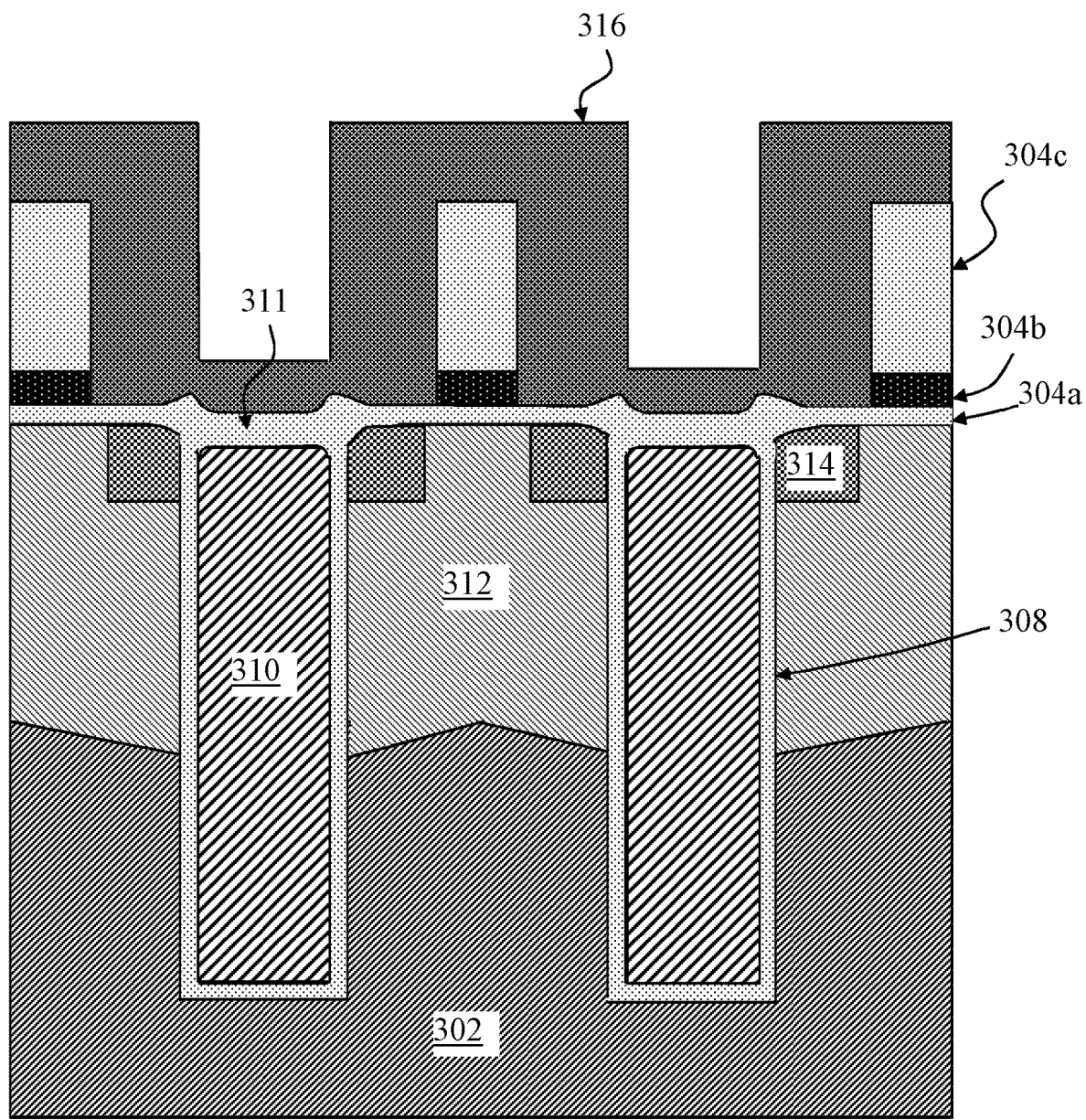

FIG. 3J shows a layer of nitride 316 is deposited over the top of the structure of FIG. 3I by low pressure chemical vapor deposition (LPCVD). The thickness of the nitride 316 is equal or larger than the width of the exposed mesa. In one example, the nitride 316 may be in a thickness range from about [0.080 µm to about [0.500 µm.

Figure 3K:
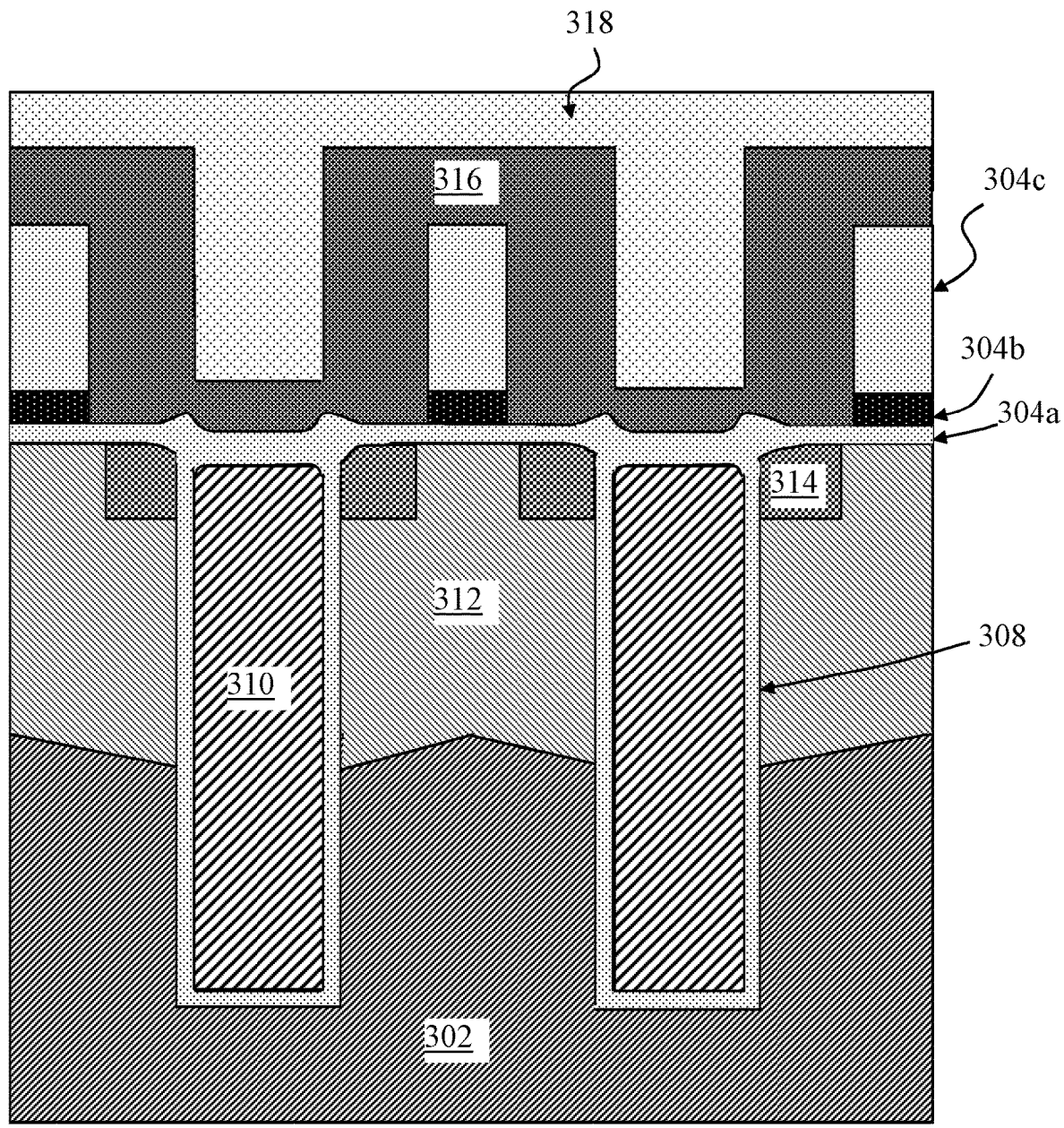
Figure 3L:
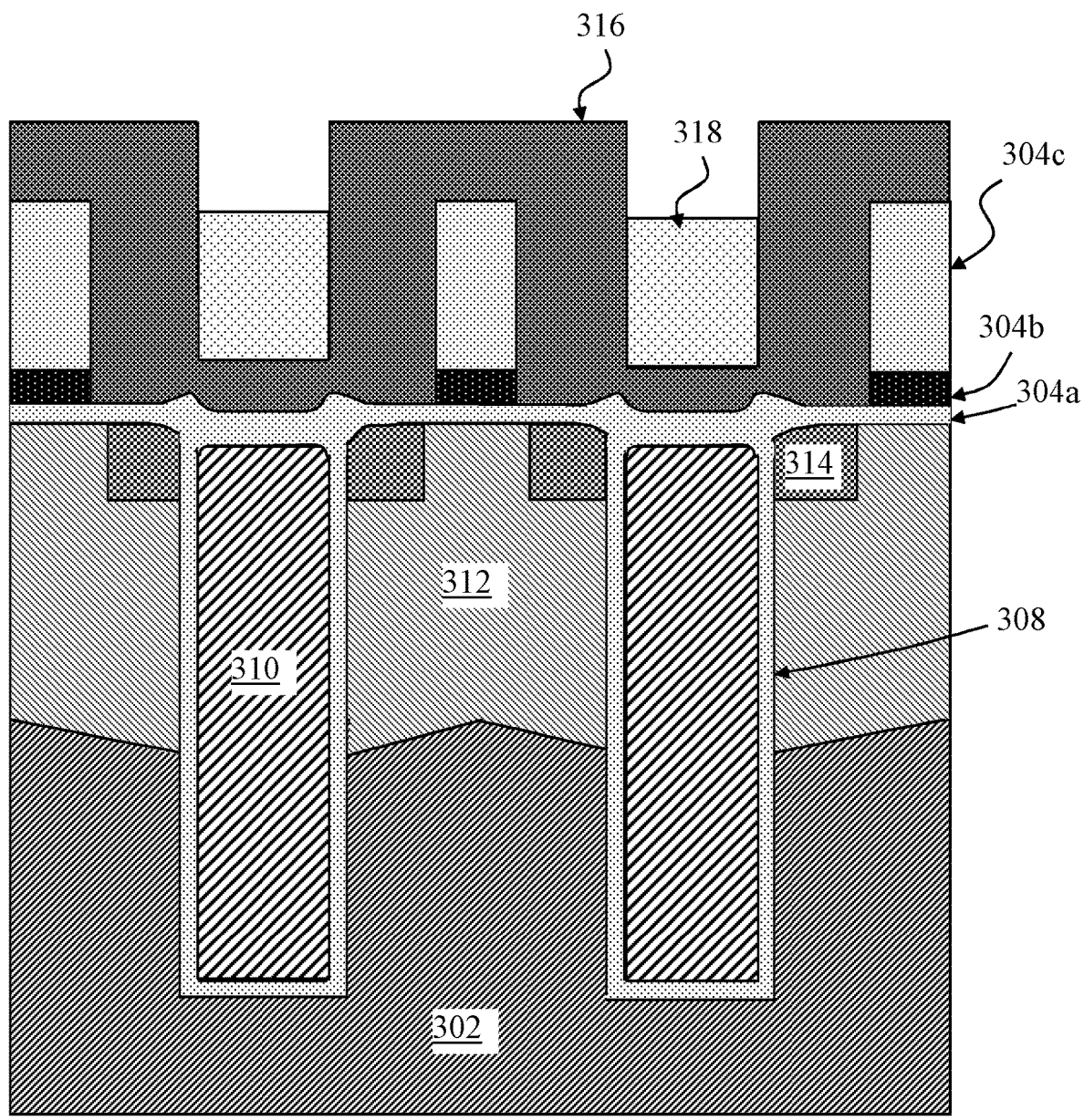
Figure 3M:
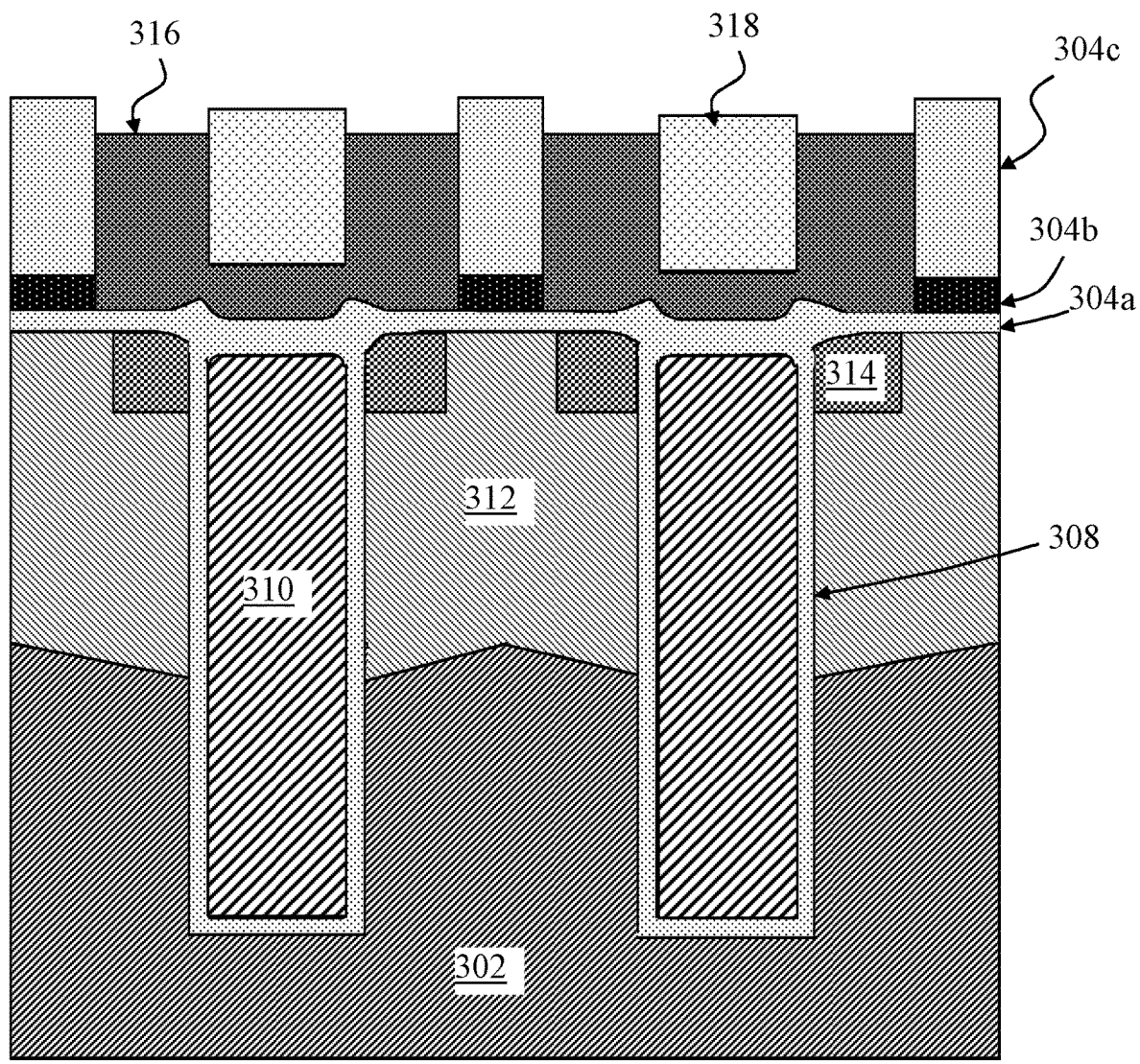
Figure 3N:
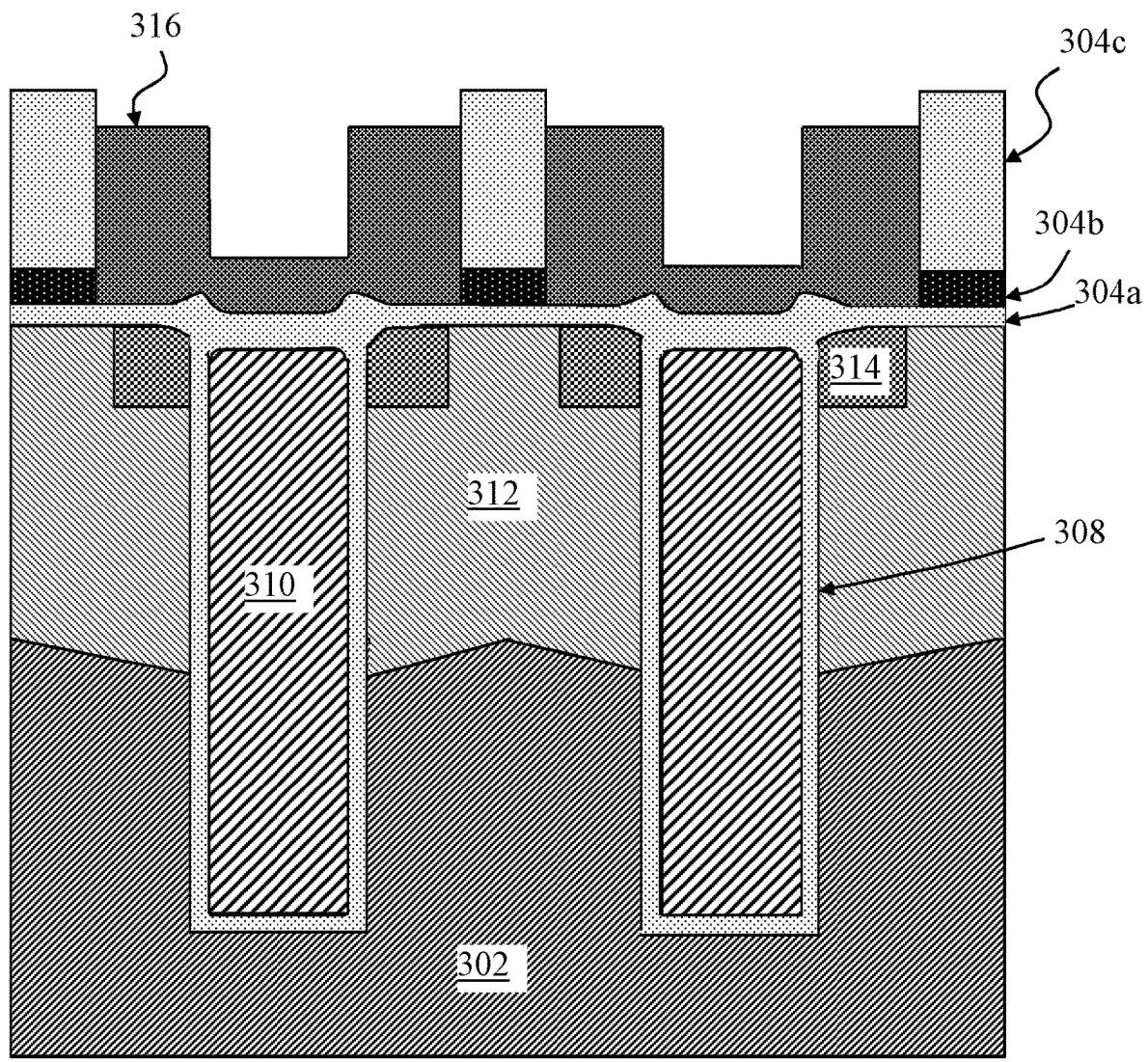
Figures 1, 3N:
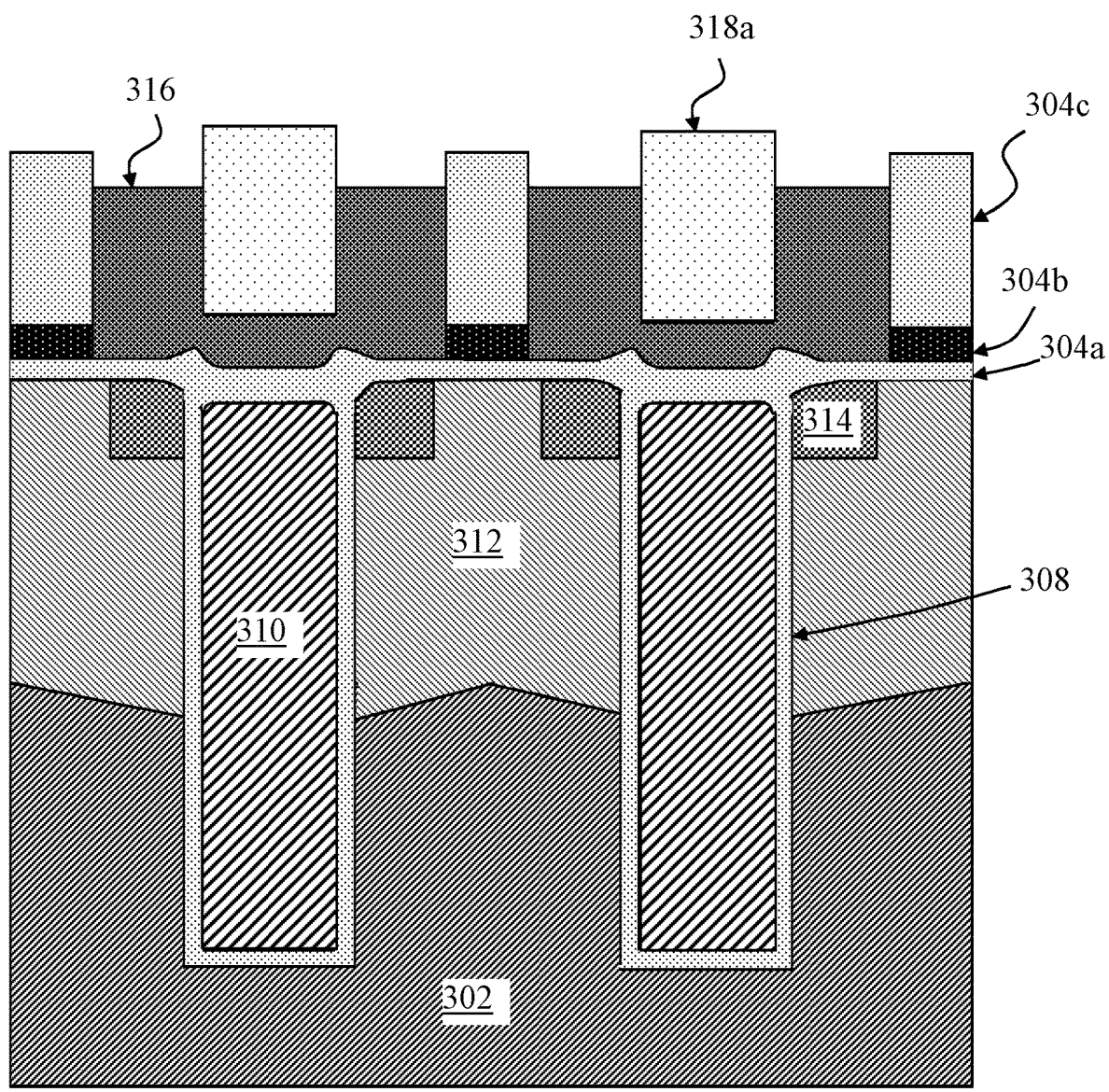

In FIG. 3K, a thin photoresist layer 318 may be coated on top of the structure of FIG. 3J without exposing it or without patterning it to form a mask. Instead, the photoresist layer 318 is used as a space holder. A blanket etch of the photoresist layer 318 is performed leaving exposed elevated portions of the nitride 316 and leaving photoresist 318 in recesses between the elevated portions of the nitride 316 as shown in FIG. 3L. A nitride etch of the top portion of the nitride 316 as shown in FIG. 3M is performed with a process that preferentially etches the nitride exposing the oxide hardmask 304c and leaving the photoresist behind. In FIG. 3N, the photoresist layer 318 is removed by wet chemical solvent or dry plasma.

As discussed above in connection with the first embodiment, the photoresist layer 318 may be replaced by an oxide layer 318a (e.g., HDP oxide). An oxide may be deposited over the structure of FIG. 3J by HDP deposition. An oxide-selective CMP is performed to remove the HDP oxide and stop at the surface of the elevated portions of the nitride 316. A nitride etch back is performed to etch portions of nitride 316 exposing the oxide hardmask 304c and leaving the HDP oxide behind. FIG. 3N-1 shows the structure at the stage corresponding to FIG. 3N when replacing the photoresist layer with HDP oxide.

Figure 3O:
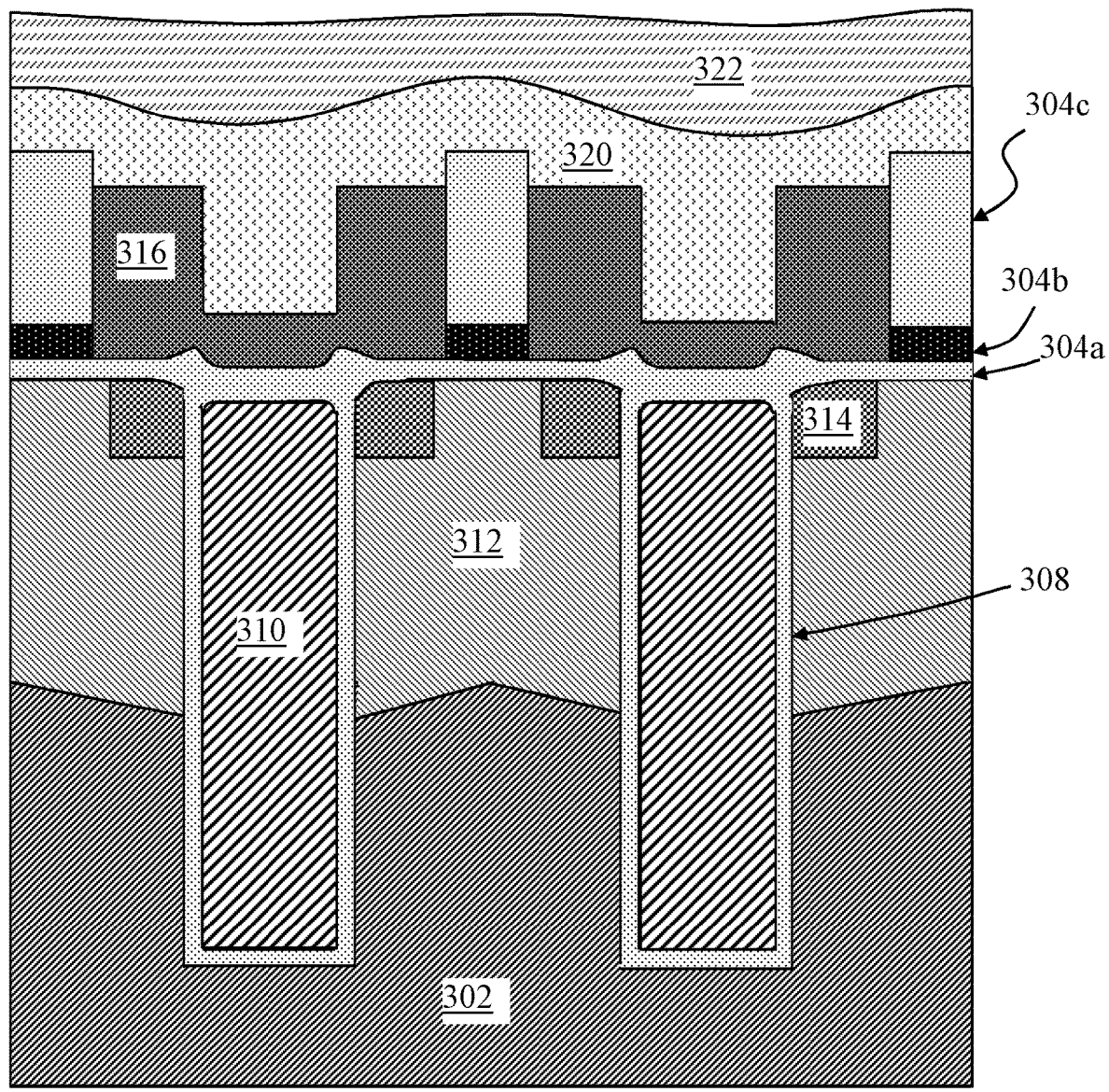
Figure 3P:
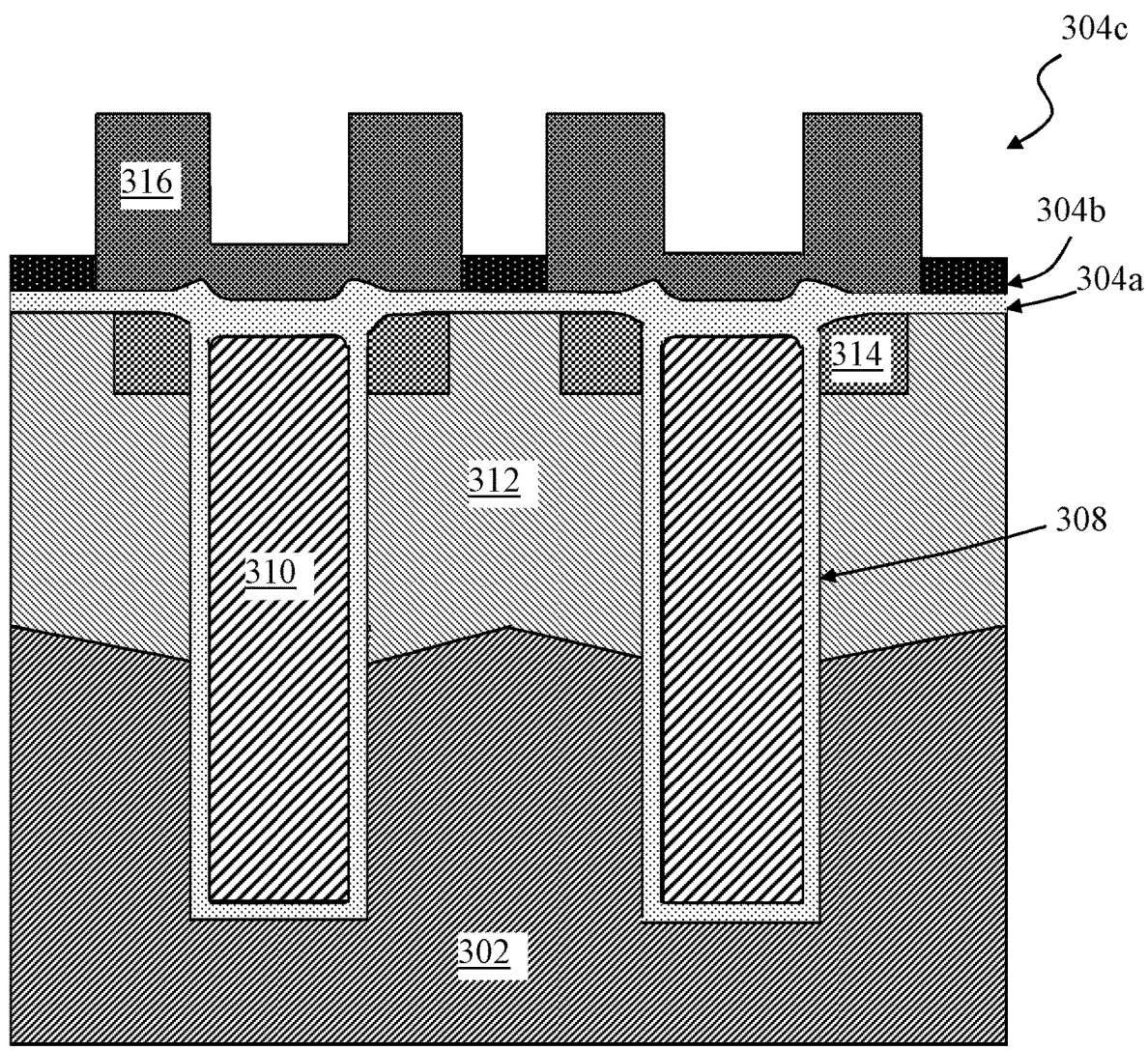

Next, a LTO layer 320 and a BPSG layer 322 are deposited over the structure of FIG. 3N (as shown in FIG. 3O) or FIG. 3N-1. A contact mask (not shown) is applied to protect other portions of the device (e.g., gate pickup area) and expose only portions of the active cell area. It is noted that another contact mask may be needed for gate pickup area. In FIG. 3P, an oxide etch is performed with the contact mask and stops on the nitride 304b over the mesa. This etch removes the remaining oxide hardmask 304c (and the HDP oxide if using HDP oxide instead of photoresist 318) and leaves nitride 316 and 304b over the mesa behind.

Figure 3Q:
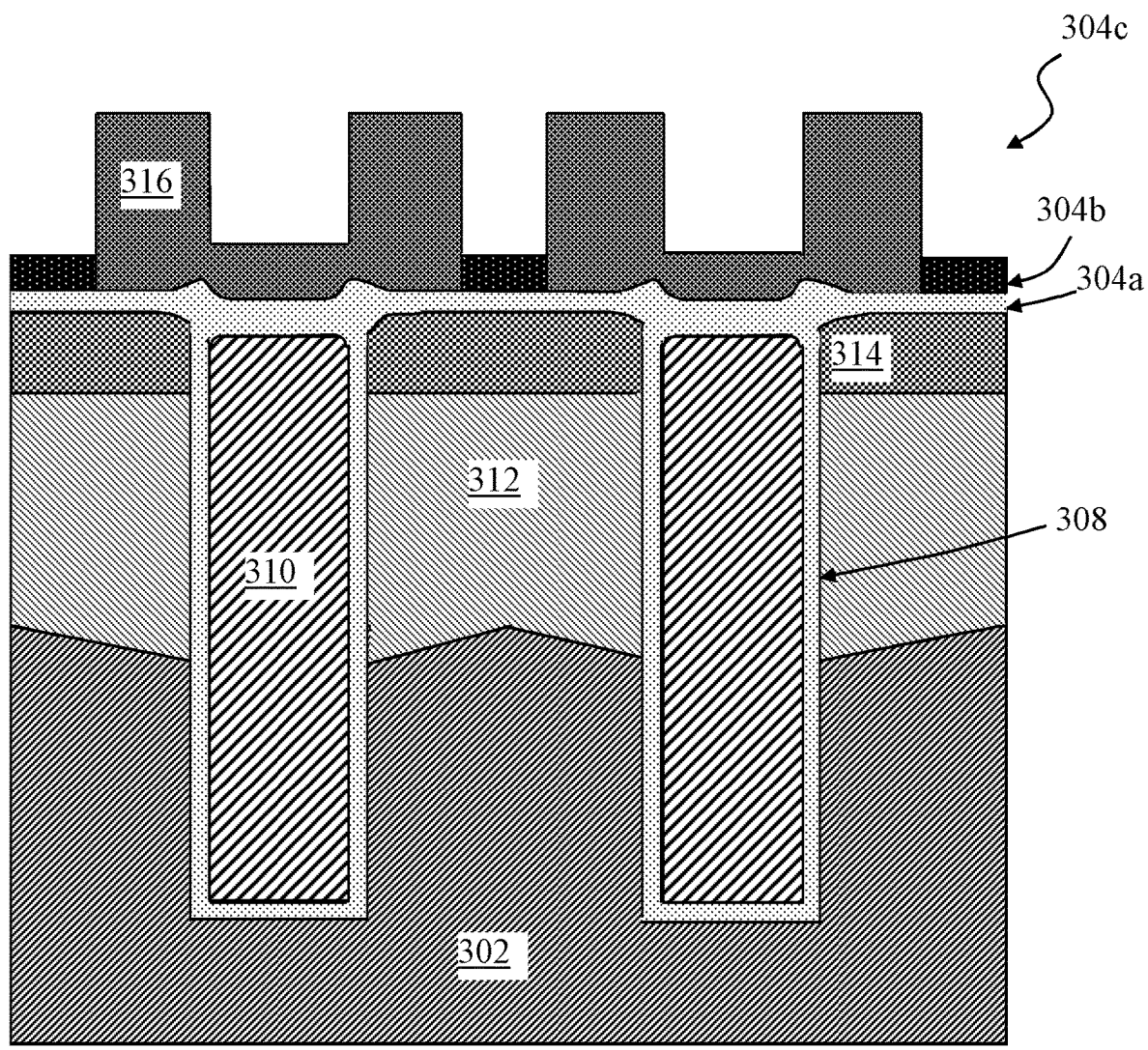
Figure 3R:
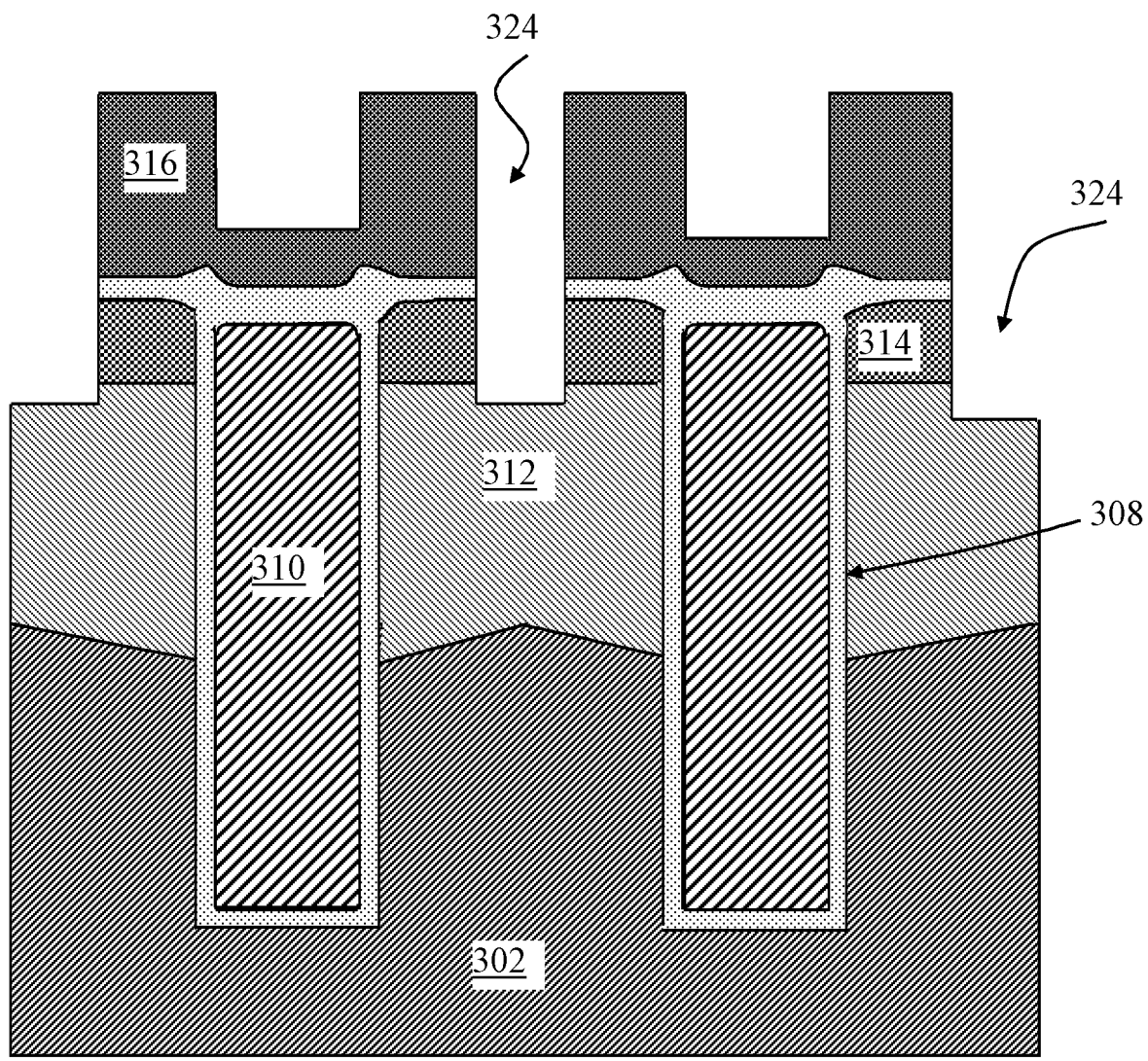
Figure 3S:
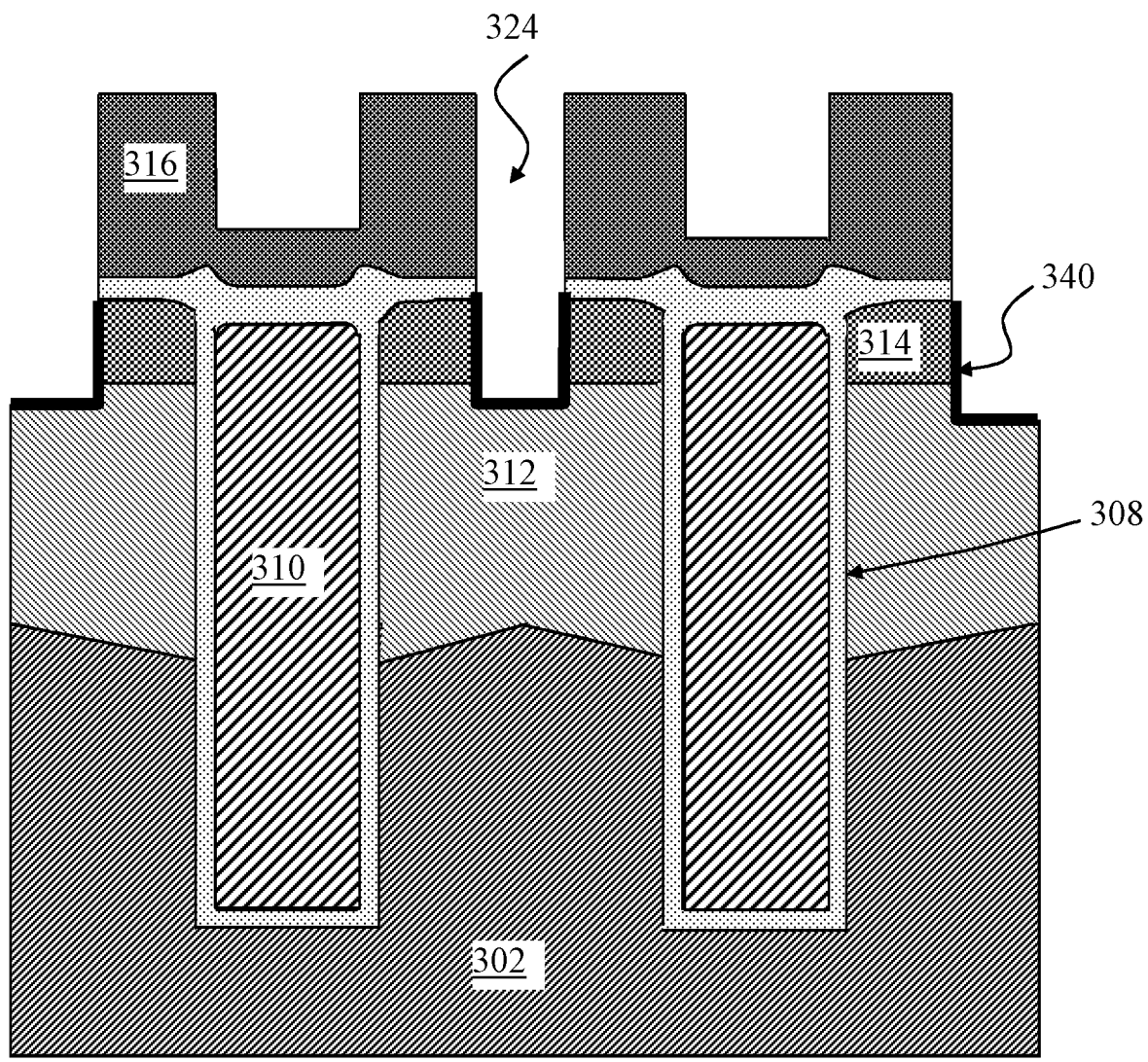
Figure 3T:
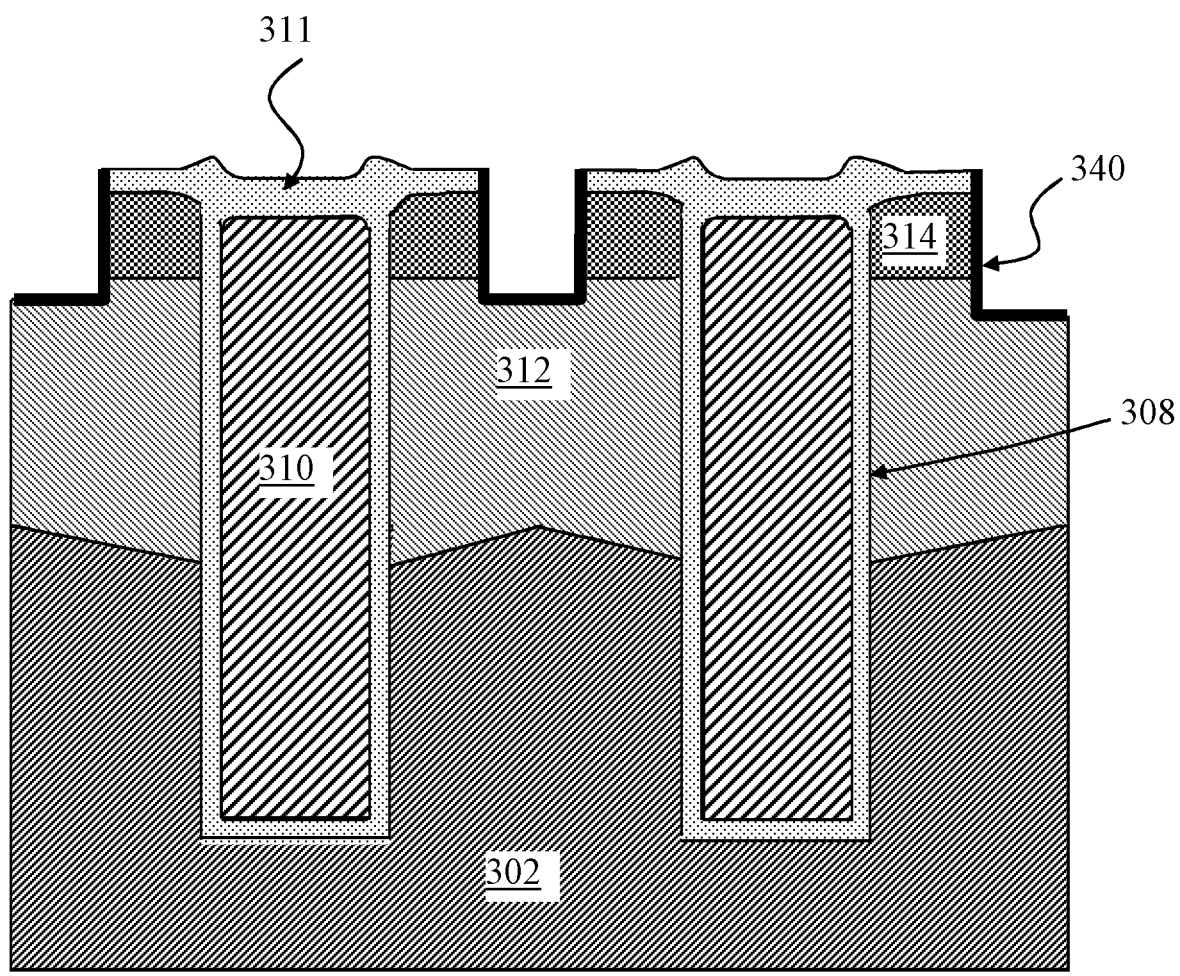
Figure 3U:
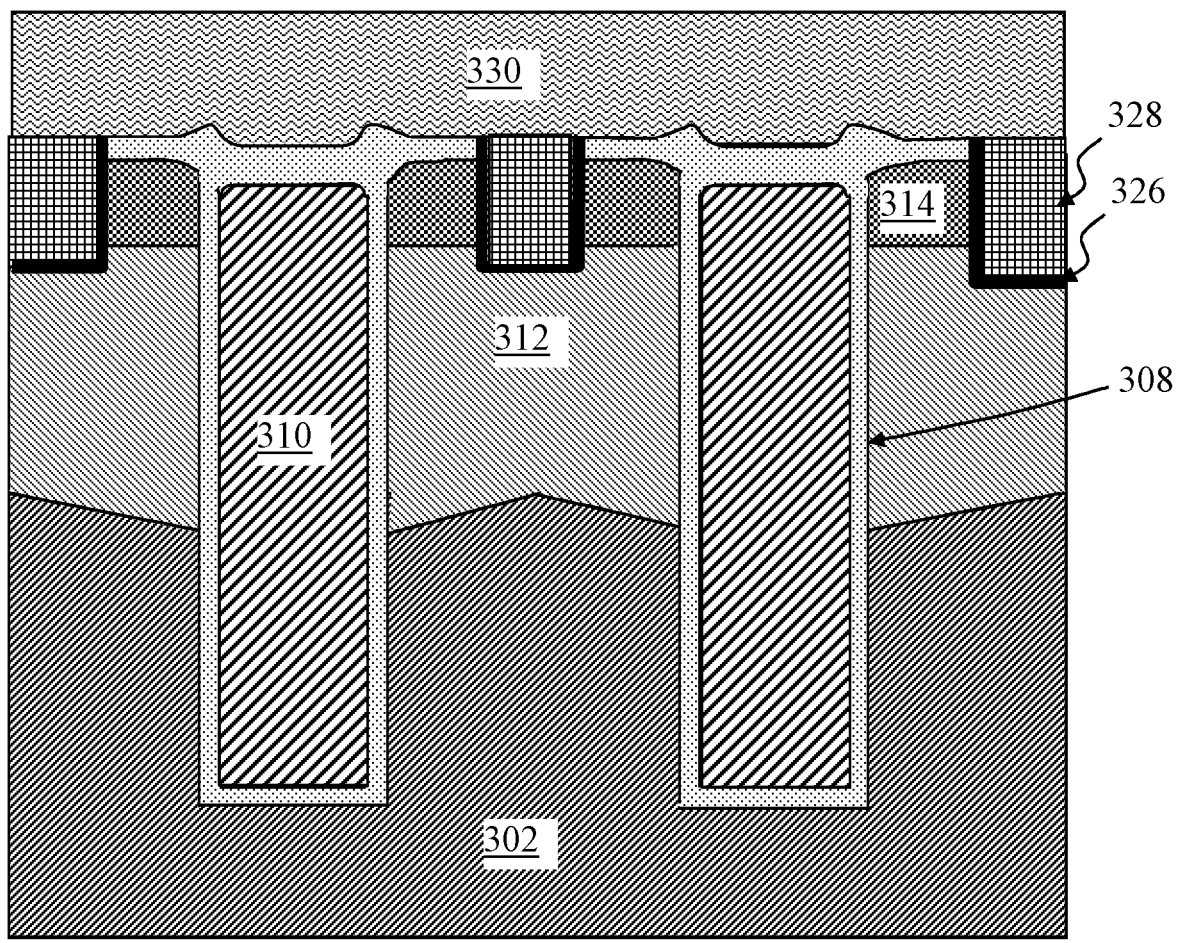

As shown in FIG. 3Q, a second source implant may be optionally performed when the source implant is angled or driven. Then a contact etch etches through the openings in the remaining nitride (including the nitride 304b above the mesa) as shown in FIG. 3R to create contact openings 324. In FIG. 3S, a thin thermal oxide 340 is grown along the contact trench 324 to protect the silicon surface during the nitride strip in the next step. In some embodiments, the thickness of the thin oxide 340 is about 150 Å. A nitride strip is carried out in FIG. 3T followed by removing the thin oxide 340 inside the contact trench 324 with a buffered oxide etch (BOE) or a wet etch with HF.

Next, a barrier metal layer 326 is lined on the sidewalls and bottom of the contact openings 324 followed by the deposition of a conductive material, e.g., Tungsten, in the contact openings 324 forming the conductive plugs 328. Following that, a layer of metal 330 (e.g., aluminum) is deposited on the top of the structure. The wafer is then followed with the rest of standard trench MOSFET steps to complete the processing.

The device of FIG. 3U according to this embodiment of the present disclosure has no nitride left behind. In addition, the device has oxide on top of the mesa and between the contacts 328 and has thicker oxide rounded corners of the mesa. It is noted that the thicker oxide at mesa corners may reduce breakdown voltage.

Fourth Embodiment

Figure 4A:
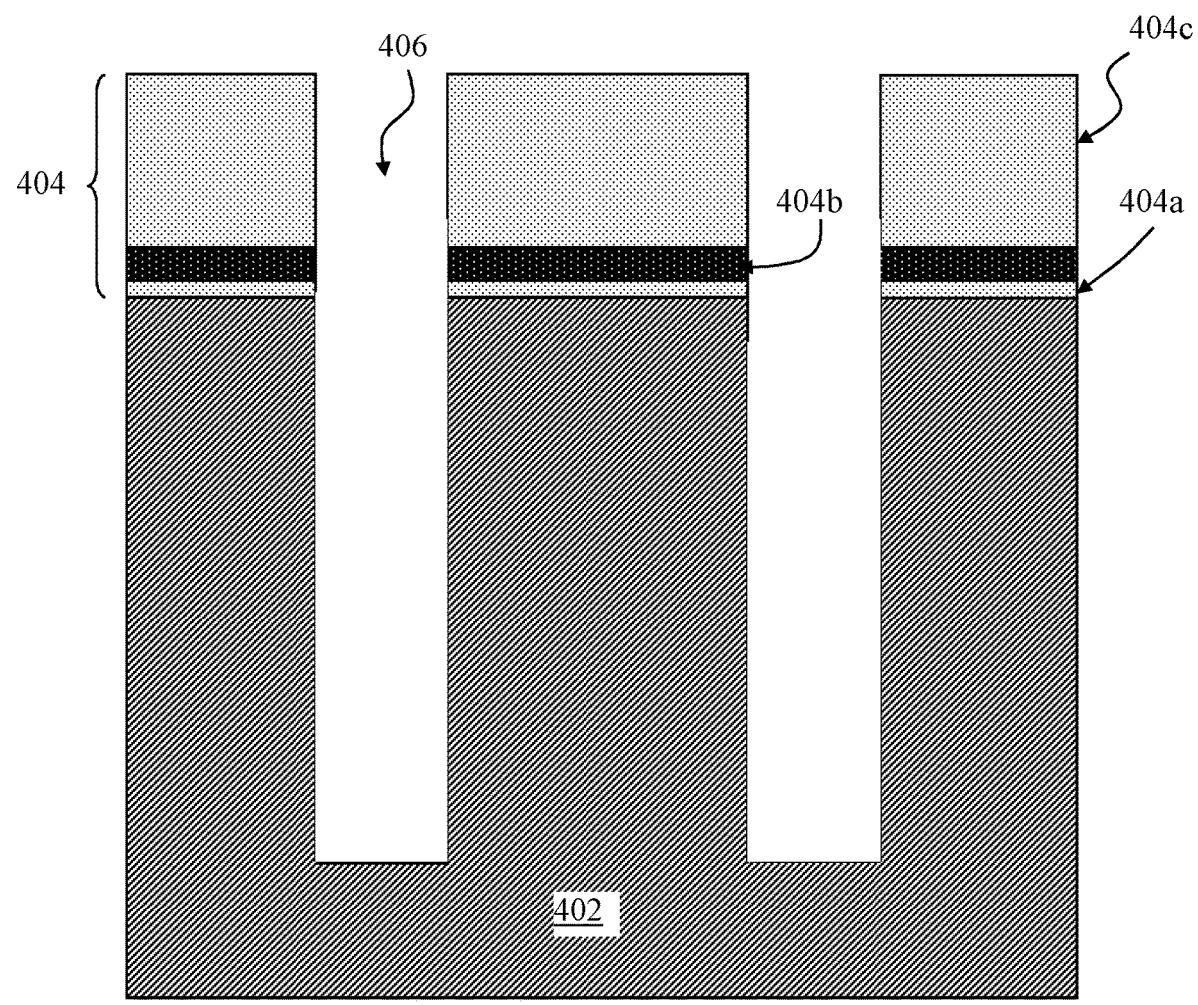
FIG. 4A-4G are a sequence of cross-sectional schematic diagrams illustrating a method of fabrication of a trench power MOSFET according to one embodiment of the present disclosure.

It is noted that another embodiment of the present disclosure may provide a device and a method of fabrication of a device having non-uniform thickness of oxide in two-poly gate trenches similar to the second embodiment with an ONO stack as hardmask. FIGS. 4A-4I is a sequence of a sequence of cross-sectional schematic diagrams illustrating a method of fabrication of such a device according to one embodiment of the present disclosure. The process starts with a semiconductor substrate 402 as a stating material. A hard mask layer 404 can be formed on top of the substrate 402 by forming a thin oxide layer 404a on the substrate 402 by deposition or thermal oxidation, followed by a nitride layer 404b on top of the thin oxide layer 404a. In some embodiments, the thickness of the silicon oxide layer ranges from about 100 Å to 500 Å and is preferably about 200 Å. In some embodiments, the thickness of the nitride layer ranges from 1500 Å to 4000 Å. Another oxide layer 404c may be disposed on top of the nitride layer 404b to form the hard mask with an oxide/nitride/oxide stack. In some embodiments, the thickness of the oxide layer 404c ranges from 1000 Å to 7000 Å. A photoresist (not shown) is formed on the hard mask 404 and patterned to define patterns for the gate trenches. Portions of the hard mask 404 exposed to an etchant through openings in the photoresist are etched away and the etching stops at the silicon surface leaving an opening that will be used to mask the etching of trenches. Thereafter, gate trenches 406 are formed on the active cell area by etching away the substrate underneath the trench openings as shown in FIG. 4A.

Figure 4B:
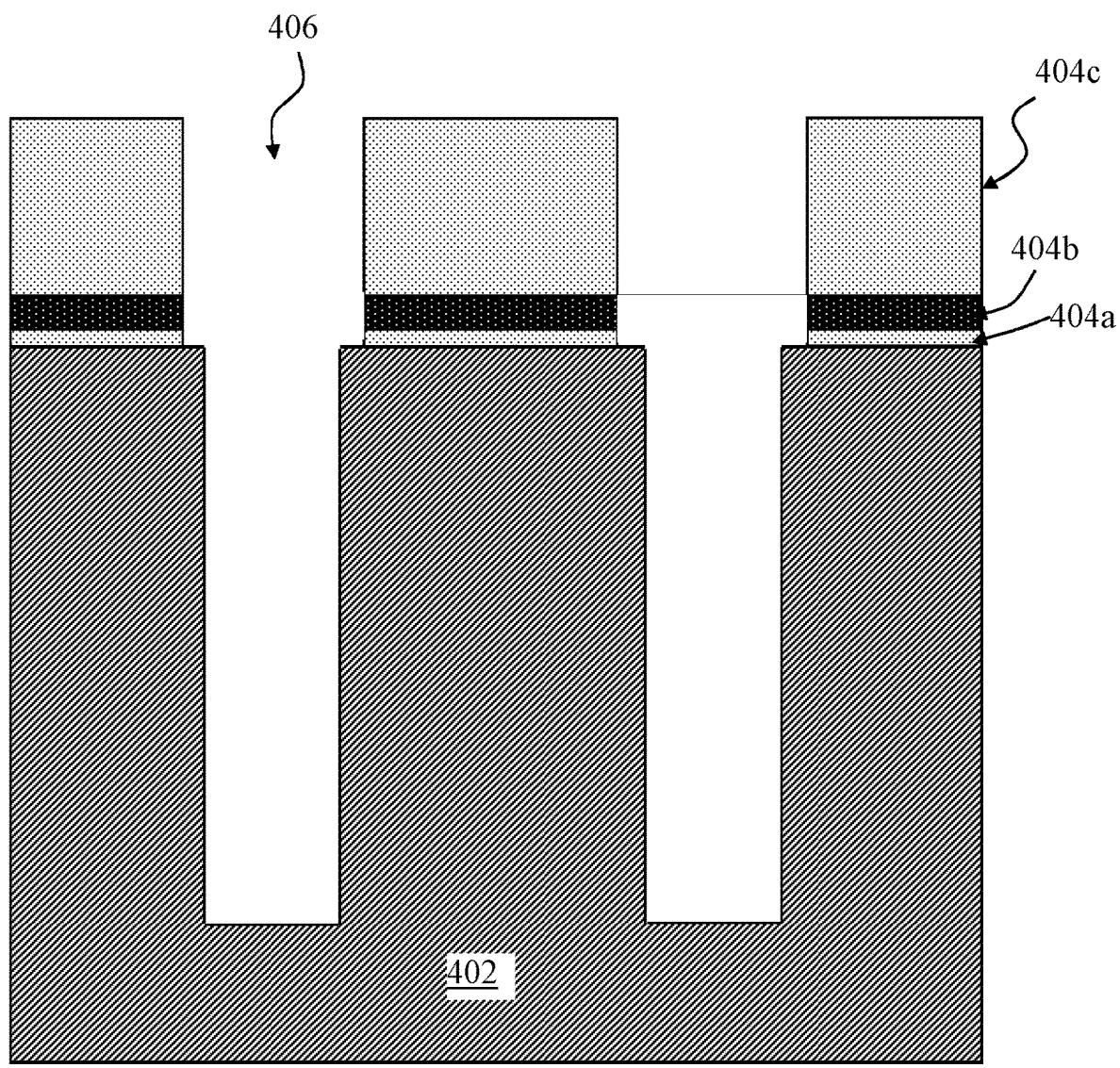
Figure 4C:
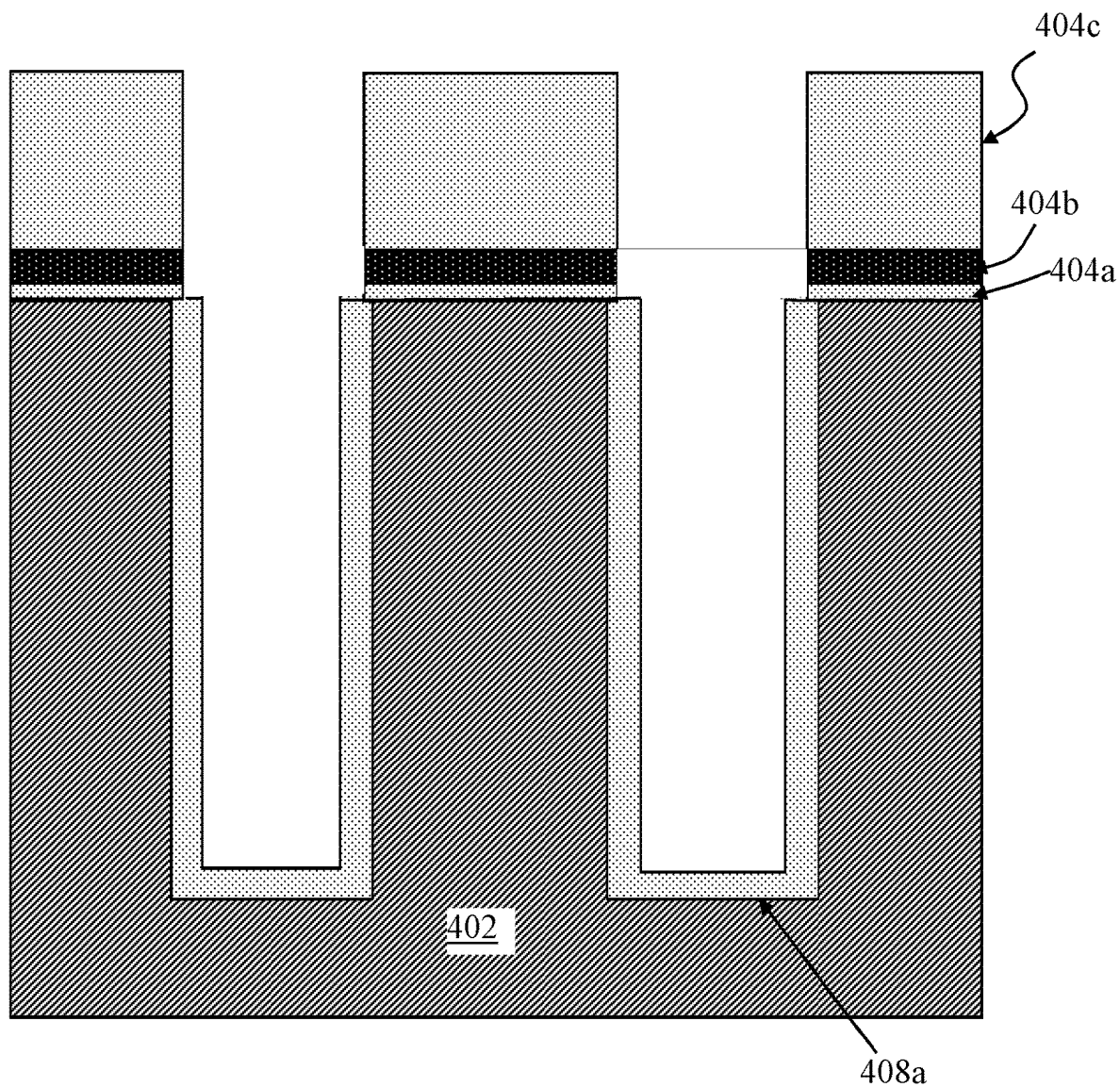

In FIG. 4B, a thin sacrificial oxide (not shown) is removed after it grows on all of the silicon surfaces to oxidize silicon portions that were damaged during the etching. The width of the hardmask 404 is not etched back during this step. In FIG. 4C, a liner oxide 408a grows on the sidewalls of the gate trenches 406 by, e.g., CVD. The thickness of the liner oxide 408a is about 2 to 5 times of the thickness of the gate oxide 108 in the first embodiment. By way of the example and not by way of limitation, the thickness of the liner oxide 408a is in a range of 0.060 μm to about 0.300 μm.

Figure 4D:
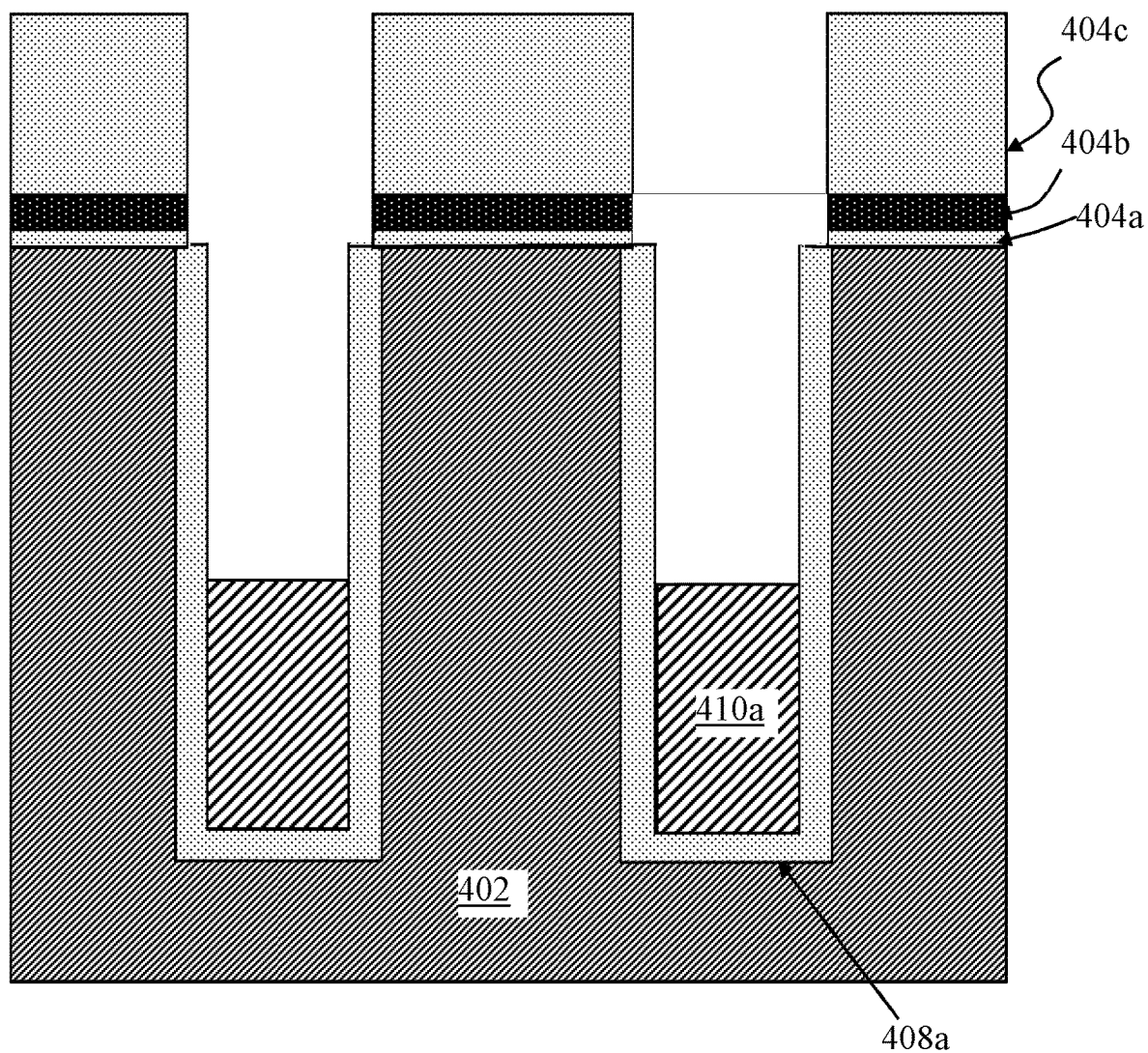

Next, conductive material 410a, such as polysilicon, is deposited into the trenches and over the semiconductor substrate followed by a chemical mechanical polishing (CMP) to remove polysilicon back to top of the hardmask 404. The conductive material 410a is then etched to a desired depth in the trenches 406 as shown in FIG. 4D.

Figure 4E:
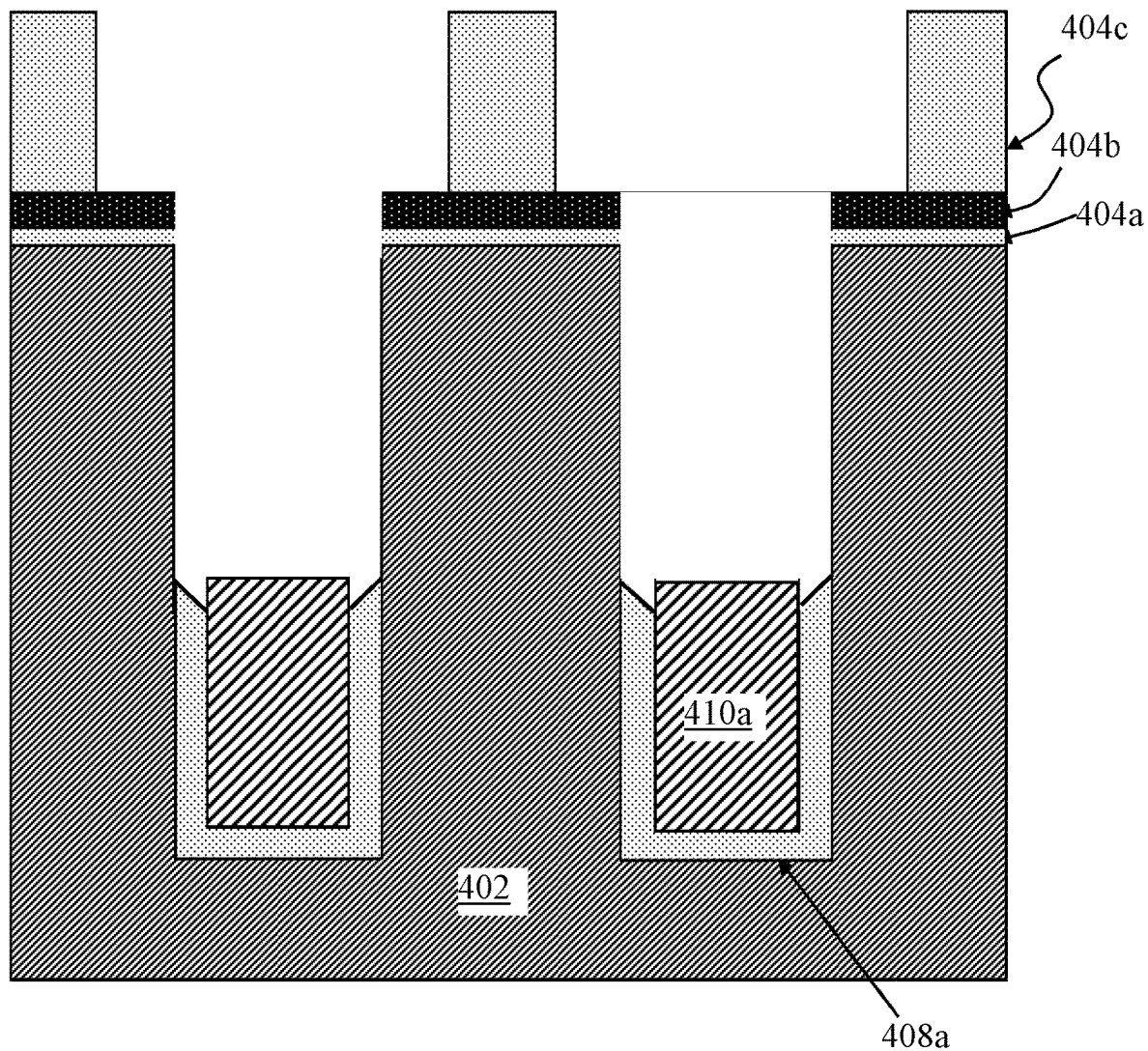
Figure 4F:
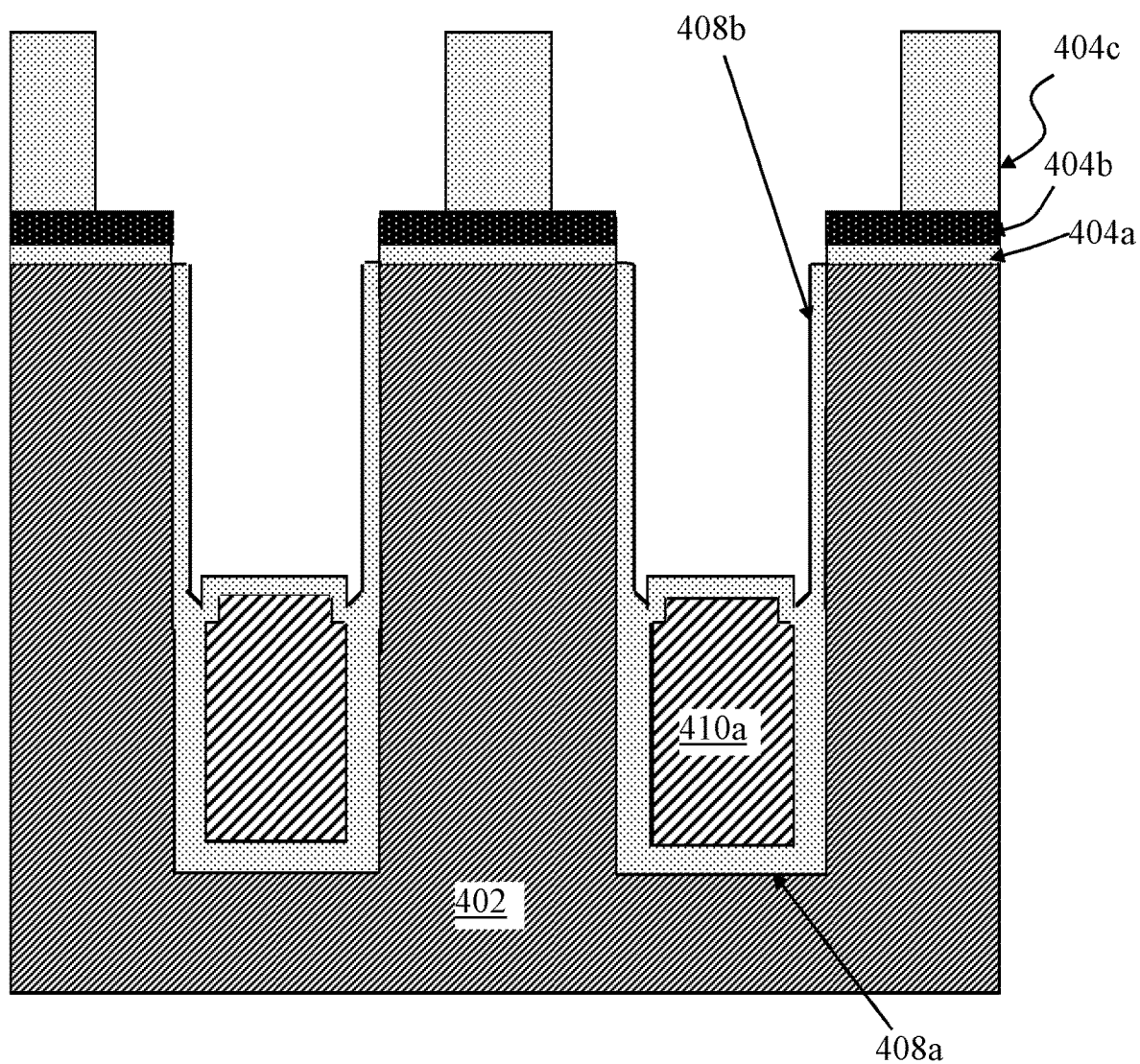

In FIG. 4E, a wet etch with hydrofluoric acid (HF) is performed to remove the liner oxide 408 to a desired depth and etch back the width of the oxide layer 404c on top of the nitride layer 404b to leave remaining of the desired size for the future contact as shown in FIG. 4E. A gate oxide 408b is grown on the conductive material 410a and along trench sidewalls above the conductive material 410a as shown in FIG. 4F. The thickness of the gate oxide 408b is thinner than the liner oxide 408a. In some embodiments, the thickness of the gate oxide 408b is in a range of 0.015 μm to about 0.060 μm.

Figure 4G:
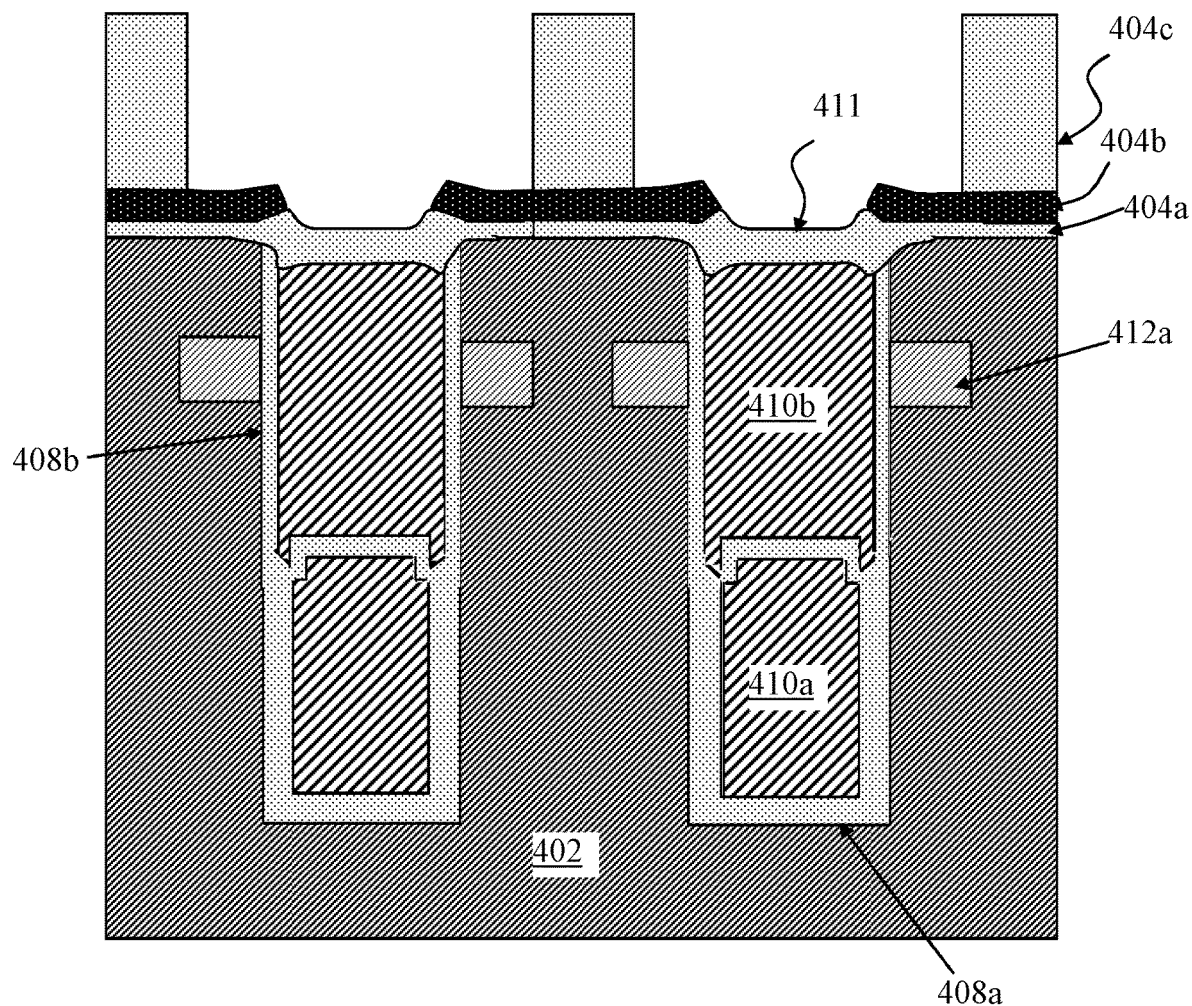

Next, conductive material 410b, such as polysilicon, is deposited into the upper portion of the trenches followed by etching the conductive material to the desired recess below the mesa between the trenches 406. An oxidation on the conductive material 410a is carried out to form a thick layer 411 of oxidation. It is noted that the thick oxide layer 411 is thicker than the oxide layer 111 or 211 in the first and second embodiments. In some embodiments, the thick layer 411 is about 3 to 6 times of the thickness of the gate oxide 408. By way of the example and not by way of limitation, the thickness of the thick oxide layer 411 is in a range of 0.050 μm to about 0.300 μm. It is noted that when the conductive material 410 is recessed below mesa to a certain amount, mesa will get oxidation from the side and also under the nitride 404b rounding the mesa corner and bending up the nitride 404b as shown in FIG. 4G. Thereafter, the processes identical to the processes of FIGS. 3F-3U are applied to form contacts.

Aspects of the present disclosure allow for fabrication of self-aligned contacts without having to form spacers below the surface of the silicon substrate to do self-aligned contact. This avoids the loss of significant amounts of original semiconductor substrate material in the mesa region when using spacers below the surface. Aspects of the present disclosure also reduce the number of process steps used to fabricate the contacts by forming space holders for future contact positions in the semiconductor substrate using part of the hard mask for trench definition.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112, ¶ 6.

What is claimed is:

1. A device, comprising:
a semiconductor substrate;
a plurality of gate trenches formed in the semiconductor substrate, each gate trench being lined with an insulating material along sidewalls inside the gate trench, each gate trench having a conductive material in the gate trench; and
a plurality of contact structures, each contact structure being formed adjacent to a corresponding one of the plurality of gate trenches and each contact structure including a contact trench filled with one or more conductive materials;
a layer of nitride provided over the conductive material in the gate trenches and over portions of mesas between adjacent contact structures of the plurality of contact structures, and wherein the layer of nitride has a recess on a top surface of the nitride layer over the conductive material in the gate trenches, wherein the recess contains portions of the conductive material that fills the contact structures; and
a metal layer formed over the layer of nitride.

2. The device of claim 1, wherein the insulating material along sidewalls inside each gate trench has a thicker portion along the sidewalls inside a lower portion of the gate trench and a thinner insulating material along the sidewalls inside an upper portion of the gate trench.

3. The device of claim 2, wherein the thicker portion of the insulating material has a thickness that is about 2 to 5 times of a thickness of the thinner portion.

4. The device of claim 1, wherein the conductive material in each gate trench has a bottom portion of the conductive material in a lower portion of the gate trench and a top portion of the conductive material in an upper portion of the gate trench, the bottom and the top portions of the conductive materials being separated by an inter-electro insulating layer.

5. The device of claim 4, wherein the bottom and top portions of the conductive material are electrically connected.

6. A device, comprising:
a semiconductor substrate;
a plurality of gate trenches formed in the semiconductor substrate, each gate trench being lined with an insulating material along sidewalls inside the gate trench, each gate trench having a conductive material in the gate trench; and
a plurality of contact structures, each contact structure being formed adjacent to a corresponding one of the plurality of gate trenches and each contact structure including a contact trench filled with one or more conductive materials,
a non-uniform oxide layer provided over the conductive material in the gate trenches and over portions of mesas between every two adjacent contact structures, wherein the non-uniform oxide layer is characterized by a greater elevation of oxide at corners of the mesas than at a central portion over the conductive material in the gate trenches; and
a metal layer formed over the non-uniform oxide layer.

7. The device of claim 6, wherein the oxide layer is in a thickness of about of 0.050 µm to about 0.300 µm.

8. The device of claim 6, wherein the insulating material along sidewalls inside each gate trench has a thicker portion along the sidewalls inside a lower portion of the gate trench and a thinner insulating material along the sidewalls inside an upper portion of the gate trench.

9. The device of claim 8, wherein the thicker portion of the insulating material has a thickness that is about 2 to 5 times of a thickness of the thinner portion.

10. The device of claim 6 wherein the conductive material in each gate trench has a bottom portion of the conductive material in a lower portion of the gate trench and a top portion of the conductive material in an upper portion of the gate trench, the bottom and the top portions of the conductive materials being separated by an inter-electro insulating layer.

11. The device of claim 10, wherein the bottom and top portions of the conductive material are electrically connected.

* * * * *